(12) United States Patent
Onishi et al.

(10) Patent No.: US 9,577,087 B2
(45) Date of Patent: Feb. 21, 2017

(54) SEMICONDUCTOR APPARATUS

(75) Inventors: Yasuhiko Onishi, Matsumoto (JP); Akio Sugi, Matsumoto (JP)

(73) Assignee: FUI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 13/313,583

(22) Filed: Dec. 7, 2011

(65) Prior Publication Data
US 2012/0126315 A1 May 24, 2012

Related U.S. Application Data

(63) Continuation of application No. PCT/JP2010/004825, filed on Jul. 29, 2010.

(30) Foreign Application Priority Data

Jul. 31, 2009 (JP) .................... 2009-180131

(51) Int. Cl.
*H01L 29/78* (2006.01)
*H01L 29/08* (2006.01)
(Continued)

(52) U.S. Cl.
CPC ....... *H01L 29/7811* (2013.01); *H01L 29/0634* (2013.01); *H01L 29/0878* (2013.01);
(Continued)

(58) Field of Classification Search
CPC ...................................... H01L 29/78
(Continued)

(56) References Cited

U.S. PATENT DOCUMENTS 5,216,275 A 6/1993 Chen
5,438,215 A 8/1995 Tihanyi
(Continued)

FOREIGN PATENT DOCUMENTS

CN 1734782 2/2006
JP 1-138759 5/1989
(Continued)

OTHER PUBLICATIONS

Title: JP 2007-157799 Translation Translated date: May 18, 2013 Publisher: Japan Patent office Pertinent Page: pp. 1-10.*
(Continued)

*Primary Examiner* — Dale E Page
*Assistant Examiner* — Lamont Koo

(57) ABSTRACT

A semiconductor apparatus that has a first parallel pn-layer formed between an active region and an $n^+$-drain region. A peripheral region is provided with a second parallel pn-layer, which has a repetition pitch narrower than the repetition pitch of the first parallel pn-layer. An $n^-$-surface region is formed between the second parallel pn-layer and a first main surface. On the first main surface side of the $n^-$-surface region, a plurality of p-guard ring regions are formed to be separated from each other. A field plate electrode is connected electrically to the outermost p-guard ring region among the p-guard ring regions. A channel stopper electrode is connected electrically to an outermost peripheral p-region of the peripheral region.

12 Claims, 57 Drawing Sheets

(51) Int. Cl.
　　　H01L 29/06　　　(2006.01)
　　　H01L 29/40　　　(2006.01)
　　　H01L 29/417　　(2006.01)

(52) U.S. Cl.
　　　CPC ...... *H01L 29/0619* (2013.01); *H01L 29/0638* (2013.01); *H01L 29/0696* (2013.01); *H01L 29/402* (2013.01); *H01L 29/404* (2013.01); *H01L 29/41741* (2013.01)

(58) Field of Classification Search
　　　USPC ............................................ 257/329, E29.262
　　　See application file for complete search history.

(56) References Cited

U.S. PATENT DOCUMENTS

| | | | | |
|---|---|---|---|---|
| 5,629,552 | A | * | 5/1997 | Zommer ........................ 257/490 |
| 2001/0028083 | A1 | * | 10/2001 | Onishi et al. ................. 257/328 |
| 2003/0176031 | A1 | * | 9/2003 | Onishi et al. ................. 438/200 |
| 2003/0222327 | A1 | | 12/2003 | Yamaguchi et al. |
| 2005/0077572 | A1 | | 4/2005 | Yamauchi et al. |
| 2005/0098826 | A1 | | 5/2005 | Yamaguchi et al. |
| 2005/0184336 | A1 | | 8/2005 | Takahashi et al. |
| 2006/0033153 | A1 | * | 2/2006 | Onishi et al. ................. 257/328 |
| 2006/0267091 | A1 | * | 11/2006 | Takahashi .................... 257/341 |
| 2007/0040217 | A1 | * | 2/2007 | Saito et al. ................... 257/341 |
| 2007/0096237 | A1 | * | 5/2007 | Zhao et al. ................... 257/438 |
| 2007/0207597 | A1 | | 9/2007 | Takahashi et al. |
| 2008/0135926 | A1 | * | 6/2008 | Ono et al. .................... 257/328 |
| 2008/0290403 | A1 | * | 11/2008 | Ono et al. .................... 257/329 |

FOREIGN PATENT DOCUMENTS

| | | |
|---|---|---|
| JP | 9-266311 | 10/1997 |
| JP | 2000-208768 | 7/2000 |
| JP | 2001-135819 | 5/2001 |
| JP | 2001-230413 | 8/2001 |
| JP | 2002-184987 | 6/2002 |
| JP | 2003-115589 | 4/2003 |
| JP | 2003-204065 | 7/2003 |
| JP | 2003-224273 | 8/2003 |
| JP | 2003-273355 | 9/2003 |
| JP | 2004-119611 | 4/2004 |
| JP | 2005-116951 | 4/2005 |
| JP | 2005-203565 | 7/2005 |
| JP | 2005-260199 | 9/2005 |
| JP | 2006-173202 | 6/2006 |
| JP | 2006-332217 | 12/2006 |
| JP | 2007-5516 | 1/2007 |
| JP | 2007-157799 | 6/2007 |
| JP | 2007-335658 | 12/2007 |
| JP | 2008-4643 | 1/2008 |
| JP | 2008-078282 | 4/2008 |
| JP | 2008-130775 | 6/2008 |
| JP | 2008-187125 | 8/2008 |
| JP | 2008-227236 | 9/2008 |
| JP | 2008-294028 | 12/2008 |
| JP | 2008-294214 | 12/2008 |

OTHER PUBLICATIONS

Title: JP 2003-204065 Translation Translated date: May 28, 2013 Publisher: Japan Patent office Pertinent Page: pp. 1-18.*
International Search Report for PCT/JP2010/004825 mailed Oct. 26, 2010.
Chinese Office Action issued Jan. 24, 2014 in corresponding Chinese Patent Application No. 201080026398.6.
Partial Translation of Japanese Office Action mailed Nov. 19, 2013 in corresponding Japanese Application No. 2012-501498.

* cited by examiner

SEMICONDUCTOR APPARATUS

CROSS-REFERENCE TO RELATED APPLICATIONS

This application is a continuation application, filed under 35 U.S.C. §111(a), of International Application No. PCT/JP2010/004825, filed Jul. 29, 2010, which claimed priority to Japanese Application No. 2009-180131, filed Jul. 31, 2009, the entire contents of which are incorporated herein by reference.

BACKGROUND

1. Field

This invention relates to a semiconductor apparatus that is applicable to an active element, such as a MOSFET (Metal Oxide Semiconductor Field Effect Transistor), an IGBT (Insulated Gate Bipolar Transistor), and a bipolar transistor, and to a passive element, such as a diode, and that which can achieve both higher breakdown voltage and higher current capacity.

2. Description of Related Art

In general, a semiconductor apparatus is classified as a horizontal element having an electrode formed on one surface of a semiconductor substrate or as a vertical element having electrodes on both surfaces of a semiconductor substrate. In the vertical semiconductor apparatus, the direction of flow of a drift current in an on-state is the same as the direction of extension of a depletion layer caused by reverse bias voltage in an off-state. In an ordinary planar n-channel vertical MOSFET, a portion serving as a high-resistance n$^-$ drift layer works as a region that causes drift current to flow vertically in the on-state. Shortening a current path in the n$^-$ drift layer, therefore, reduces drift resistance, offering an effect of reducing the substantial on-resistance of the MOSFET.

The portion serving as the high-resistance n$^-$-drift layer, however, is depleted of carriers in the off-state, increasing breakdown voltage. If the n$^-$-drift layer is thinned, the expansion of a drain-base depletion layer that starts from the pn-junction between a P-base region and the n$^-$-drift layer becomes smaller in width, causing the MOSFET to quickly reach a critical electric field, which reduces breakdown voltage. Conversely, a semiconductor apparatus with high breakdown voltage has a thicker n$^-$-drift layer, which increases on-resistance, inviting greater loss. In this manner, on-resistance and breakdown voltage have a mutual relationship of trade-off.

It is known that this trade-off relationship exists in a similar manner in such a semiconductor apparatus as an IGBT, a bipolar transistor, and a diode. The trade-off relationship is also commonly observed in a horizontal semiconductor apparatus in which the direction of flow of the drift current in the on-state is different from the direction of expansion of the depletion layer caused by reverse bias.

A superjunction semiconductor apparatus is known as a solution to a problem posed by the trade-off relationship. This superjunction semiconductor apparatus includes a drift layer that is composed of a parallel pn-structure with enhanced impurity concentration constructed by repeatedly joining alternately arranged n-regions and p-regions (see, e.g., Patent Documents 1, 2 and 3). According to the semiconductor apparatus having such a structure, although the parallel pn-structure has high impurity concentration, a depletion layer expands laterally from vertically extending pn-junctions of the parallel pn-structure to be depleted of carrier in the entire drift layer, which achieves high breakdown voltage.

To achieve the high breakdown voltage of a semiconductor apparatus, a peripheral structure is needed. A lack of the peripheral structure results in a drop in breakdown voltage at the termination of a drift layer, which makes achieving high breakdown voltage difficult. To solve this problem, a structure has been proposed that at the peripheral region, another parallel pn-structure with smaller repetition pitch than that of the parallel pn-structure in the active region is disposed in a region closer to the surface of the active region (see, e.g., Patent Document 4). According to the proposed structure, a surface electric field near the outermost active region is eased to maintain high breakdown voltage.

A semiconductor apparatus has been proposed, which includes a first-conductive (n-type) first semiconductor layer, a first-conductive (n-type) first semiconductor pillar region formed on a main surface of the first semiconductor layer, a second-conductive (p-type) second semiconductor pillar region that is formed on the main surface of the first semiconductor layer in adjacent to the first semiconductor pillar region so that the second semiconductor pillar region and the first semiconductor pillar region jointly form a periodic arrangement structure in a direction substantially parallel to the main surface of the first semiconductor layer, a first-conductive (n-type) second semiconductor layer formed above the first semiconductor layer at the peripheral region having an impurity concentration lower than the impurity concentration of the first semiconductor pillar region, and an embedded guard ring layer made of a second-conductive (p-type) semiconductor that is selectively embedded in the second semiconductor layer (see, e.g., Patent Document 5).

A semiconductor apparatus has been proposed, which includes a RESURF layer formed on the surface of a semiconductor intermediate layer in a peripheral region, a termination contact semiconductor region formed on the part of the RESURF layer surface that is closer to an active region, a field oxide film formed on the RESURF layer surface that has a thickness thinner on the portion closer to the active region while thicker on the portion farther in the opposite direction to the active region, and a field plate extending from the surface of the termination contact semiconductor region to pass over the thin part of the field oxide film to reach the surface of the thick part of the field oxide film (see, e.g., Patent Document 6).

A semiconductor apparatus has been proposed, which includes a peripheral structure having a parallel pn-structure constructed by repeatedly joining alternately arranged vertical first-conductive (n-type) regions oriented in the direction of thickness of a substrate and vertical second-conductive (p-type) regions oriented in the direction of thickness of the substrate and a field plate formed on an insulating film on a first main surface of the peripheral structure, where in the parallel pn-structure, the impurity concentration at the first main surface side of the vertical second-conductive (p-type) regions located outside a leading edge of the field plate is higher than the impurity concentration at the first main surface side of the second vertical first-conductive (n-type) regions adjacent to the second-conductive (p-type) regions (see, e.g., Patent Document 7).

A semiconductor apparatus has been proposed, which includes a first-conductive (n-type) pillar region formed along a direction parallel to semiconductor substrate and a peripheral structure having a second-conductive (p-type) semiconductor region formed to encircle an active region and extend from the active region to the first-conductive (n-type) pillar region, wherein a first-conductive (n-type) semiconductor region is formed in the second-conductive (p-type) semiconductor region, and average impurity concentration given by subtracting the average impurity concentration of the first-conductive (n-type) semiconductor region from the average impurity concentration of the second-conductive (p-type) semiconductor region is determined to be $2.5*10^{14}$ cm$^{-3}$ or less (see, e.g., Patent Document 8).

A semiconductor apparatus has been proposed in the form of a power MOSFET having a superjunction structure in which the impurity concentration of a p-RESURF layer has a distribution (gradient profile) of reducing the impurity concentration in the direction of depth, which distribution suppress the breakdown voltage drop caused by the imbalance between the impurity volume of the p-RESULF layer and the impurity volume of an n$^-$-drift layer more significantly than in a conventional case (see, e.g., Patent Document 9).

Below is a list of related art publications:
  Patent Document 1: U.S. Pat. No. 5,216,275
  Patent Document 2: U.S. Pat. No. 5,438,215
  Patent Document 3: Japanese Laid-Open Patent Publication No. H9-266311
  Patent Document 4: Japanese Laid-Open Patent Publication No. 2003-224273
  Patent Document 5: Japanese Laid-Open Patent Publication No. 2008-4643
  Patent Document 6: Japanese Laid-Open Patent Publication No. 2007-5516
  Patent Document 7: Japanese Laid-Open Patent Publication No. 2003-204065
  Patent Document 8: Japanese Laid-Open Patent Publication No. 2007-335658
  Patent Document 9: Japanese Laid-Open Patent Publication No. 2004-119611

For conventional semiconductor apparatuses as discussed and noted above, the robustness against charges on breakdown voltage is not taken into consideration. A semiconductor apparatus having low robustness against charges manages to secure initial breakdown voltage but gradually loses its breakdown voltage as time elapses, which poses a problem of difficulty in ensuring breakdown voltage reliability. For example, the semiconductor apparatus disclosed in the Patent Document 5 has no parallel pn-layer under an n$^-$-layer of the peripheral structure, which poses a problem of difficulty in achieving high breakdown voltage. The semiconductor apparatus disclosed in the Patent Document 6 has no n$^-$-layer on the surface of the peripheral structure, which poses a problem that securing breakdown voltage is difficult when negative charges are present at the surface of the peripheral structure. The semiconductor apparatus disclosed in the Patent Document 7 poses a problem that electric field concentration occurs at a stopper electrode, deteriorating breakdown voltage when negative charges are present at the surface of the peripheral structure. The semiconductor apparatus disclosed in the Patent Document 8 poses a problem that with the termination working actually as the second-conductive (p-type) termination, charge imbalance toward the second-conductive type (p-type) causes the breakdown voltage of the peripheral region to become lower than that of the active region.

FIG. 54 is a diagram of the simulation results of robustness against surface charges on breakdown voltage in a conventional semiconductor apparatus. These simulation results are obtained with regard to the semiconductor apparatus disclosed in the Patent Document 4 (FIGS. 17 to 19). As depicted in FIG. 54, the presence of positive charges (positive ions) on an oxide film between a field plate electrode and a channel stopper electrode results in a drop in breakdown voltage. This happens because of the following reason. In the semiconductor apparatus disclosed in the Patent Document 4, a parallel pn-layer having a narrow structural pitch and low impurity concentration is disposed closer to the semiconductor surface in the peripheral region. This parallel pn-layer allows a depletion layer to easily expand, thus relaxing an electric field strength at a field plate end to enable higher breakdown voltage. The presence of positive charges (positive ions) on the oxide film of the peripheral region, however, makes expansion of the depletion layer difficult, thus causing an electric field at the field plate end to intensify. As a result, breakdown voltage drops.

FIGS. 55 to 57 depict electric potential distributions of an off-state in the conventional semiconductor apparatus. FIG. 55 depicts the electric potential distribution in the case that a surface charge quantity on the oxide film of the peripheral region is $-1.0*10^{12}$ cm$^2$. FIG. 56 depicts the electric potential distribution in the case that the surface charge quantity is 0.0 cm$^{-2}$. FIG. 57 depicts the electric potential distribution in the case that the surface charge quantity is $+1.0*10^{12}$ cm$^{-2}$. These figures reveal that the depletion layer expands sufficiently between the filed plate electrode and the channel stopper electrode when charges are negative charges (negative ions) but the depletion layer concentrates on the field plate end when surface charges are positive charges (positive ions). In FIGS. 55 to 57, intervals between electric potential lines represent 50 V (as in FIGS. 10 to 12, 20 to 22, and 31 to 33).

This invention was conceived to solve the problems posed by the conventional ones, and it is therefore an object of embodiments of this invention to provide a semiconductor apparatus capable of improving robustness against charges on breakdown voltage.

SUMMARY

Additional aspects and/or advantages will be set forth in part in the description which follows and, in part, will be apparent from the description, or may be learned by practice of the invention.

To solve the problems above and achieve an object, a semiconductor apparatus according to embodiments of a first aspect of the invention includes an active region formed on a first main surface side; a low-resistance layer formed on a second main surface side; a first parallel pn-layer formed between the active region and the low-resistance layer and composed of first regions of a first conductivity alternately arranged with first regions of a second conductivity; a second parallel pn-layer formed in a peripheral region encircling the active region, the second parallel pn-layer being composed of second regions of the first conductivity alternately arranged with second regions of the second conductivity, at a repetition pitch narrower than a repetition pitch of the first regions of the first conductivity and the first regions of the second conductivity; a third region of the first conductivity formed between the second parallel pn-layer and the first main surface; a plurality of third regions of the second conductivity that are formed to be separated from each other on the first main surface side of the third region of the first conductivity; a first conductive layer connected electrically to an outermost third region of the second conductivity among the third regions of the second conductivity; and a second conductive layer connected electrically to the termination of the peripheral region.

According to embodiments of the first aspect of the invention, because the third regions of the second conductivity are provided, the high electric field near the outermost active region is relaxed when positive charges (positive ions) are present between the first conductive layer and the second conductive layer. This suppresses the fluctuation of breakdown voltage caused by positive charges. Because the second conductive layer is provided, depletion layer expansion reaching the termination of the peripheral region is avoided when negative charges (negative ions) are present between the first conductive layer and the second conductive layer. This suppresses a drop in breakdown voltage caused by negative charges. Because the second parallel pn-layer is provided, the depletion layer easily expands in the peripheral region. Hence high breakdown voltage is achieved easily.

In a semiconductor apparatus according to embodiments of a second aspect of the invention based on the first aspect of the invention, an impurity concentration of a third region of the first conductivity may be lower than that of the first region of the first conductivity.

According to embodiments of the second aspect of the invention, the low impurity concentration of the third region of the first conductivity allows the depletion layer to expand more easily in the peripheral region. Hence, high breakdown voltage is achieved more easily.

In a semiconductor apparatus according to embodiments of a third aspect of the invention based on the first or second aspects, a thickness of the third region of the first conductivity may be half or less than half the thickness of the first parallel pn-layer.

According to embodiments of a third aspect of the invention, a drop in breakdown voltage is suppressed. The thicker the junction between the third region of the first conductivity and the first parallel pn-layer is, the easier the occurrence of charge imbalance at the junction is. This leads to a drop in breakdown voltage. When the thickness of the third region of the first conductivity is half or less of that of the first parallel pn-layer, the thickness of the junction between the third region of the first conductivity and the first parallel pn-layer is small, which suppresses a drop in breakdown voltage.

In a semiconductor apparatus according to embodiments of a fourth aspect of the invention based on any one of the first through third aspects, a boundary between the first parallel pn-layer and the second parallel pn-layer may be under the third region of the first conductivity.

According to embodiments of the fourth aspect of the invention, a drop in breakdown voltage is suppressed. At the pitch transition of the parallel pn-layers, a drop in breakdown voltage due to charge imbalance easily occurs. Because the depletion layer easily expands at the lower side of the third region of the first conductivity, locating the pitch transition of the parallel pn-layers under the third region of the first conductivity suppresses a drop in breakdown voltage.

In a semiconductor apparatus according to embodiments of a fifth aspect of the invention based on any one of the first through fourth aspects, the third region of the second conductivity may have an impurity concentration that is higher than that of the third region of the first conductivity.

According to embodiments of the fifth aspect of the invention, because the third regions of the second conductivity have high impurity concentration, a neutral region remains in the third regions of the second conductivity when voltage is applied thereto, which consequently fixes the potential of the third regions of the second conductivity. As a result, when charges (ions) are present between the first conductive layer and the second conductive layer, the fluctuation of a surface electric potential is suppressed to improve the robustness against charges on breakdown voltage.

A semiconductor apparatus according to embodiments of a sixth aspect of the invention based on any one of the first through fifth aspects may have some or all of the third regions of the second conductivity connected electrically to conductive layers, respectively.

According to embodiments of the sixth aspect of the invention, because the third region of the second conductivity is connected electrically to the conductive layer, charges and ions coming to the peripheral region are collected by the conductive layer. As a result, the influence of charges (ions) on breakdown voltage is reduced.

A semiconductor apparatus according to embodiments of a seventh aspect of the invention based on any one of the first through sixth aspects may have a conductive layer connected electrically to a third region of the second conductivity being formed to extend over the third region of the second conductivity to the third region of the first conductivity.

According to embodiments of the seventh aspect of the invention, the third region of the second conductivity electrically is connected to the conductive layer extending toward the outer periphery and to the conductive layer extending toward the inner periphery. As a result, the electric field on curvature of the third region of the second conductivity is eased when positive charges are present between the first conductive layer and the second conductive layer, and the expansion of the depletion layer is eased when negative charges are present between the first conductive layer and the second conductive layer. Hence, breakdown voltage is stabilized.

A semiconductor apparatus according to embodiments of an eighth aspect of the invention based on any one of the first through seventh aspects may have adjacent third regions of the second conductivity closer to a termination of the peripheral region that are separated by an interval of a larger width than those farther away.

According to embodiments of the eighth aspect of the invention, a high electric field near the outermost active region that is susceptible to charges (ions) is eased. This improves the robustness against charges on breakdown voltage.

In a semiconductor apparatus according to embodiments of a ninth aspect of the invention based on any one of the first through eighth aspects, the first regions of the first conductivity and the first regions of the second conductivity may respectively have a stripe planar shape or, either the first regions of the first conductivity or the first regions of the second conductivity may have a square or polygonal planar shape, and the second regions of the first conductivity and the second regions of the second conductivity may respectively have a stripe planar shape or, either the second regions of the first conductivity or the second regions of the second conductivity may have a square or a polygonal planar shape.

According to embodiments of the ninth aspect of the invention, the robustness against charges on breakdown voltage is improved regardless of the planar shape of the parallel pn-layer being stripe, square, or polygon.

A semiconductor apparatus according to embodiments of a tenth aspect of the invention includes an active region formed on a first main surface side; a low-resistance layer formed on a second main surface side; a parallel pn-layer formed between the first main surface and the low-resistance layer and composed of fourth regions of a first conductivity alternately arranged with fourth regions of a second conductivity; a third region of the first conductivity formed between the first main surface and the parallel pn-layer in a peripheral region encircling the active region; a plurality of third regions of the second conductivity that are formed to be separated from each other on the first main surface side of the third region of the first conductivity; a first conductive layer connected electrically to an outermost third region of the second conductivity among the third regions of the second conductivity; and a second conductive layer connected electrically to a termination of the peripheral region.

According to embodiments of the tenth aspect of the invention, because the third regions of the second conductivity are provided, the high electric field near the outermost active region is relaxed when positive charges (positive ions) are present between the first conductive layer and the second conductive layer. This suppresses the fluctuation of breakdown voltage caused by positive charges. Because the second conductive layer is provided, depletion layer expansion reaching the termination of the peripheral region is avoided when negative charges (negative ions) are present between the first conductive layer and the second conductive layer. This suppresses a drop in breakdown voltage caused by negative charges.

In a semiconductor apparatus according to embodiments of an eleventh aspect of the invention based on the tenth aspect, an impurity concentration of the third region of the first conductivity may be lower than that of the fourth region of the first conductivity.

According to embodiments of the eleventh aspect of the invention, the low impurity concentration of the third region of the first conductivity allows the depletion layer to expand easily in the peripheral region. Hence high breakdown voltage is achieved easily.

In a semiconductor apparatus according to embodiments of a twelfth aspect of the invention based on the tenth or eleventh aspects, a thickness of the third region of the first conductivity may be half or less than half the parallel pn-layer under the active region.

According to embodiments of the twelve aspect of the invention, a drop in breakdown voltage is suppressed. The thicker the junction between the third region of the first conductivity and the parallel pn-layer under the active region is, the easier the occurrence of charge imbalance at the junction is. This leads to a drop in breakdown voltage. When the thickness of the third region of the first conductivity is half or less of that of the parallel pn-layer under the active region, the thickness of the junction between the third region of the first conductivity and the parallel pn-layer is small, which suppresses a drop in breakdown voltage.

In a semiconductor apparatus according to embodiments of a thirteenth aspect of the invention based on any one of the tenth through twelfth aspects, an impurity concentration of the third region of the second conductivity may be higher than that of the third region of the first conductivity.

According to embodiments of the thirteenth aspect of the invention, because the third regions of the second conductivity have high impurity concentration, a neutral region remains in the third regions of the second conductivity when voltage is applied thereto, which consequently fixes the electric potential of the third regions of the second conductivity. As a result, when charges (ions) are present between the first conductive layer and the second conductive layer, the fluctuation of a surface potential is suppressed to improve the robustness against charges on breakdown voltage.

A semiconductor apparatus according to embodiments of a fourteenth aspect of the invention based on any one of the tenth through thirteenth aspects may have some or all of the third regions of the second conductivity being connected electrically to conductive layers, respectively.

According to embodiments of the fourteenth aspect of the invention, because the third region of the second conductivity is connected electrically to the conductive layer, charges and ions coming to the peripheral region are collected by the conductive layer. As a result, the influence of charges (ions) on breakdown voltage is reduced.

A semiconductor apparatus according to embodiments of a fifteenth aspect of the invention based on any one of the tenth through fourteenth aspects may have adjacent third regions of the second conductivity closer to a termination of the peripheral region being separated by an interval of a larger width than those farther away.

According to embodiments of the fifteenth aspect of the invention, a high electric field near the outermost active region that is susceptible to charges (ions) is eased. This improves the robustness against charges on breakdown voltage.

A semiconductor apparatus according to embodiments of a sixteenth aspect of the invention includes an active region formed on a first main surface side; a low-resistance layer formed on a second main surface side; a parallel pn-layer formed between the first main surface and the low-resistance layer and composed of fourth regions of a first conductivity alternately arranged with fourth regions of a second conductivity; a third region of the first conductivity formed between the first main surface and the parallel pn-layer in an peripheral region encircling the active region; a fifth region of the second conductivity that is formed between the parallel pn-layer in the peripheral region and the first main surface to be adjacent to the third region of the first conductivity; a first conductive layer covering part of the fifth region of the second conductivity via an insulating layer; and a second conductive layer connected electrically to a termination of the peripheral region and covering part of the third region of the first conductivity via the insulating layer.

According to embodiments of the sixteenth aspect of the invention, the fifth region of the second conductivity is provided, which is depleted of carriers to relax a surface electric field when positive charges (positive ions) are present between the first conductive layer and the second conductive layer. This maintains breakdown voltage. The third region of the first conductivity is provided, which is depleted of carriers when negative charges (negative ions) are present between the first conductive layer and the second conductive layer. This maintains breakdown voltage. In other words, a drop in breakdown voltage can be suppressed even when positive charges (positive ions) or negative charges (negative ions) are present between the first conductive layer and the second conductive layer.

A semiconductor apparatus according to embodiments of a seventeenth aspect of the invention based on the sixteenth aspect may have a junction between the third region of the first conductivity and the fifth region of the second conductivity being situated between the first conductive layer and the second conductive layer.

In a semiconductor apparatus according to embodiments of an eighteenth aspect of the invention based on the sixteenth or seventeenth aspects, an impurity concentration of the third region of the first conductivity may be lower than that of the fourth region of the first conductivity.

According to embodiments of an eighteenth aspect of the invention, the third region of the first conductivity has low impurity concentration, thus can be depleted of carries. As a result, initial breakdown voltage is secured easily.

In a semiconductor apparatus according to embodiments of a nineteenth aspect of the invention based on any one of the sixteenth through eighteenth aspects, an impurity concentration of the fifth region of the second conductivity may be lower than that of the fourth region of the second conductivity.

According to embodiments of the nineteenth aspect of the invention, the fifth region of the second conductivity has low impurity concentration, and thus can be depleted of carries. As a result, initial breakdown voltage is secured easily.

A semiconductor apparatus according to embodiments of a twentieth aspect of the invention based on any one of the sixteenth through nineteenth aspects may have a fifth region of the second conductivity that includes a plurality of sub-regions different in impurity concentration from each other.

According to embodiments of the twentieth aspect of the invention, the fifth region of the second conductivity has sub-regions different in impurity concentration from each other. When positive charges (positive ions) are present between the first conductive layer and the second conductive layer, therefore, an electric field distribution can be controlled in the fifth region of the second conductivity. This suppresses the fluctuation of breakdown voltage caused by positive charges.

In a semiconductor apparatus according to embodiments of a twenty-first aspect of the invention based on the twentieth aspect, in the fifth region of the second conductivity, the impurity concentration of the sub-regions that differ in impurity concentration from each other may decrease as the sub-regions come closer to a termination of the peripheral region from the active region.

According to embodiments of the twenty-first aspect of the invention, the fifth region of the second conductivity has a gradient distribution of impurity concentration. When positive charges (positive ions) are present between the first conductive layer and the second conductive layer, therefore, an electric field distribution can be controlled in the fifth region of the second conductivity in order to relax. This suppresses the fluctuation of breakdown voltage caused by positive charges.

A semiconductor apparatus according to embodiments of a twenty-second aspect of the invention based on any one of the sixteenth through twenty-first aspects may have a thickness of the third region of the first conductivity and a thickness of the fifth region of the second conductivity being one-third or less the thickness of the parallel pn-layer under the active region.

According to embodiments of the twenty-second aspect of the invention, a drop in breakdown voltage is suppressed. The thicker the junction between the third region of the first conductivity and the parallel pn-layer under the active region is, the thinner the parallel pn-layer in the peripheral region. This leads to a drop in breakdown voltage. When the thickness of the third region of the first conductivity is one-third or less of that of the parallel pn-layer under the active region, the thickness of the parallel pn-layer in the peripheral region is large, which suppresses a drop in breakdown voltage.

In a semiconductor apparatus according to embodiments of a twenty-third aspect of the invention based on any one of the tenth through twenty-second aspects, the fourth regions of the first conductivity and the fourth regions of the second conductivity respectively may have a stripe planar shape or, either the fourth regions of the first conductivity or the fourth regions of the second conductivity may have a square or a polygonal planar shape.

According to embodiments of the twenty-third aspect of the invention, the robustness against charges on breakdown voltage is improved regardless of the planar shape of the parallel pn-layer being stripe, square, or polygon.

In a semiconductor apparatus according to embodiments of a twenty-fourth aspect of the invention includes an active region formed on a first main surface side; a low-resistance layer formed on a second main surface side; a parallel pn-layer formed between the first main surface and the low-resistance layer and composed of first-conductive regions alternately arranged with second-conductive regions; an insulating layer covering the parallel pn-layer in an peripheral region encircling the active region; a first conductive layer covering part of the parallel pn-layer that is closer to the active region in the peripheral region via the insulating layer; and a second conductive layer connected electrically to a termination of the peripheral region and covering part of the parallel pn-layer that is closer to the termination in the peripheral region via the insulating layer, a region of the parallel pn-layer that is on the first main surface side and is closer to the active region in the peripheral region serves substantially as the second-conductive regions, while a region of the parallel pn-layer that is on the first main surface side and is closer to the termination in the peripheral region serves substantially as the first-conductive regions, and the region serving substantially as the second-conductive regions extends from a position that is closer to the termination than the first conductive layer is, to a position under the first conductive layer, while the region serving substantially as the first-conductive regions extends from a position that is closer to the active region than the second conductive layer is, to a position under the second conductive layer.

In a semiconductor apparatus according to embodiments of a twenty-fifth aspect of the invention based on the twenty-fourth aspect, in the region serving substantially as the second-conductive regions, a ratio of the second-conductive regions to the first-conductive regions may be constant.

In a semiconductor apparatus according to embodiments of a twenty-sixth aspect of the invention based on the twenty-fourth aspect, in the region serving substantially as the first-conductive regions, a ratio of the second-conductive regions to the first-conductive regions may be constant.

In a semiconductor apparatus according to embodiments of a twenty-seventh aspect of the invention based on the twenty-fourth aspect, in the region serving substantially as the second-conductive regions, the ratio of the second-conductive regions to the first-conductive regions may decrease approaching 1 as the region serving substantially as the second-conductive regions comes closer to the termination in peripheral region.

In a semiconductor apparatus according to embodiments of a twenty-eighth aspect of the invention based on the twenty-fourth embodiment, in the region serving substantially as the first-conductive regions, the ratio of the second-conductive regions to the first-conductive regions may increase approaching 1 as the region serving substantially as the first-conductive regions comes closer to the active region.

In a semiconductor apparatus according to embodiments of a twenty-ninth aspect of the invention based on the twenty-fourth aspect, a region serving substantially as a charge balance region may be present between the region serving substantially as the second-conductive regions and the region serving substantially as the first-conductive regions.

In a semiconductor apparatus according to embodiments of a thirtieth aspect of the invention based on the twenty-ninth aspect, a width of the region serving substantially as the charge balance region may be one-third or less of the distance between the first conductive layer and the second conductive layer.

In a semiconductor apparatus according to embodiments of a thirty-first aspect of the invention based on any one of the twenty-fourth through thirtieth aspects, the first conductive layer or the second conductive layer may be formed into a stepped shape having one level difference.

In a semiconductor apparatus according to embodiments of a thirty-second aspect of the invention based on any one of the twenty-fourth through thirtieth aspects, the first conductive layer or the second conductive layer may be formed into a stepped shape having two level differences.

In a semiconductor apparatus according to embodiments of a thirty-third aspect of the invention based on any one of the twenty-fourth through thirtieth aspects, the first conductive layer or the second conductive layer may be formed into a stepped shape having three or more level differences.

In a semiconductor apparatus according to embodiments of a thirty-fourth aspect of the invention of based on any one of the twenty-fourth through thirtieth aspects, the first-conductive regions and the second-conductive regions respectively may have a stripe planar shape or, either the first-conductive regions or the second-conductive regions may have a square or polygonal planar shape.

According to embodiments of the twenty-fourth through thirtieth aspects of the invention, the region working substantially as the second-conductive region is present. As a result, when positive charges (positive ions) are present between the first conductive layer and the second conductive layer, the intensity of a surface electric field is eased to improve breakdown voltage. The region working substantially as the first-conductive region is also present. As a result, when negative charges (negative ions) are present between the first conductive layer and the second conductive layer, breakdown voltage is improved. In other words, a drop in breakdown voltage can be suppressed even when positive charges (positive ions) or negative charges (negative ions) are present between the first conductive layer and the second conductive layer. Hence the robustness against charges on breakdown voltage is improved.

The semiconductor apparatus, as described for embodiments of the present invention, offers an effect of improving robustness against charges on breakdown voltage.

BRIEF DESCRIPTION OF THE DRAWINGS

These and/or other aspects and advantages will become apparent and more readily appreciated from the following description of the embodiments, taken in conjunction with the accompanying drawings of which.

DESCRIPTION OF EMBODIMENTS

Figure 1:
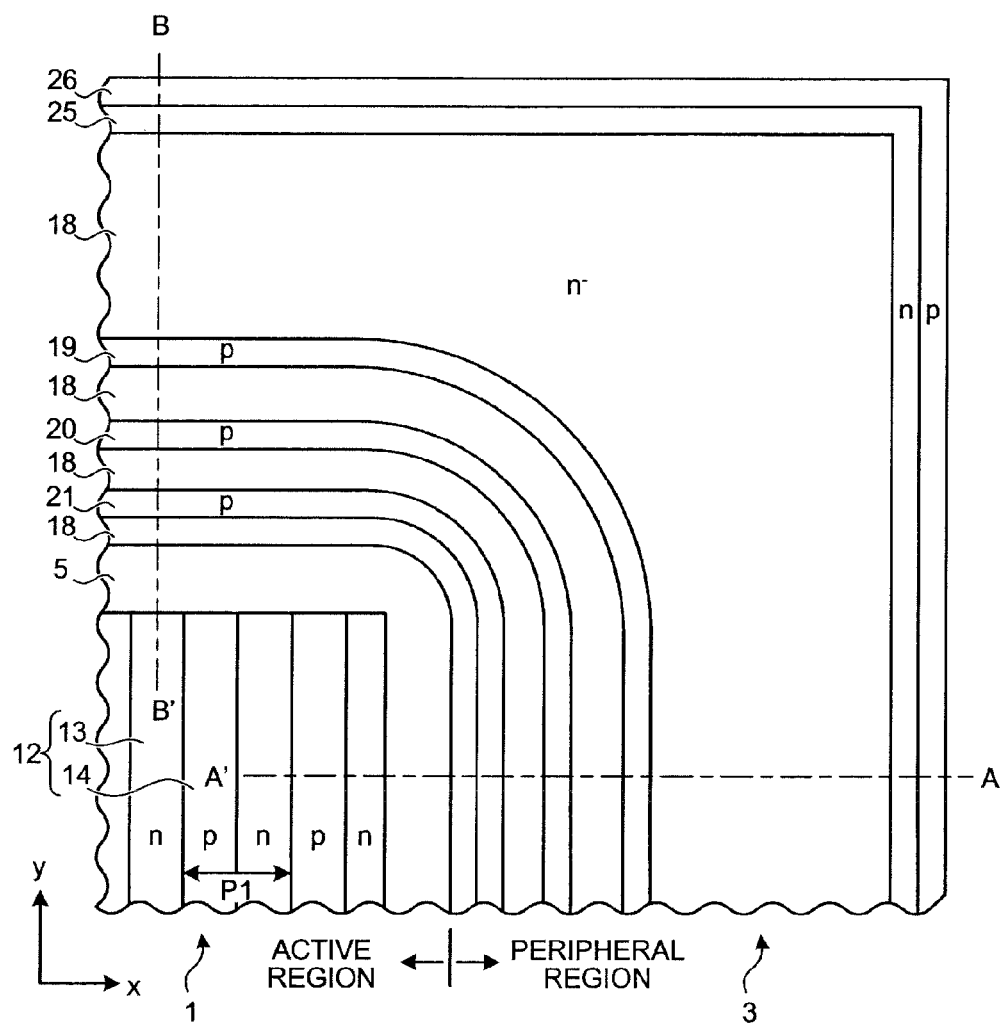
FIG. 1 is a top view of a semiconductor apparatus of a first embodiment.

Reference will now be made in detail to embodiments, examples of which are illustrated in the accompanying drawings, wherein like reference numerals refer to the like elements throughout. The embodiments are described below to explain the present invention by referring to the figures.

In the present specification and the accompanying drawings, layers and regions accompanied by n or p represent layers and regions in which electrons or positive holes serve as majority carries. + or − appended to n or p means high impurity concentration or low impurity concentration, respectively, indicating that a layer or region accompanied by + or − is higher or lower in impurity concentration than a layer or region not accompanied by + or −. In the description of the following embodiments and the accompanying drawings, a constituent element common to multiple embodiments will be denoted by the same reference numeral in each of the embodiments, and overlapping description will be omitted.

First Embodiment

Figure 2:
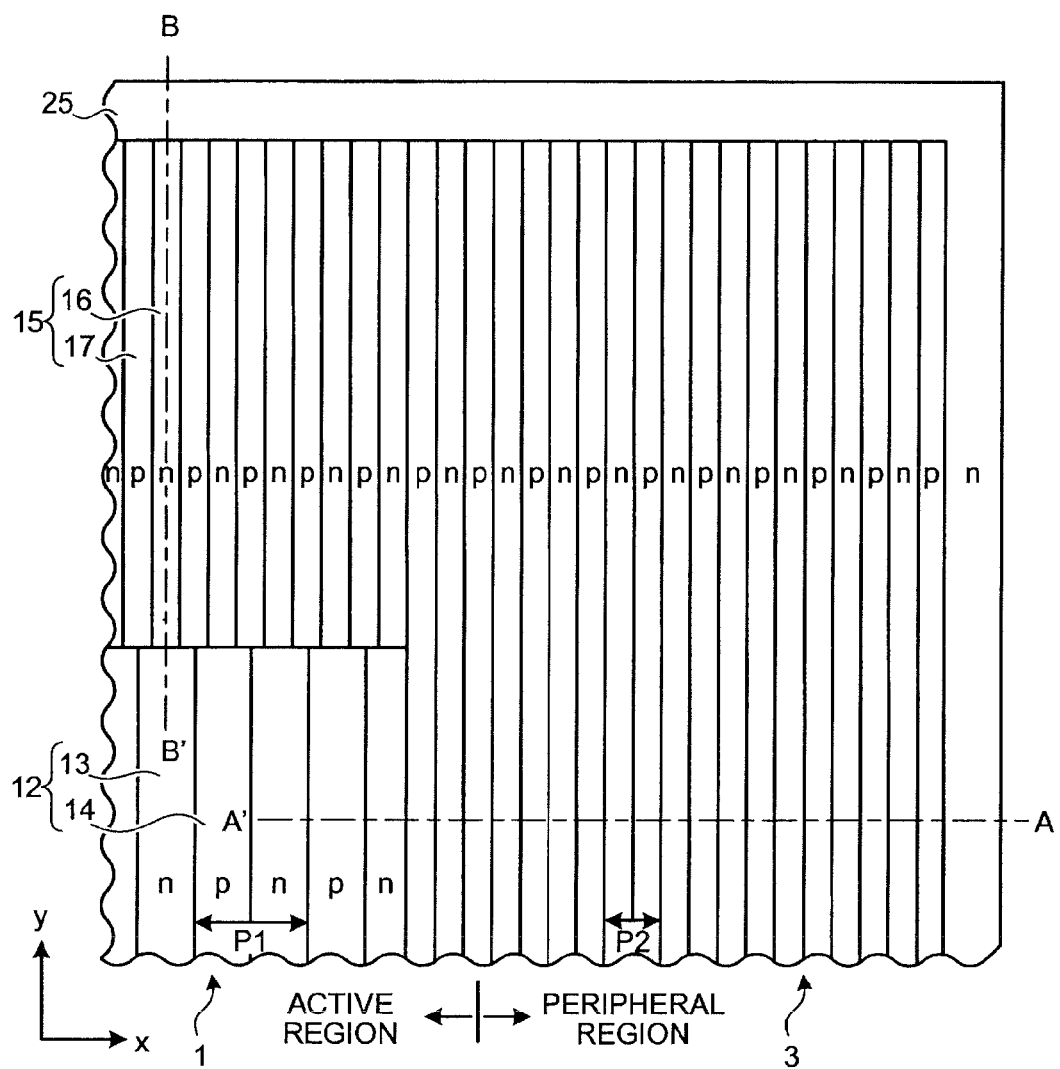
FIG. 2 is a horizontal sectional view of the semiconductor apparatus of the first embodiment.
Figure 3:
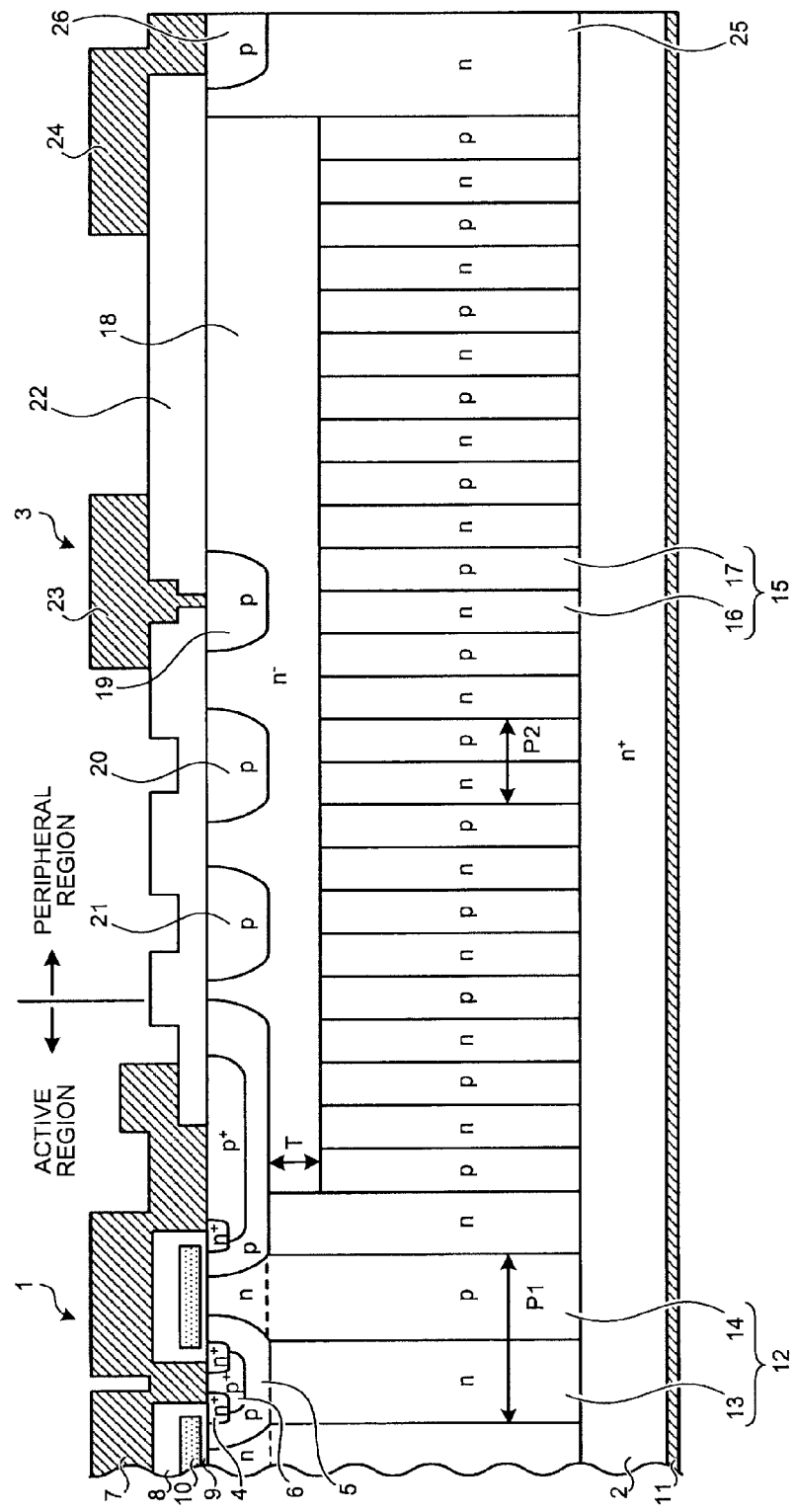
FIG. 3 is a vertical sectional view along an A-A' line of FIG. 1 of the semiconductor apparatus of the first embodiment.
Figure 4:
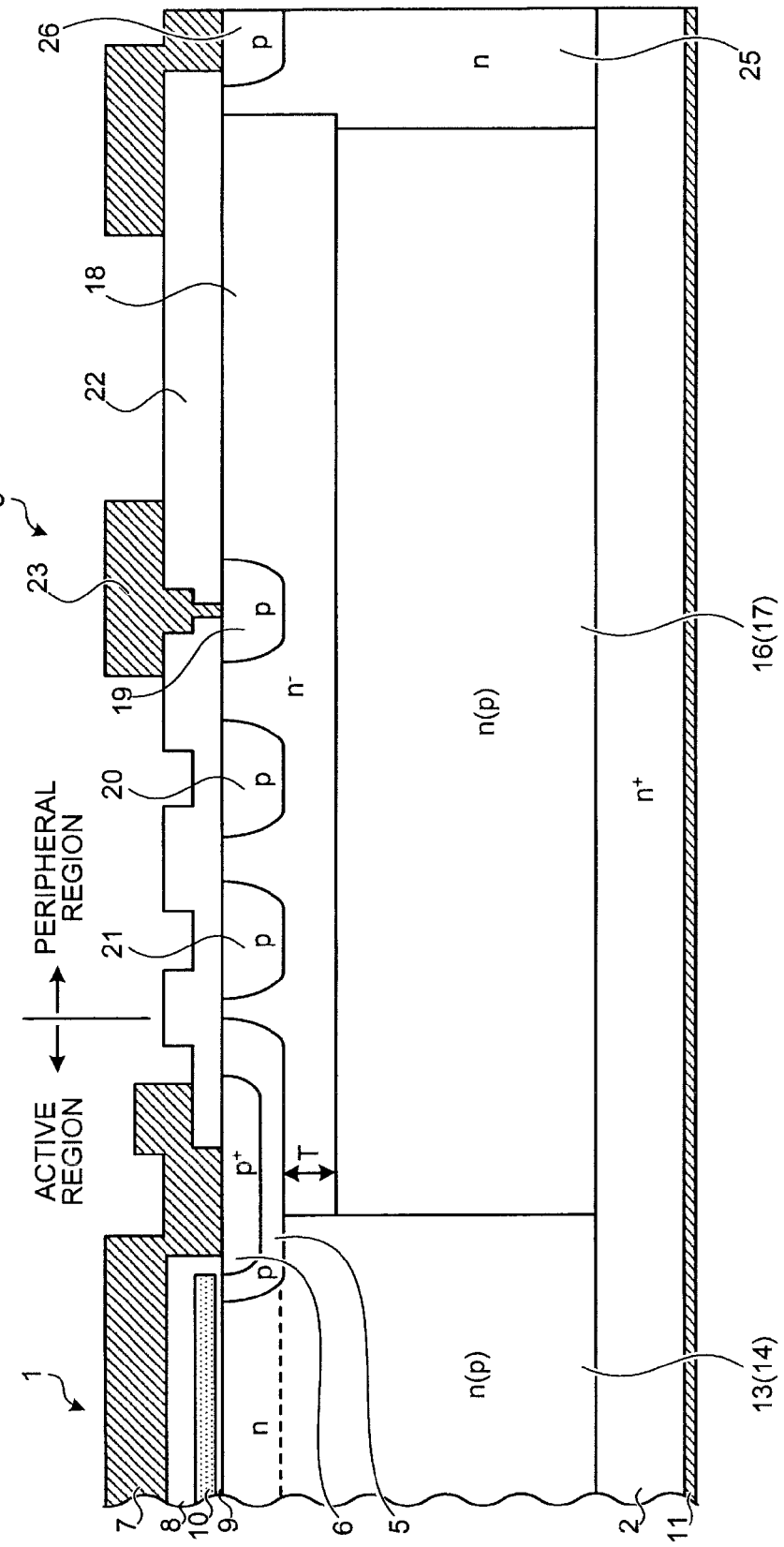
FIG. 4 is a vertical sectional view along a B-B' line of FIG. 1 of the semiconductor apparatus of the first embodiment.
Figure 5:
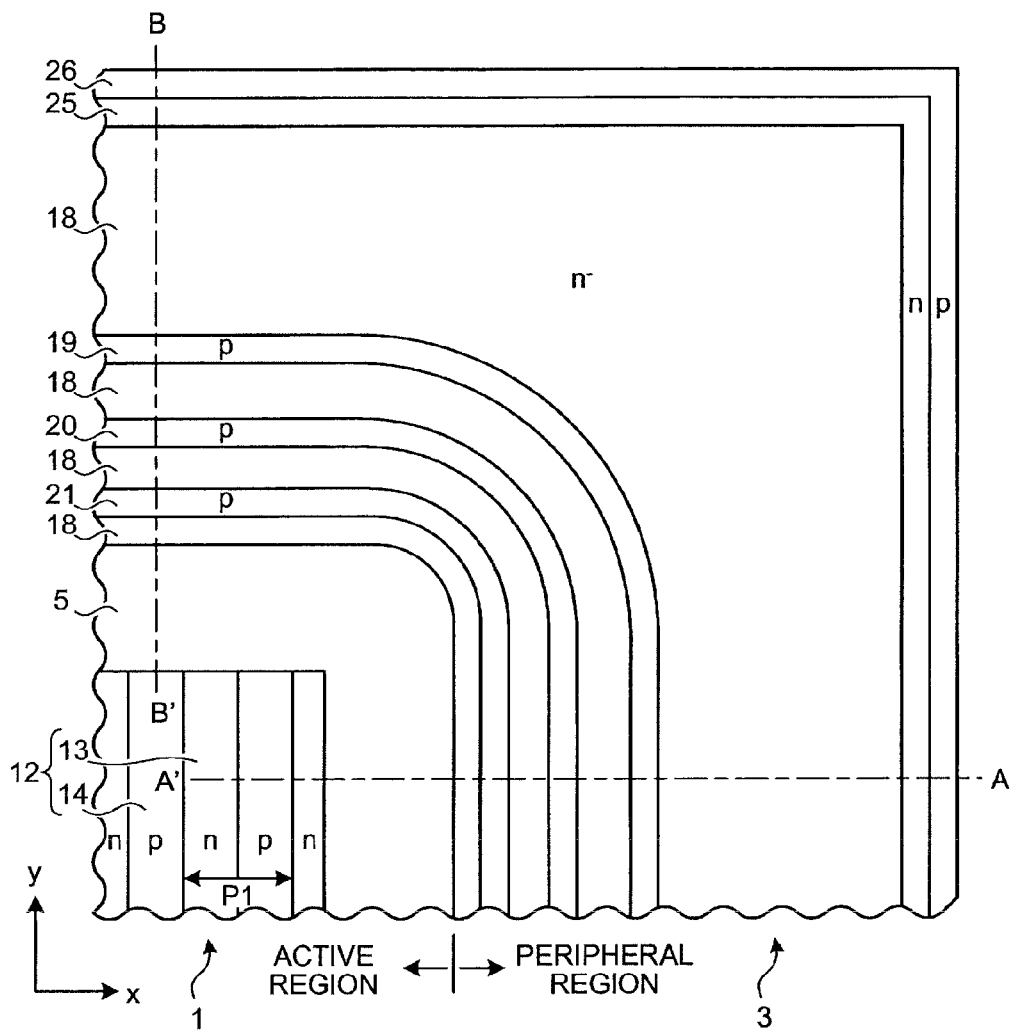
FIG. 5 is a top view of a semiconductor apparatus of a second embodiment.
Figure 13:
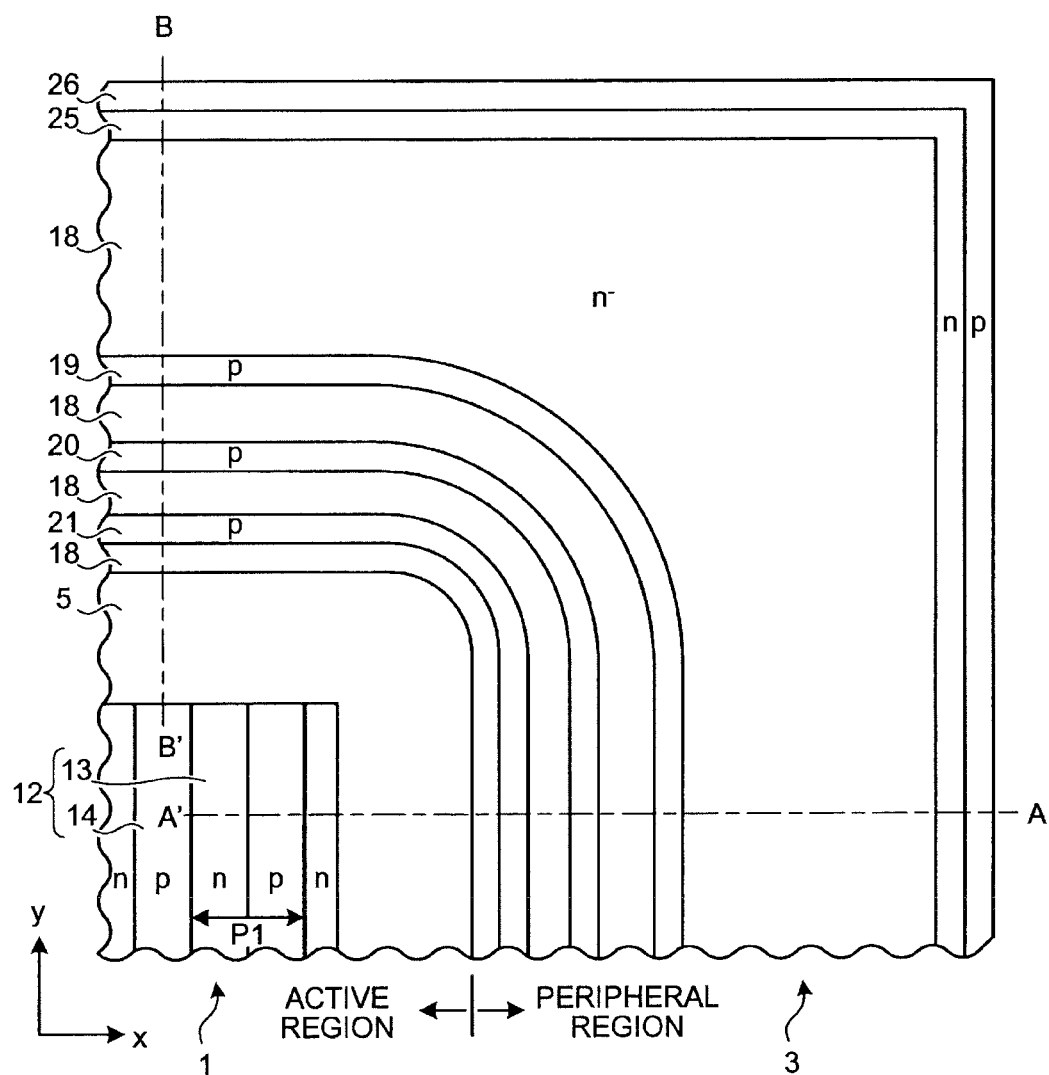
FIG. 13 is a top view of a semiconductor apparatus of a third embodiment.

FIG. 1 is a top view of a semiconductor apparatus of a first embodiment. FIG. 2 is a horizontal sectional view of the semiconductor apparatus of the first embodiment. FIG. 3 is a vertical sectional view along an A-A' line in FIG. 1 of the semiconductor apparatus of the first embodiment. FIG. 4 is a vertical sectional view along a B-B' line in FIG. 1 of the semiconductor apparatus of the first embodiment. FIGS. 1 and 2 depict one-fourth of the semiconductor apparatus (FIGS. 5, 6, 13, 14, 27, 34, 37, 38, and 43 to 53 depict the same). FIG. 1 depicts the respective shapes of a parallel pn-layer, an n-channel stopper region, a p-base region at the outermost location of the active region, and p-guard ring regions at a first main surface (FIGS. 5 and 13 depict the same). FIG. 2 depicts shapes along a section that crosses the parallel pn-layer at both active region and peripheral region, for example, shapes along a section at a depth half of the parallel pn-layer of the active region (FIGS. 6, 14, and 46 to 53 depict the same).

As depicted in FIGS. 1 to 4, the semiconductor apparatus includes the active region 1 on the first main surface side and an $n^+$-drain region (low resistance layer) 2 on the second main surface side. Outside the active region 1, the peripheral region 3 is disposed to encircle the active region 1. The active region 1 includes an $n^+$-source region 4, a p-base region 5, a $p^+$-contact region 6, a source electrode 7, an inter-layer insulating film 8, a gate insulating film 9, and a gate electrode 10 that are formed on the first main surface side as an element surface structure. A drain electrode 11 is disposed on the second main surface.

A first parallel pn-layer 12 is disposed between the active region 1 and the $n^+$-drain region 2. The first parallel pn-layer 12 is formed by first n-regions (first regions of a first conductivity) 13 alternating with first p-regions (first regions of a second conductivity) 14 in a repetitive arrangement. The first n-regions 13 and the first p-regions 14 respectively have a planar shape that is of a stripe. The peripheral region 3 has a second parallel pn-layer 15 formed by second n-regions (second regions of the first conductivity) 16 alternating with second p-regions (second regions of the second conductivity) 17 in a repetitive arrangement. The second n-regions 16 and the second p-regions 17 respectively have a planar shape that is of a stripe. The direction of the stripes of the second parallel pn-layer 15 is the same as the direction of the stripes of the first parallel pn-layer 12. A repetition pitch P2 of the second n-regions 16 and second p-regions 17 is narrower than a repetition pitch P1 of the first n-regions 13 and first p-regions 14. A narrow repetition pitch allows a depletion layer to expand easily toward the outer periphery in the parallel pn-layer, facilitating a higher initial breakdown voltage. The second p-regions 17 work in the same manner as a guard ring does until being depleted of carriers, easing an electric field in the second n-regions 16 and thus, facilitating higher breakdown voltage.

An n⁻-surface region (third region of the first conductivity) 18 is disposed between the second parallel pn-layer 15 and the first main surface. The n⁻-surface region 18 has an impurity concentration that is lower than that of the first n-regions 13, and has a thickness that is half or less than half the thickness of the first parallel pn-layer 12. The n⁻-surface region 18 extends up to the part of active region 1 that is adjacent to the peripheral region 3. In the first embodiment, the second parallel pn-layer 15 extends together with the n⁻-surface region 18 up to a place under the active region 1. The boundary between the first parallel pn-layer 12 and the second parallel pn-layer 15 coincides with the junction between the n⁻-surface region 18 and the first parallel pn-layer 12. At the junction between the n⁻-surface region 18 and the first pn-layer 12, charges are imbalanced, which may invite a drop in breakdown voltage. It is desirable, therefore, for the thickness T of the junction between the n⁻-surface region 18 and the first parallel pn-layer 12 to be half or less than half the thickness of the first parallel pn-layer 12.

On the first main surface side in the n⁻-surface region 18, plural p-guard ring regions (third regions of the second conductivity) 19, 20, and 21 are formed to be separated from each other. The p-guard ring regions 19, 20, and 21 have an impurity concentration that is higher than the impurity concentration of the n⁻-surface region 18. For example, adjacent p-guard ring regions 19, 20, and 21 closer to the termination of the peripheral region 3 are separated by an interval of a larger width than adjacent p-guard ring regions 19, 20, and 21 farther away. This is because that an electric field gradually decreases from the outermost active region 1 to the termination of the peripheral region 3. The n⁻-surface region 18 is covered with an insulating film 22, on which a field plate electrode (first conductive layer) 23 and a channel stopper electrode (second conductive layer) 24 are disposed to be separated from each other. The field plate electrode 23 is connected electrically to the outermost p-guard ring region 19. In the peripheral region 3, an n-channel stopper region 25 is formed. On the first main surface side in the n-channel stopper region 25, a p-region at the termination in peripheral region 26 is formed. The channel stopper electrode 24 is connected electrically to the outermost p-region 26. The number of the p-guard ring regions may be two or three or more. The field plate electrode may be connected electrically to some or all of the p-guard ring regions other than the outermost p-guard ring region.

Although not particularly limited hereto, for example, the semiconductor apparatus of the first embodiment is a vertical 600V MOSFET, the dimensions and impurity concentration of the constituent elements are as follows. The thickness of a drift region (thickness of the first parallel pn-layer 12) is 44.0 micrometers, the width of the first n-region 13 and of the first p-region 14 is 7.0 micrometers (with a repetition pitch P1 of 14.0 micrometers), and the impurity concentration of the first n-region 13 and of the first p-region 14 is $3.0*10^{15}$ cm⁻³. The width of the second n-region 16 and of the second p-region 17 is 3.5 micrometers (with the repetition pitch P2 of 7.0 micrometers), and the impurity concentration of the second n-region 16 and of the second p-region 17 is $1.0*10^{15}$ cm⁻³. The impurity concentration of the n⁻-surface region 18 is $1.0*10^{14}$ cm⁻³, and the depth of the same is 15 micrometers. The diffusion depth of the p-guard ring regions 19, 20, and 21 is 3.0 micrometers, and the surface impurity concentration of the same is $3.0*10^{17}$ cm⁻³. The diffusion depth of the p-base region 5 is 3.0 micrometers, and the surface impurity concentration of the same is $3.0*10^{17}$ cm⁻³. The diffusion depth of the n⁺-source region 4 is 0.5 micrometers, and the surface impurity concentration of the same is $3.0*10^{20}$ cm⁻³. The diffusion depth of a surface n-drift region (n-region above a broken line between p-base regions 5 in FIGS. 3 and 4) is 2.5 micrometers, and the surface impurity concentration of the same is $2.0*10^{16}$ cm⁻³. The thickness of the n⁺-drain region 2 is 300 micrometers, and the impurity concentration of the same is $2.0*10^{18}$ cm⁻³. The width of the n-channel stopper region 25 is 30.0 micrometers, and the impurity concentration of the same is $5.0*10^{16}$ cm⁻³. The impurity concentration of the outermost p-region 26 is $3.0*10^{17}$ cm⁻³.

According to the first embodiment, because the p-guard ring regions 19, 20, and 21 are provided, a high electric field near the outermost active region 1 is relaxed when positive charges (positive ions) are present on the oxide film of the peripheral region. This suppresses the fluctuation of breakdown voltage caused by positive charges. Because the channel stopper electrode 24 is provided, depletion layer expansion reaching the n-channel stopper region 25 of the peripheral region 3 is prevented when negative charges (negative ions) are present on the oxide film of the peripheral region, suppressing a drop in breakdown voltage caused by negative charges. Because the second parallel pn-layer 15 is provided, the depletion layer easily expands in the peripheral region 3, easily achieving high breakdown voltage. Because the surface region 18 has an impurity concentration that is lower than the impurity concentration of the first n-regions 13, the depletion layer expands more easily in the peripheral region 3. Hence, high breakdown voltage is achieved more easily. If the thickness of the n⁻-surface region 18 is half or less than half the thickness of the first parallel pn-layer 12, the thickness of the junction between the n⁻-surface region 18 and the first parallel pn-layer 12 is small, suppressing a drop in breakdown voltage. Because the impurity concentration of the p-guard ring regions 19, 20, and 21 is higher than that of the n⁻-surface region 18, a neutral region remains in the p-guard ring regions 19, 20, and 21 when voltage is applied thereto, consequently fixing the electric potential of the p-guard ring regions 19, 20, and 21. As a result, when charges (ions) are present on the oxide film of the peripheral region, the fluctuation of surface electric potential is suppressed, improving the robustness against charges on breakdown voltage. When intervals between the p-guard ring regions 19, 20, and 21 adjacent to each other widen as the intervals come closer to the termination of the peripheral region 3, the high electric field is eased near the outmost active region 1 that is sensitive to charges (ions), thereby improving the robustness against charges on breakdown voltage.

Second Embodiment

Figure 6:
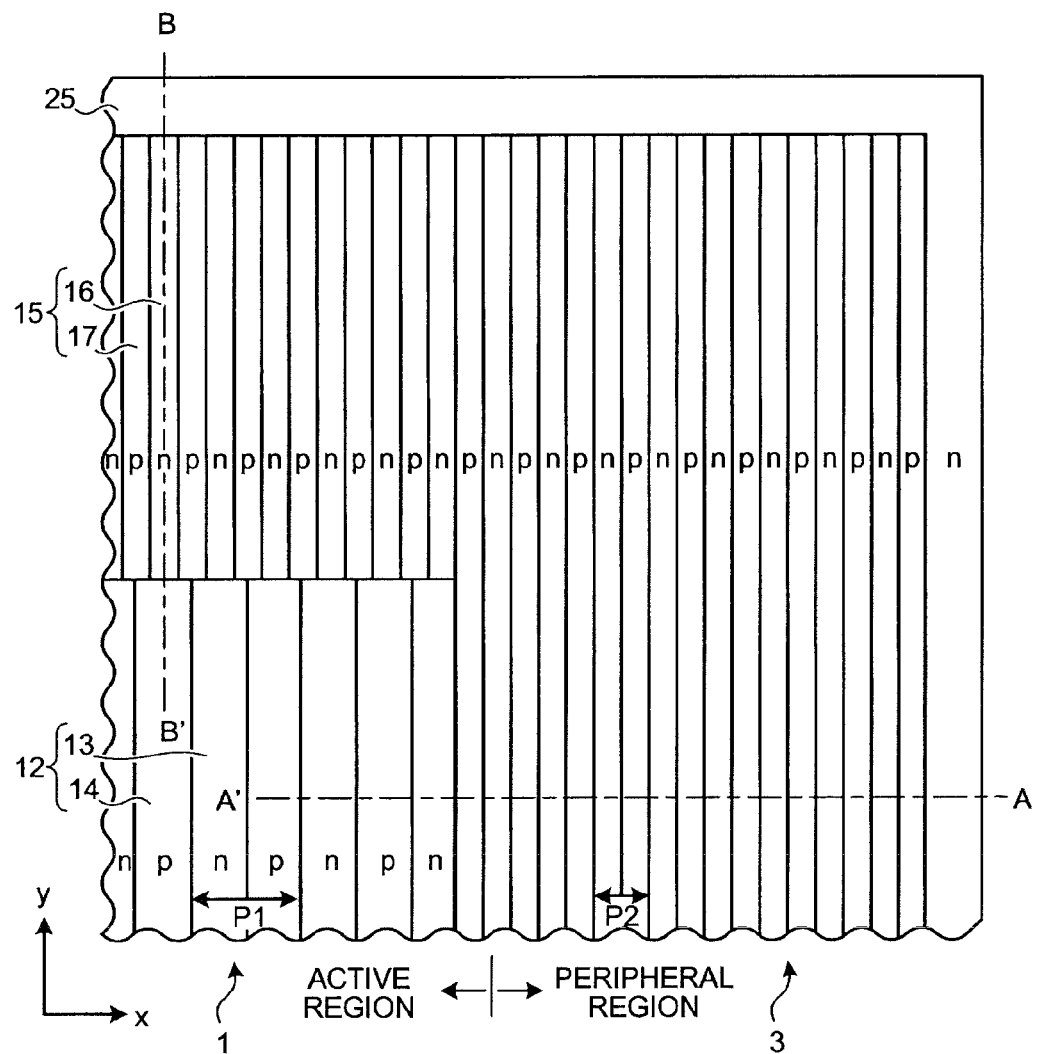
FIG. 6 is a horizontal sectional view of the semiconductor apparatus of the second embodiment.
Figure 7:
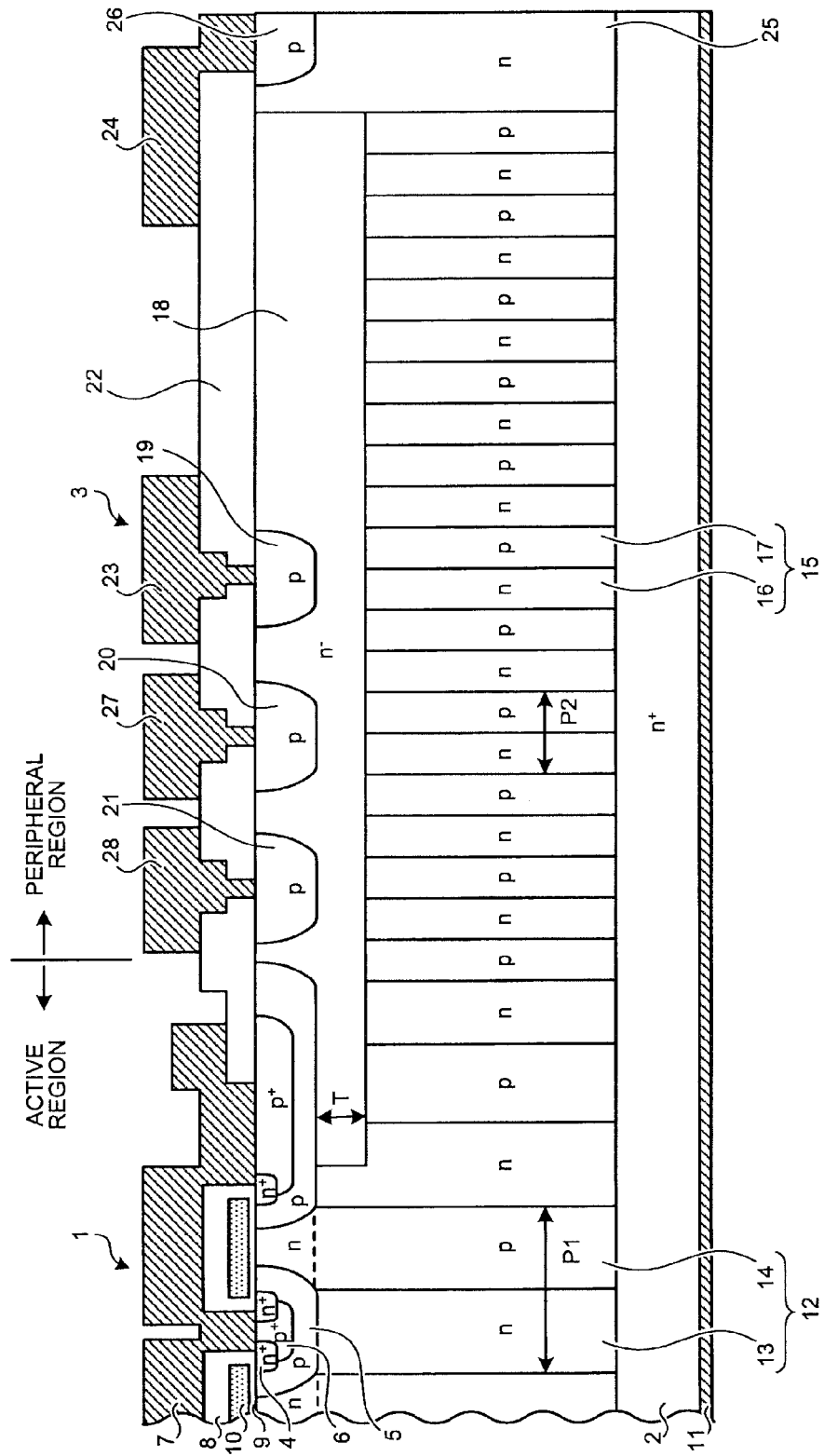
FIG. 7 is a vertical sectional view along an A-A' line of FIG. 5 of the semiconductor apparatus of the first embodiment.
Figure 8:
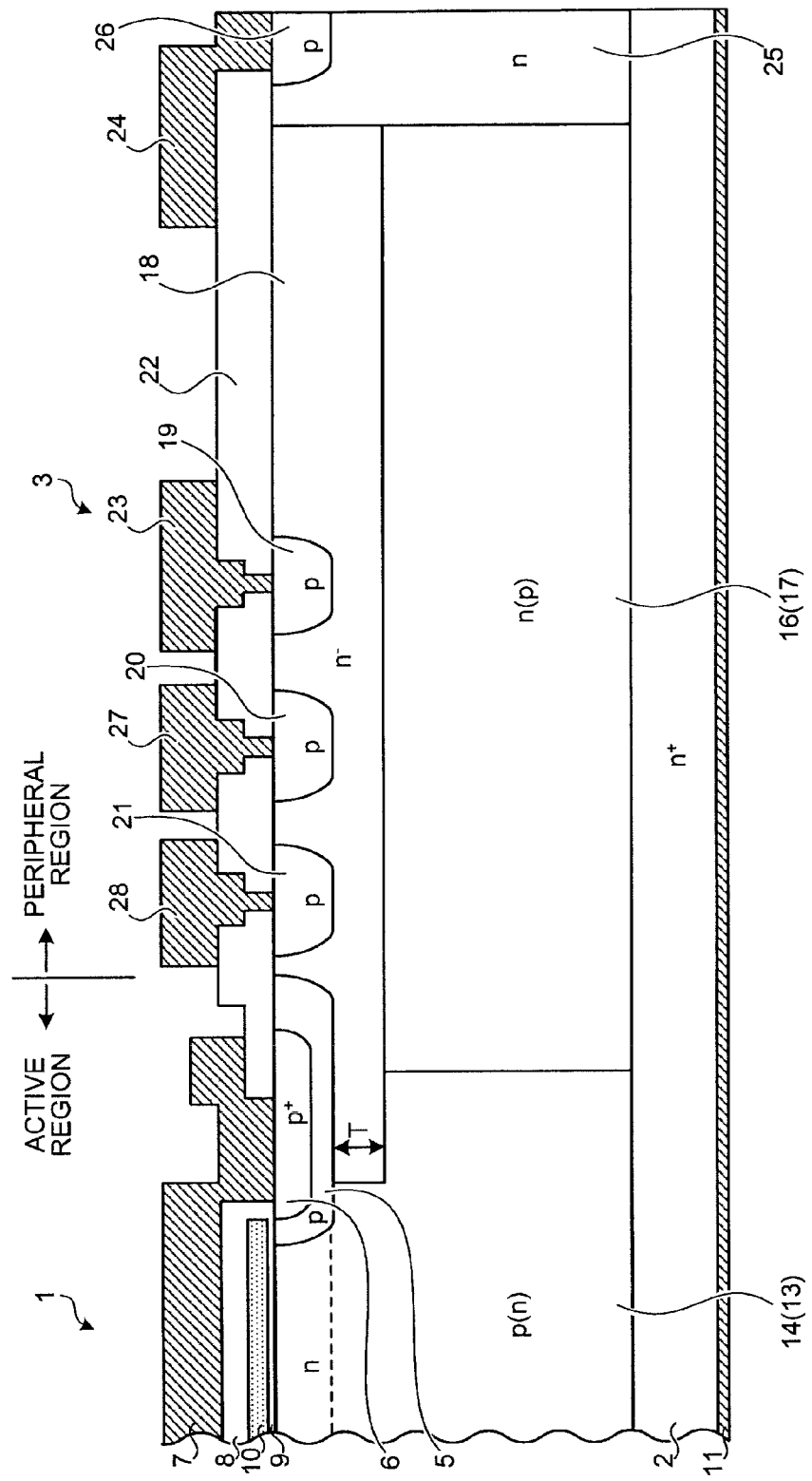
FIG. 8 is a vertical sectional view along a B-B' line of FIG. 5 of the semiconductor apparatus of the second embodiment.

FIG. 5 is a top view of a semiconductor apparatus of a second embodiment. FIG. 6 is a horizontal sectional view of the semiconductor apparatus of the second embodiment. FIG. 7 is a vertical sectional view along an A-A' line in FIG. 5 of the semiconductor apparatus of the first embodiment. FIG. 8 is a vertical sectional view along a B-B' line in FIG.

5 of the semiconductor apparatus of the second embodiment. As depicted in FIGS. 5 to 8, the second embodiment is different from the first embodiment in the following two respects. One respect is that the pitch transition of the parallel pn-layers, i.e., the boundary between the first parallel pn-layer 12 and the second parallel pn-layer 15 is under the n⁻-surface region 18. The other respect is that the p-guard ring regions 19, 20, and 21 are connected electrically to field plate electrodes 23, 27, and 28, respectively. The field plate electrodes 23, 27, and 28 are formed to extend over each of the p-guard ring regions 19, 20, and 21, respectively, to the n⁻-surface region 18. This means that each of the field plate electrodes 23, 27, and 28 overhangs toward the inner periphery or the outer periphery from the junction at the first main surface between each of the p-guard ring regions 19, 20, and 21 to which each filed plate electrode is electrically connected and the n⁻-surface region 18. The number of the p-guard ring regions may be two or three or more. Any one of the p-guard ring regions except the outermost p-guard ring region may be electrically unconnected to the field plate electrode. In other configurative aspects, the second embodiment is substantially identical to the first embodiment.

Figure 9:
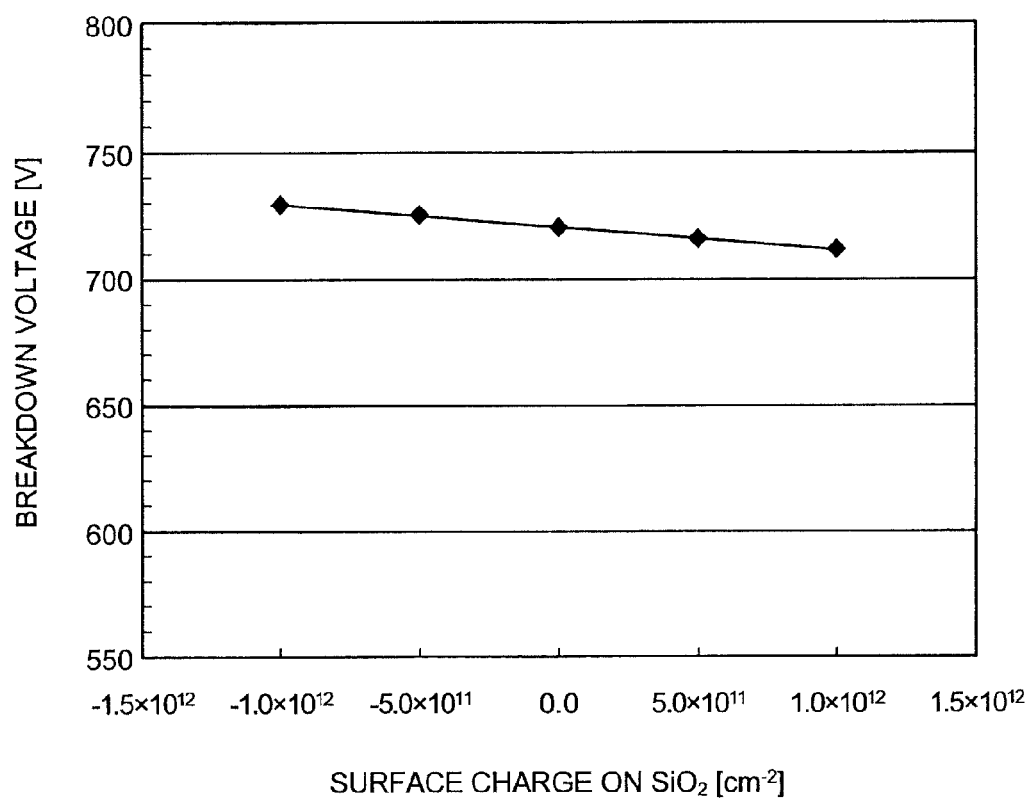
FIG. 9 is a diagram of the simulation results of surface charge dependency on breakdown voltage in the semiconductor apparatus of the second embodiment.

FIG. 9 is a diagram of the simulation results of surface charges dependency on breakdown voltage in the semiconductor apparatus of the second embodiment. These simulation results are obtained from simulations for a configuration such that four p-guard ring regions are connected electrically to field plate electrodes. As depicted in FIG. 9, breakdown voltage hardly fluctuates even if positive charges (positive ions) or negative charges (negative ions) are present on the oxide film of the peripheral region. This demonstrates that high breakdown voltage is achieved and the robustness against charges on breakdown voltage is improved in the second embodiment.

Figure 10:
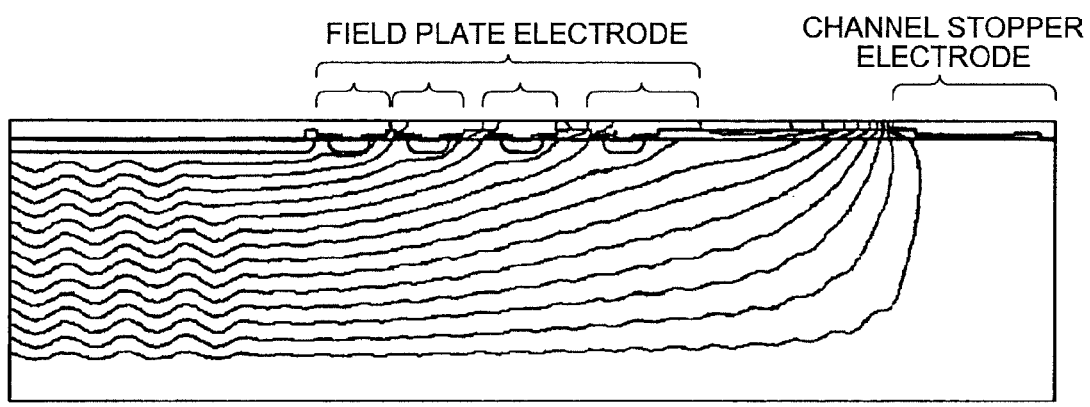
FIG. 10 is a diagram of electric potential distribution in the off-state for the semiconductor apparatus of the second embodiment.
Figure 11:
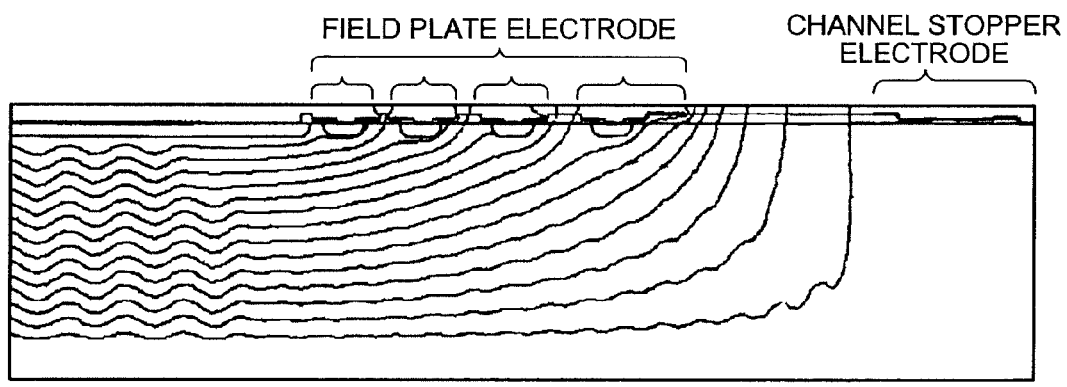
FIG. 11 is a diagram of electric potential distribution in the off-state for the semiconductor apparatus of the second embodiment.
Figure 12:
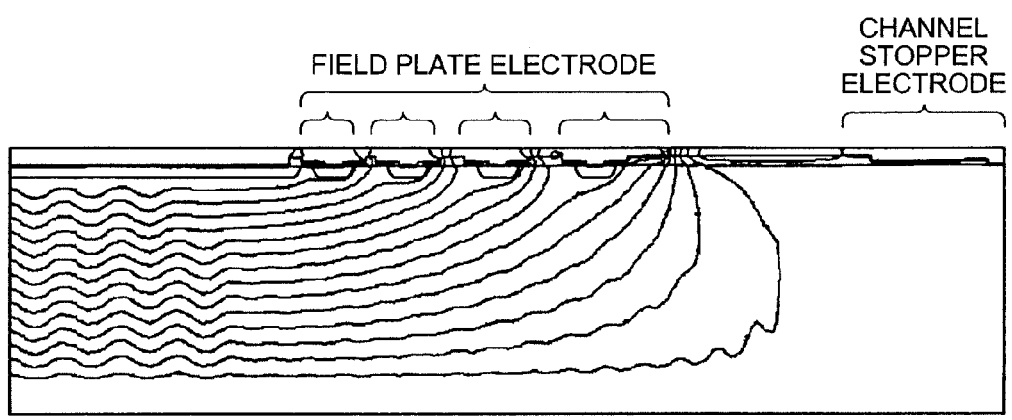
FIG. 12 is a diagram of electric potential distribution in the off-state for the semiconductor apparatus of the second embodiment.

FIGS. 10 to 12 depict electric potential distributions in off-state for the semiconductor apparatus of the second embodiment. FIG. 10 depicts an electric potential distribution in the case that a surface charge quantity on the oxide film of the peripheral region is $-1.0*10^{12}$ cm$^{-2}$. FIG. 11 depicts an electric potential distribution in the case that the surface charge quantity is 0.0 cm$^{-2}$. FIG. 12 depicts an electric potential distribution in the case that the surface charge quantity is $+1.0*10^{12}$ cm$^{-2}$. These figures reveal that breakdown voltage is maintained mainly between the field plate electrode and the channel stopper electrode when surface charges are negative charges (negative ions), and that breakdown voltage is maintained mainly by the p-guard ring regions and the filed plate electrode when surface charges are positive charges (positive ions).

The second embodiment offers the same effect as the first embodiment. At the pitch transition of the parallel pn-layers, a drop in breakdown voltage due to charge imbalance easily occurs. If the pitch transition of the parallel pn-layers is under the n⁻-surface region 18, a depletion layer easily expands at the lower side of the n⁻-surface region 18, which suppresses a drop in breakdown voltage. Because the p-guard ring regions 19, 20, and 21 are connected electrically to the field plate electrodes 23, 27, and 28, respectively, charges and ions migrating to the peripheral region 3 are collected by the field plate electrodes 23, 27, and 28. As a result, the influence of charges (ions) on breakdown voltage is reduced. If each of the field plate electrodes 23, 27, and 28 is formed to extend over each of the p-guard ring regions 19, 20, and 21 and the n⁻-surface region 18, each of the field plate electrodes 23, 27, and 28 extending in both directions toward the outer periphery and the inner periphery is connected to each of p-guard ring regions 19, 20, and 21. As a result, the concentration of an electric field on curvature of the p-guard ring regions 19, 20, and 21 is relaxed when positive charges are present on the oxide film of the peripheral region, and the expansion of the depletion layer is prevented when negative charges are present on the oxide film of the peripheral region. Hence breakdown voltage is stabilized.

Third Embodiment

Figure 14:
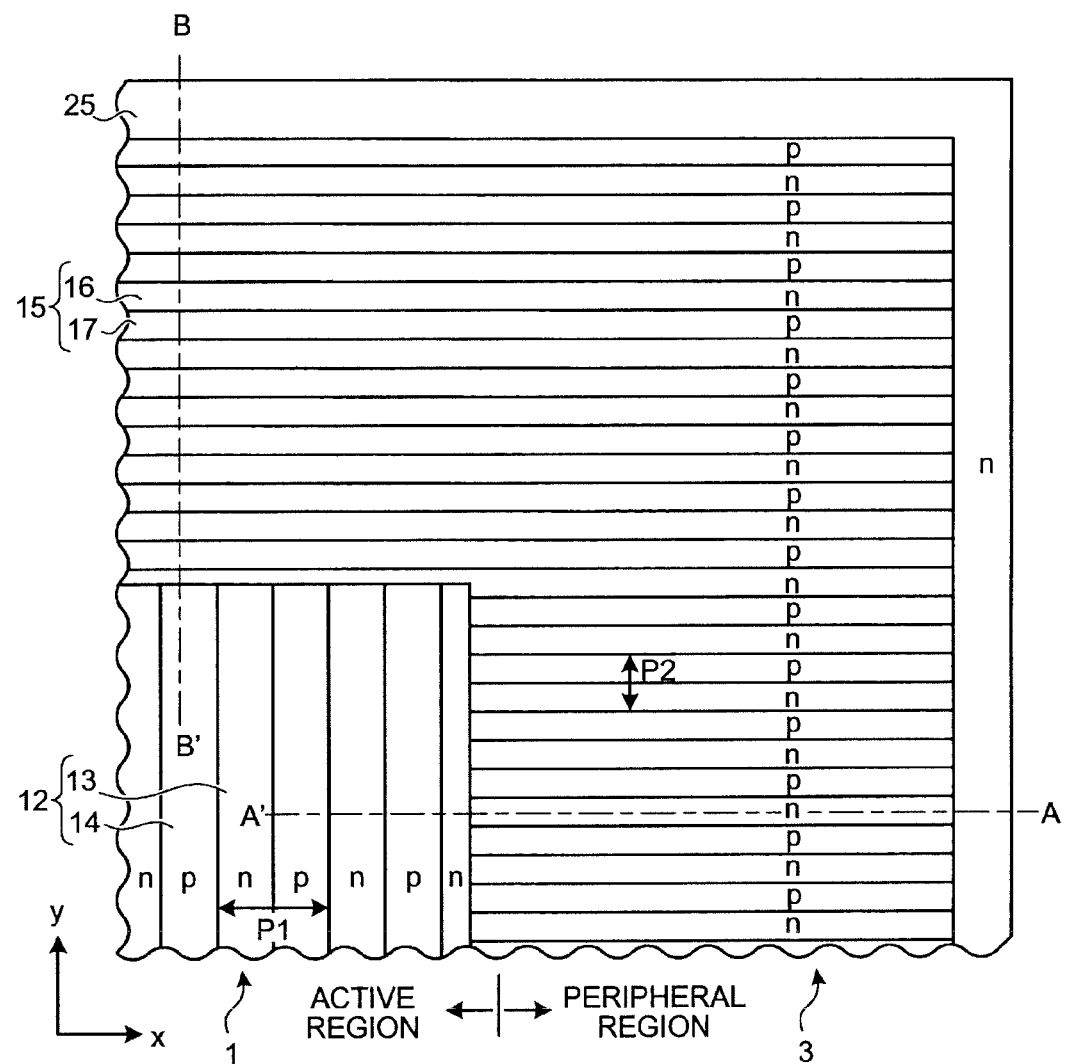
FIG. 14 is a horizontal sectional view of the semiconductor apparatus of the third embodiment.
Figure 15:
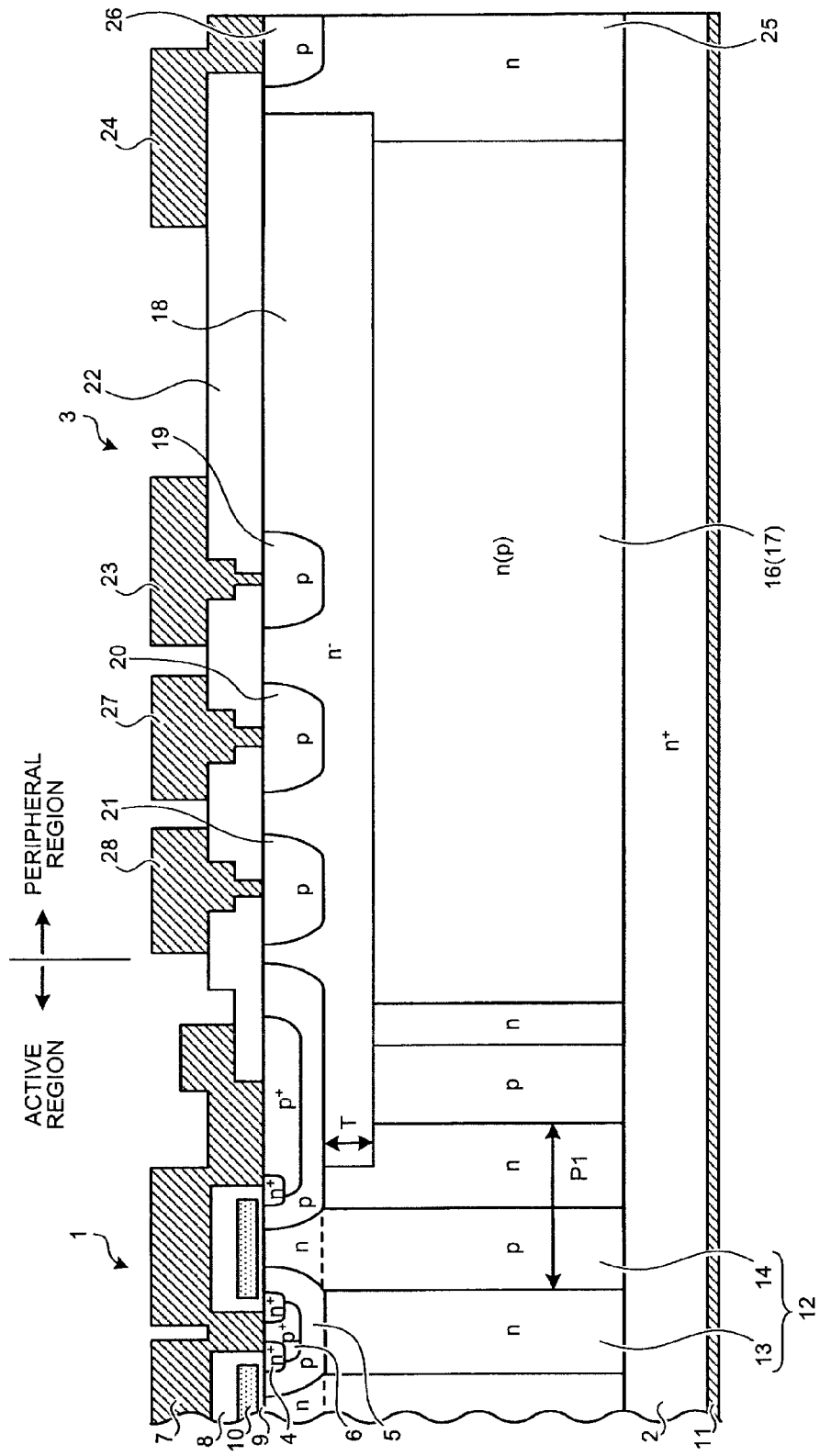
FIG. 15 is a vertical sectional view along an A-A' line in FIG. 13 of the semiconductor apparatus of the third embodiment.
Figure 16:
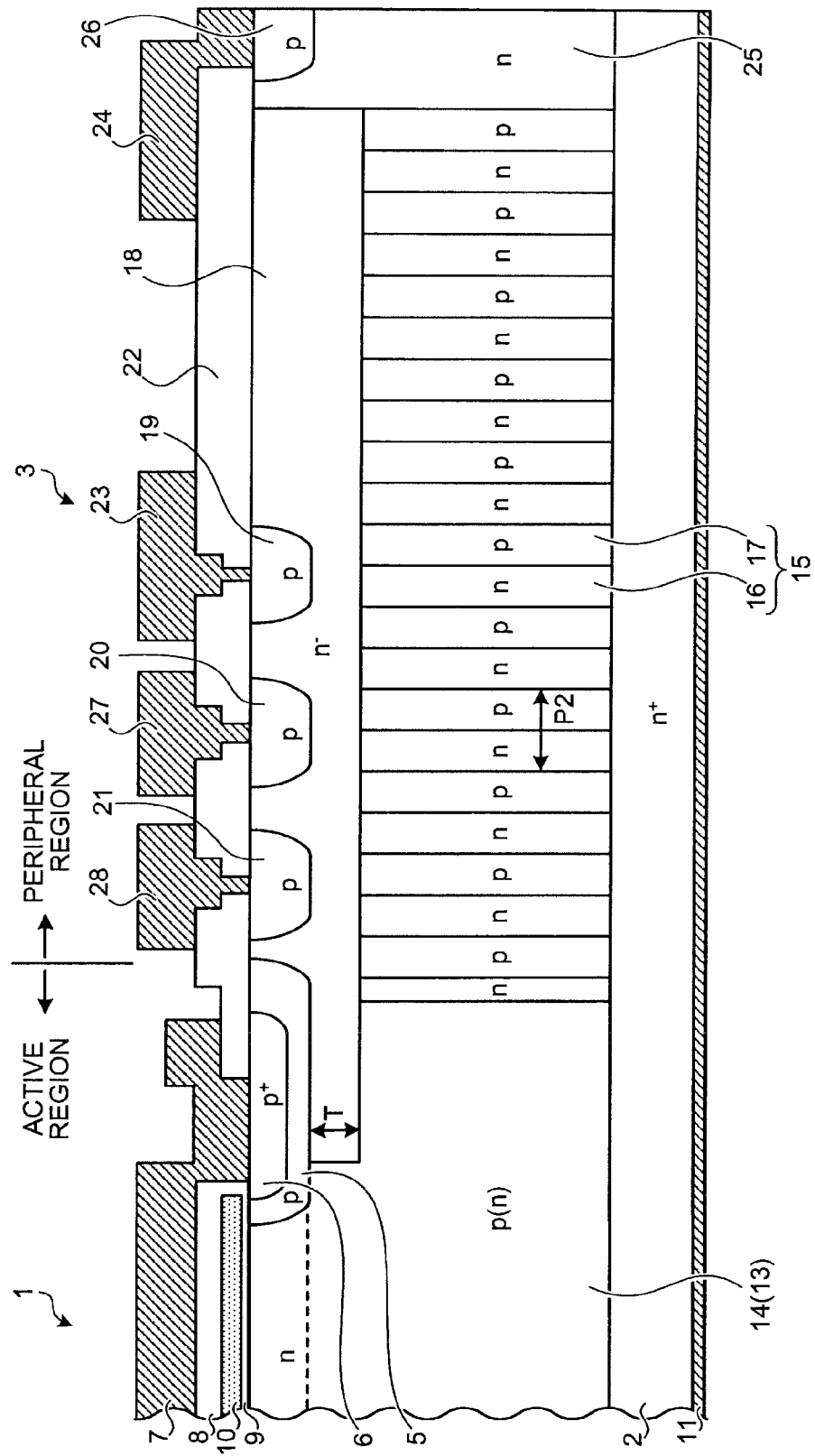
FIG. 16 is a vertical sectional view along a B-B' line in FIG. 13 of the semiconductor apparatus of the third embodiment.

FIG. 13 is a top view of a semiconductor apparatus according to a third embodiment. FIG. 14 is a horizontal sectional view of the semiconductor apparatus according to the third embodiment. FIG. 15 is a vertical sectional view along an A-A' line in FIG. 13 of the semiconductor apparatus according to the third embodiment. FIG. 16 is a vertical sectional view along a B-B' line in FIG. 13 of the semiconductor apparatus according to the third embodiment. As depicted in FIGS. 13 to 16, the third embodiment is different from the second embodiment in that the direction of the stripes of the second parallel pn-layer 15 is different from the direction of the stripes of the first parallel pn-layer 12. For example, the direction of the stripes of the second parallel pn-layer 15 may be perpendicular to the direction of the stripes of the first parallel pn-layer 12. In other configurative aspects, the third embodiment is substantially identical to the second embodiment.

The third embodiment offers the same effect as the second embodiment. Even if the first parallel pn-layer 12 and the second parallel pn-layer 15 differ in the direction of stripes, the same effect of the robustness against charges on breakdown voltage is achieved as in the second embodiment as far as the structure of the peripheral region 3 is the same as the structure in the second embodiment.

Fourth Embodiment

Figure 17:
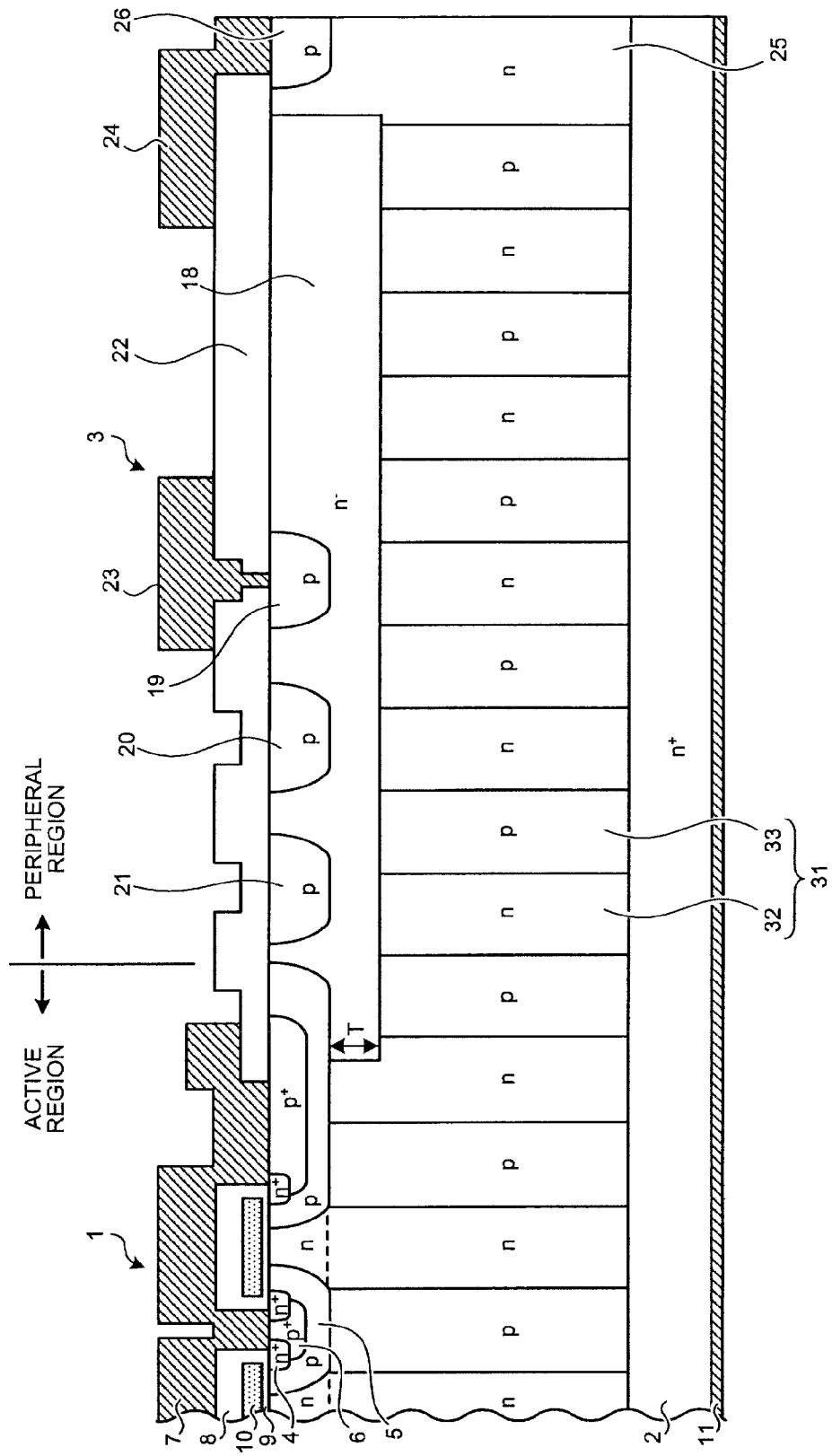
FIG. 17 is a vertical sectional view of a semiconductor apparatus of a fourth embodiment.
Figure 18:
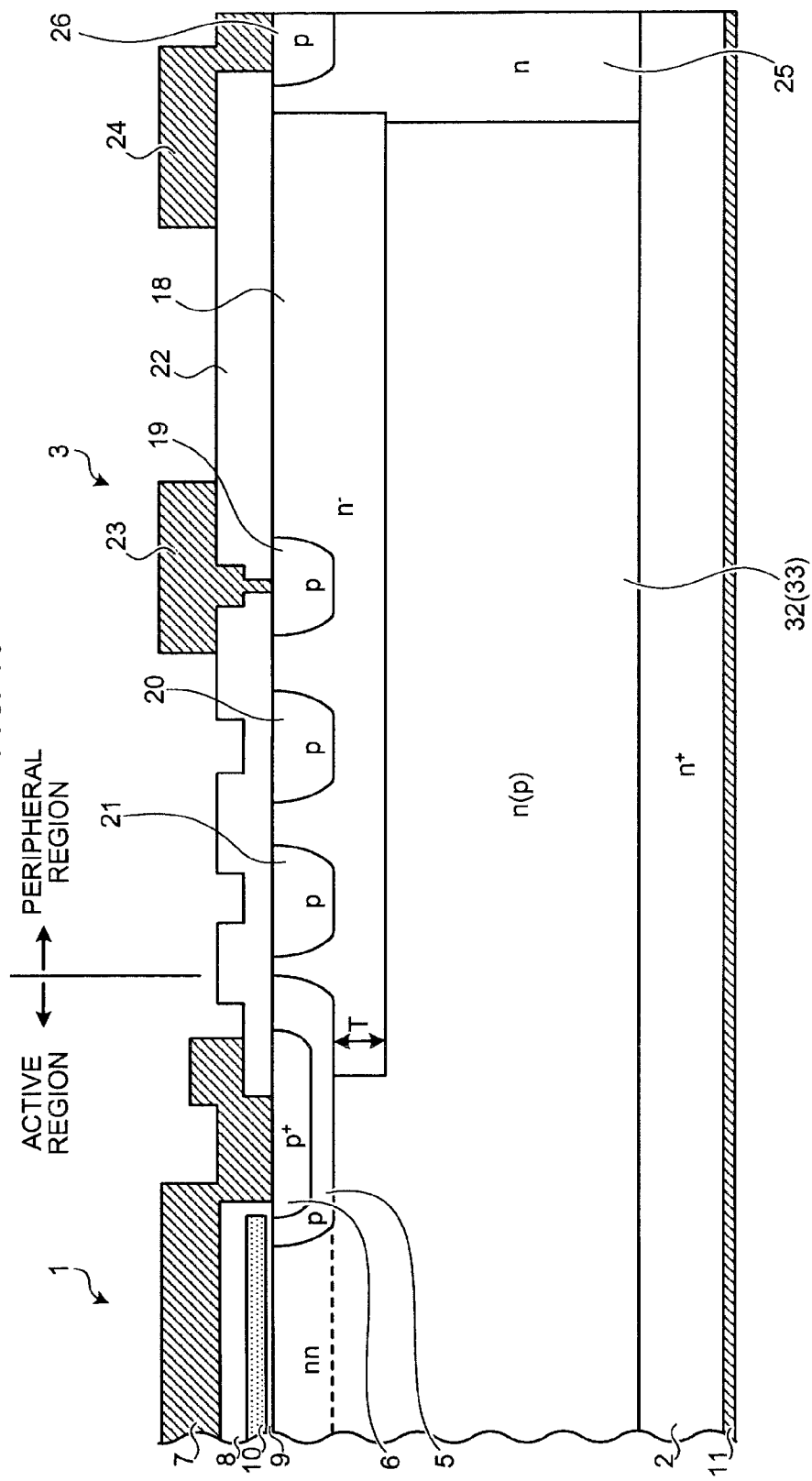
FIG. 18 is a vertical sectional view of a semiconductor apparatus of a fourth embodiment.

FIGS. 17 and 18 are vertical sectional views of a semiconductor apparatus of a fourth embodiment. A top view of the semiconductor apparatus of the fourth embodiment is substantially identical to the top view of FIG. 1. In the top view of the fourth embodiment, a parallel pn-layer 31, n-regions 32, and p-regions 33 are equivalent to the first parallel pn-layer 12, the first n-regions 13, and the first p-regions 14, respectively. FIG. 17 is equivalent to a vertical sectional view along the A-A' line in FIG. 1; and FIG. 18 is equivalent to a vertical sectional view along the B-B' line in FIG. 1. As depicted in FIGS. 17 and 18, the fourth embodiment is different from the first embodiment in that the parallel pn-layer 31 consisting of the alternately arranged n-regions (fourth regions of the first conductivity) 32 and p-regions (fourth regions of the second conductivity) 33 is formed between the first main surface and the n⁺-drain region 2. This means that the pitch of the parallel pn-layer 31 remains the same in the active region 1 and in the peripheral region 3. The n⁻-surface region 18 has an impurity concentration lower that is than the impurity concentration of the n-regions 32 of the parallel pn-layer 31, and has a thickness that is half or less than half the thickness of the parallel pn-layer 31 under the active region 1. At the junction between the n⁻-surface region 18 and the pn-layer 31 under the active region 1, charges are imbalanced, which may invite a drop in breakdown voltage. It is desirable, therefore, for the thickness T of the junction between the n⁻-surface region 18 and the pn-layer 31 under the active region 1 to be half or less than half the thickness of the pn-layer 31 under the active region 1. In other configurative aspects, the fourth embodiment is substantially identical to the first embodiment.

Although not particularly limited hereto, for example, the semiconductor apparatus of the fourth embodiment is a vertical 600V MOSFET, the dimensions and impurity concentration of the constituent elements are as follows. The thickness of a drift region (thickness of the parallel pn-layer 31 in the active region 1) is 44.0 micrometers, the width of the first n-region 32 and of the first p-region 33 is 7.0 micrometers (with a repetition pitch of 14.0 micrometers), and the impurity concentration of the n-region 32 and of the p-region 33 is $3.0*10^{15}$ $cm^{-3}$. The impurity concentration of the $n^-$-surface region 18 is $1.0*10^{14}$ $cm^{-3}$. The diffusion depth of the p-guard ring regions 19, 20, and 21 is 3.0 micrometers, and the surface impurity concentration of the same is $3.0*10^{17}$ $cm^{-3}$. The diffusion depth of the p-base region 5 is 3.0 micrometers, and the surface impurity concentration of the same is $3.0*10^{17}$ $cm^{-3}$. The diffusion depth of the $n^+$-source region 4 is 1.0 micrometers, and the surface impurity concentration of the same is $3.0*10^{20}$ $cm^{-3}$. The diffusion depth of a surface n-drift region (n-region above a broken line between p-base regions 5 in FIGS. 17 and 18) is 2.5 micrometers, and the surface impurity concentration of the same is $2.0*10^{16}$ $cm^{-3}$. The thickness of the $n^+$-drain region 2 is 300 micrometers, and the impurity concentration of the same is $2.0*10^{18}$ $cm^{-3}$. The width of the n-channel stopper region 25 is 30.0 micrometers, and the impurity concentration of the same is $5.0*10^{15}$ $cm^{-3}$. The impurity concentration of the outermost peripheral p-region 26 is $3.0*10^{17}$ $cm^{-3}$.

Figure 19:
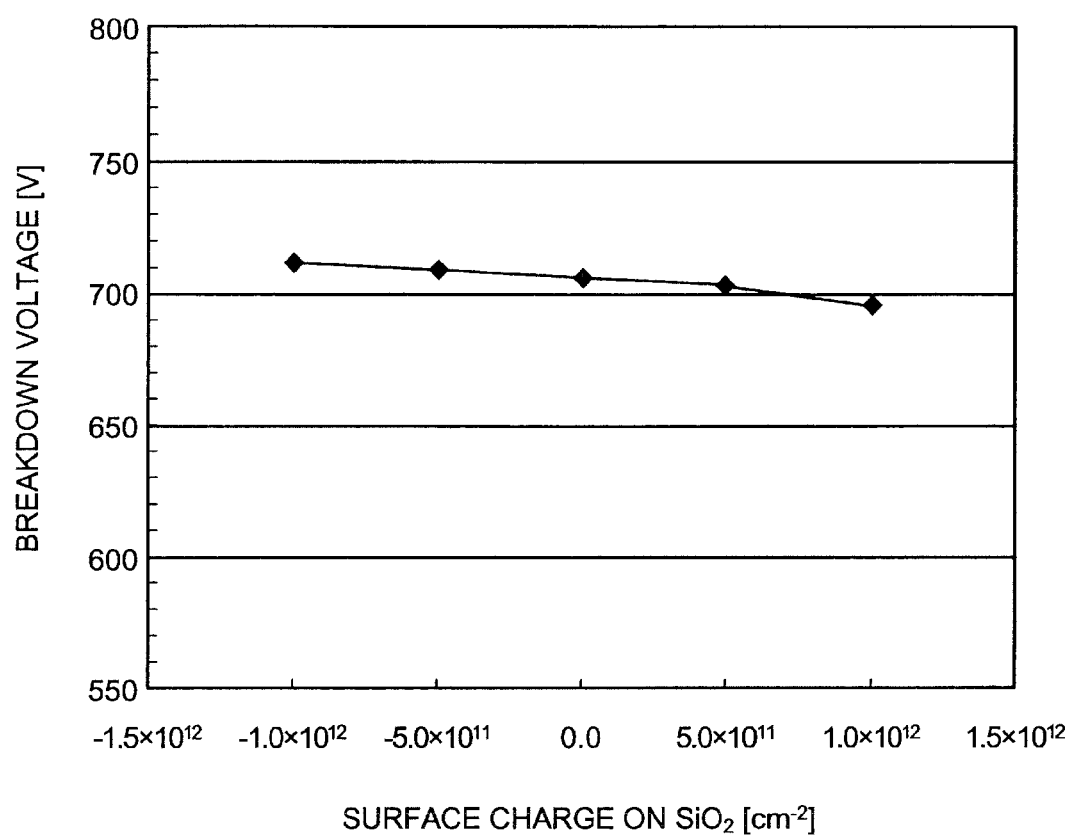
FIG. 19 is a diagram of the simulation results of surface charge dependency on breakdown voltage in the semiconductor apparatus of the fourth embodiment.

FIG. 19 is a diagram of the simulation results of surface charge dependency on breakdown voltage in the semiconductor apparatus of the fourth embodiment. These simulation results are obtained from simulations for a configuration such that four p-guard ring regions are connected electrically to field plate electrodes. As depicted in FIG. 19, breakdown voltage hardly fluctuates even if positive charges (positive ions) or negative charges (negative ions) are present on the oxide film of the peripheral region. This demonstrates that high breakdown voltage is achieved and the robustness against charges on breakdown voltage is improved in the second embodiment.

Figure 20:
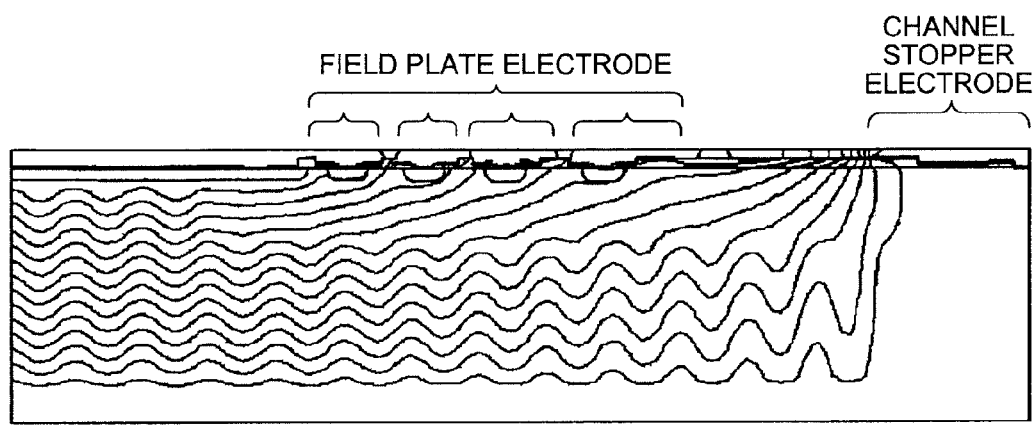
FIG. 20 is a diagram of electric potential distribution in the off-state for the semiconductor apparatus of the fourth embodiment.
Figure 21:
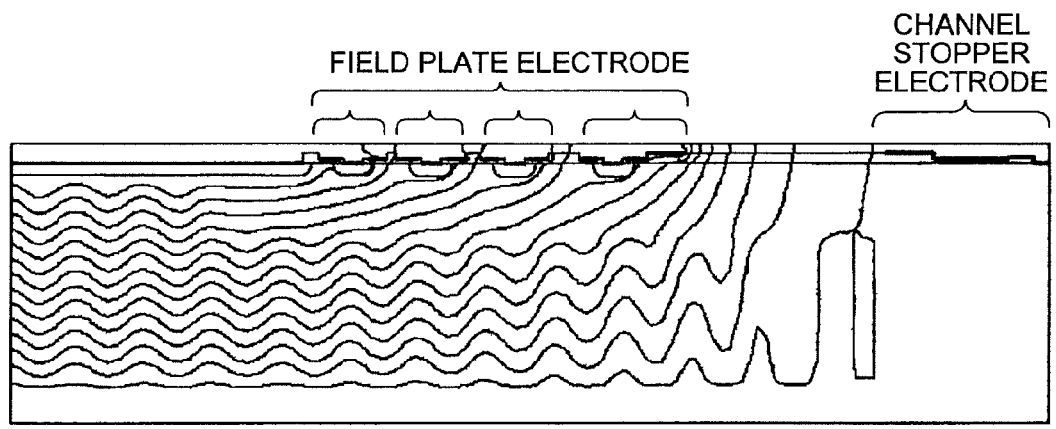
FIG. 21 is a diagram of electric potential distribution in the off-state for the semiconductor apparatus of the fourth embodiment.
Figure 22:
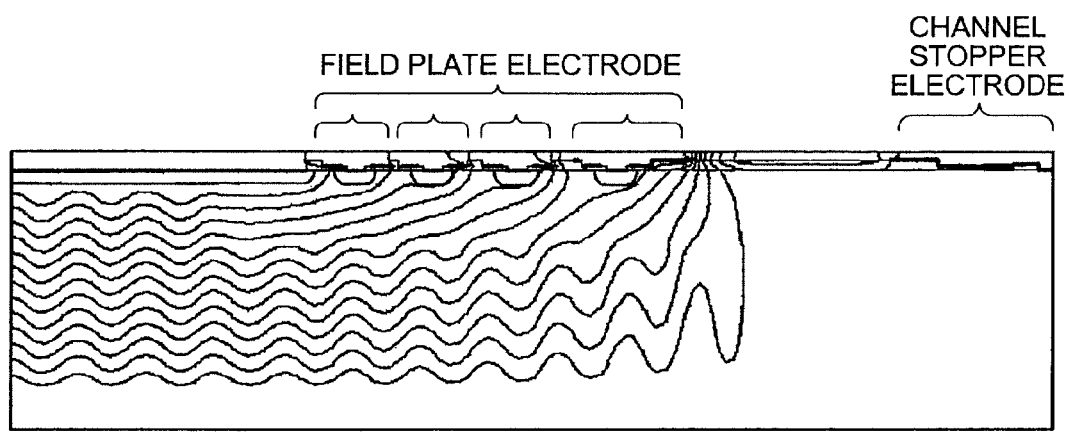
FIG. 22 is a diagram of electric potential distribution in the off-state for the semiconductor apparatus of the fourth embodiment.

FIGS. 20 to 22 depict electric potential distributions in off-state for the semiconductor apparatus of the fourth embodiment. FIG. 20 depicts an electric potential distribution in the case that a surface charge quantity on the oxide film of the peripheral region is $-1.0*10^{12}$ $cm^{-2}$. FIG. 21 depicts an electric potential distribution in the case that the surface charge quantity is 0.0 $cm^{-2}$. FIG. 22 depicts an electric potential distribution in the case that the surface charge quantity is $+1.0*10^{12}$ $cm^{-2}$. These figures reveal that breakdown voltage is maintained mainly between the field plate electrode and the channel stopper electrode when surface charges are negative charges (negative ions), and that breakdown voltage is maintained mainly by the p-guard ring regions and the filed plate electrode when surface charges are positive charges (positive ions). According to the fourth embodiment, effects identical to those of the first embodiment are achieved.

Fifth Embodiment

Figure 23:
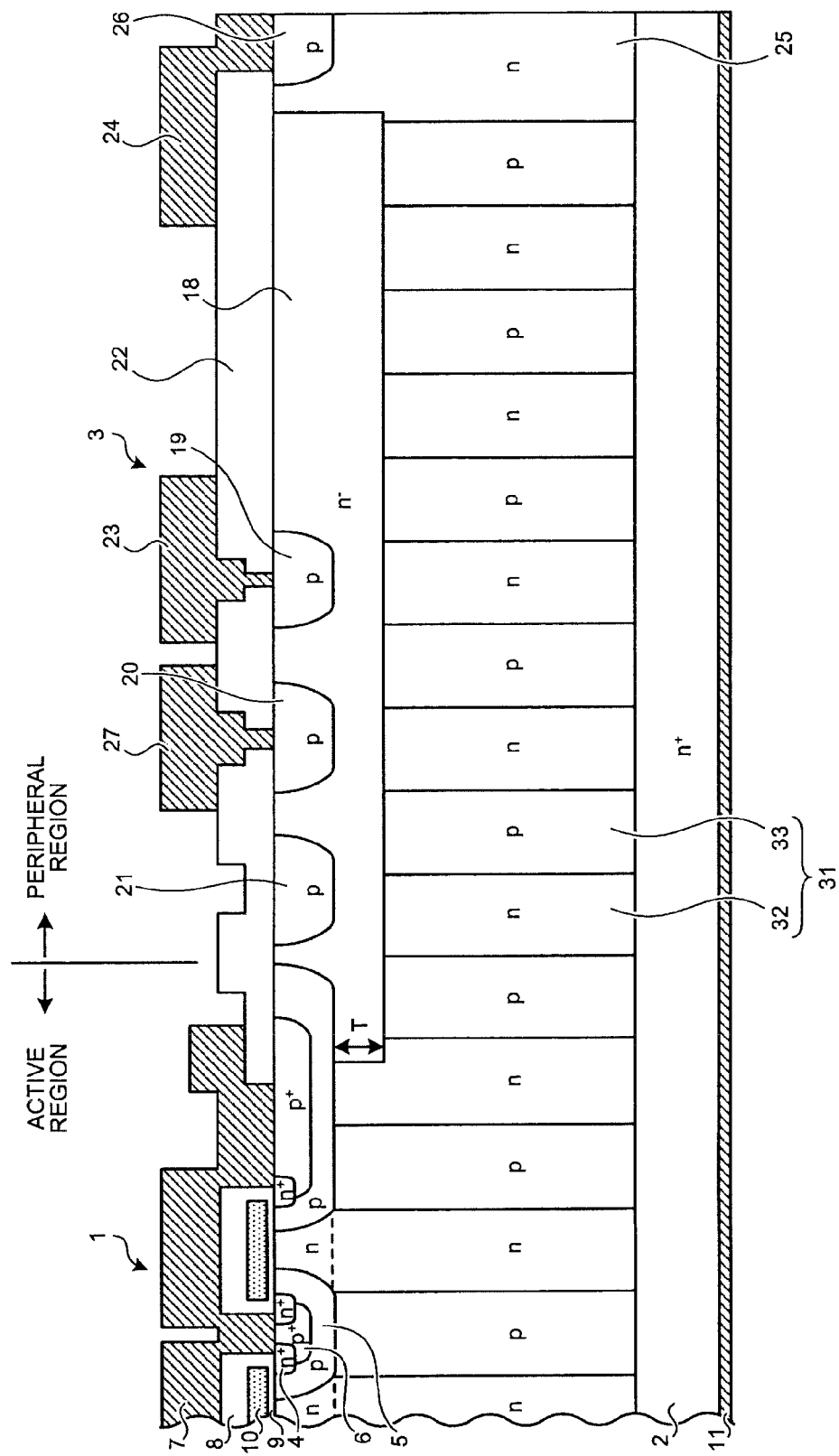
FIG. 23 is a vertical sectional view of a semiconductor apparatus of a fifth embodiment.
Figure 24:
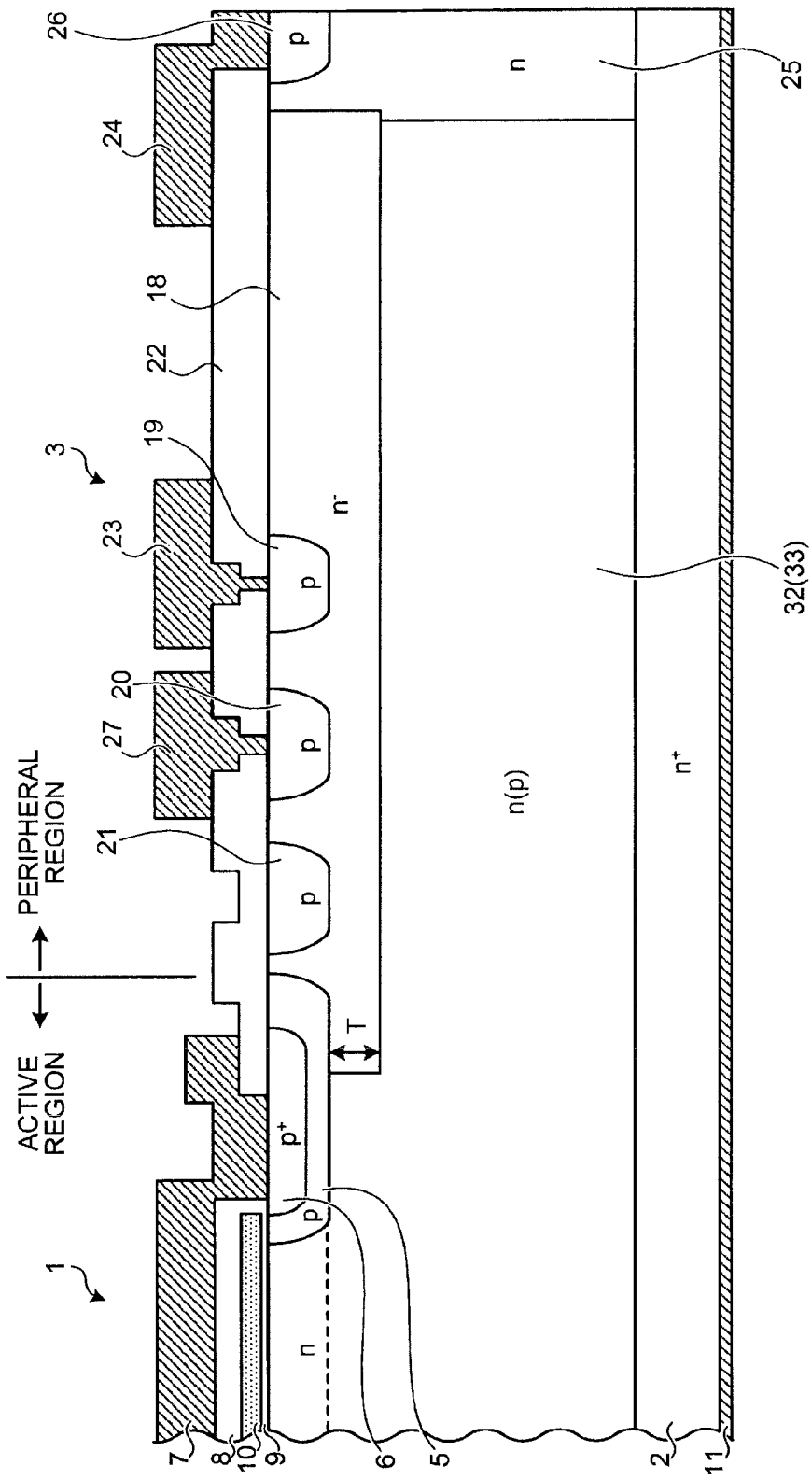
FIG. 24 is a vertical sectional view of the semiconductor apparatus of the fifth embodiment.

FIGS. 23 and 24 are vertical sectional views of a semiconductor apparatus of a fifth embodiment. A top view of the semiconductor apparatus of the fifth embodiment is substantially identical to the top view of FIG. 1. In the top view of the fifth embodiment, a parallel pn-layer 31, n-regions 32, and p-regions 33 are equivalent to the first parallel pn-layer 12, the first n-regions 13, and the first p-regions 14, respectively. FIG. 23 is equivalent to a vertical sectional view along the A-A' line in FIG. 1; and FIG. 24 is equivalent to a vertical sectional view along the B-B' line in FIG. 1. As depicted in FIGS. 23 and 24, the fifth embodiment is different from the fourth embodiment in that the p-guard ring regions 19 and 20 other than the innermost p-guard ring region 21 are connected electrically to the field plate electrodes 23 and 27, respectively. The innermost p-guard ring region 21 is not connected electrically to the-field plate electrode. The field plate electrodes 23 and 27 are independent of each other. The number of the p-guard ring regions may be two or four or more. In other configurative aspects, the fifth embodiment is substantially identical to the fourth embodiment.

The fifth embodiment offers the same effect as the fourth embodiment. Because the p-guard ring regions 19 and 20 are connected electrically to the field plate electrodes 23 and 27, respectively, charges and ions migrating to the peripheral region 3 are collected by the field plate electrodes 23 and 27. As a result, the influence of charges (ions) on breakdown voltage is reduced.

Sixth Embodiment

Figure 25:
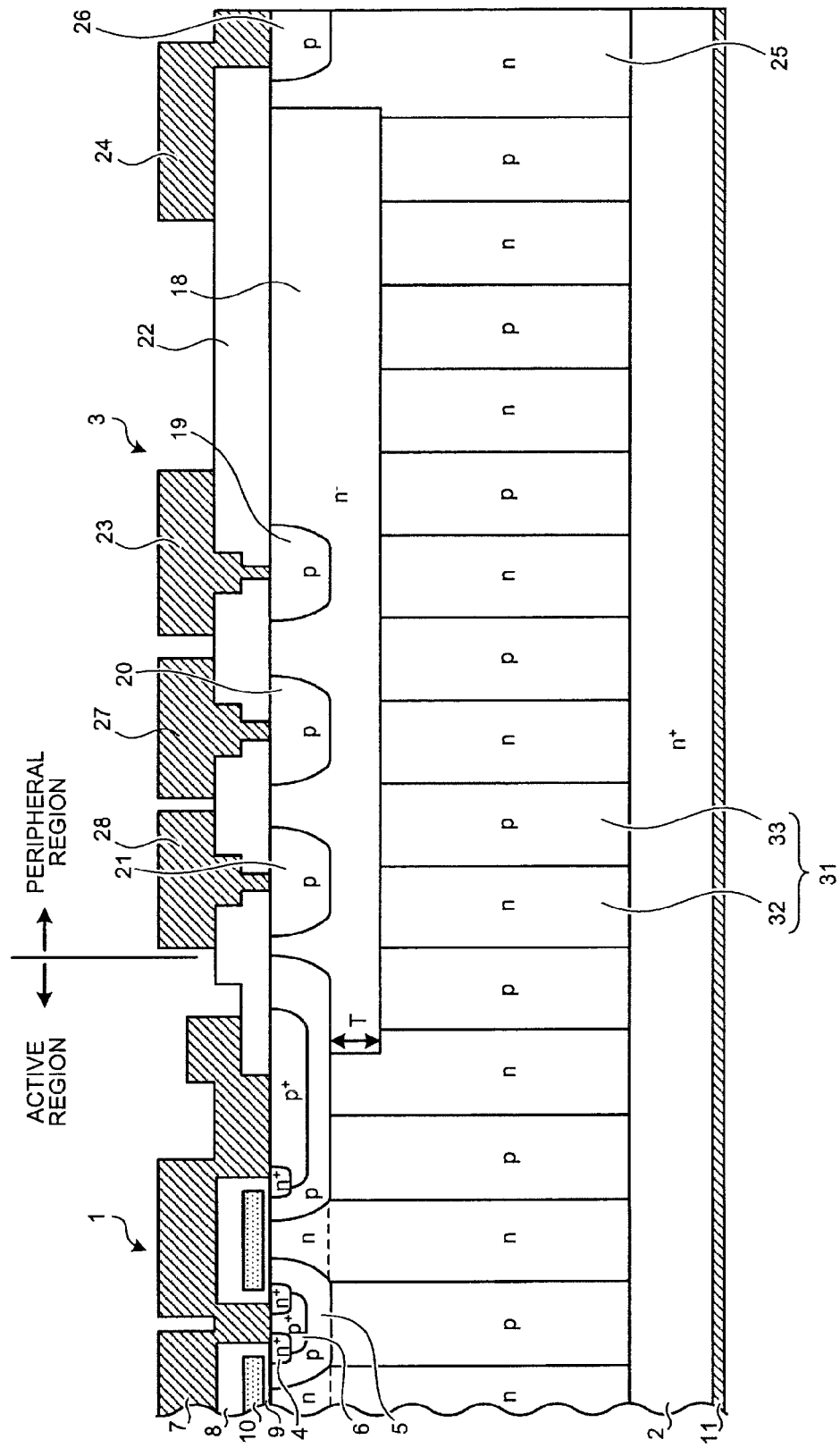
FIG. 25 is a vertical sectional view if a semiconductor apparatus of a sixth embodiment.
Figure 26:
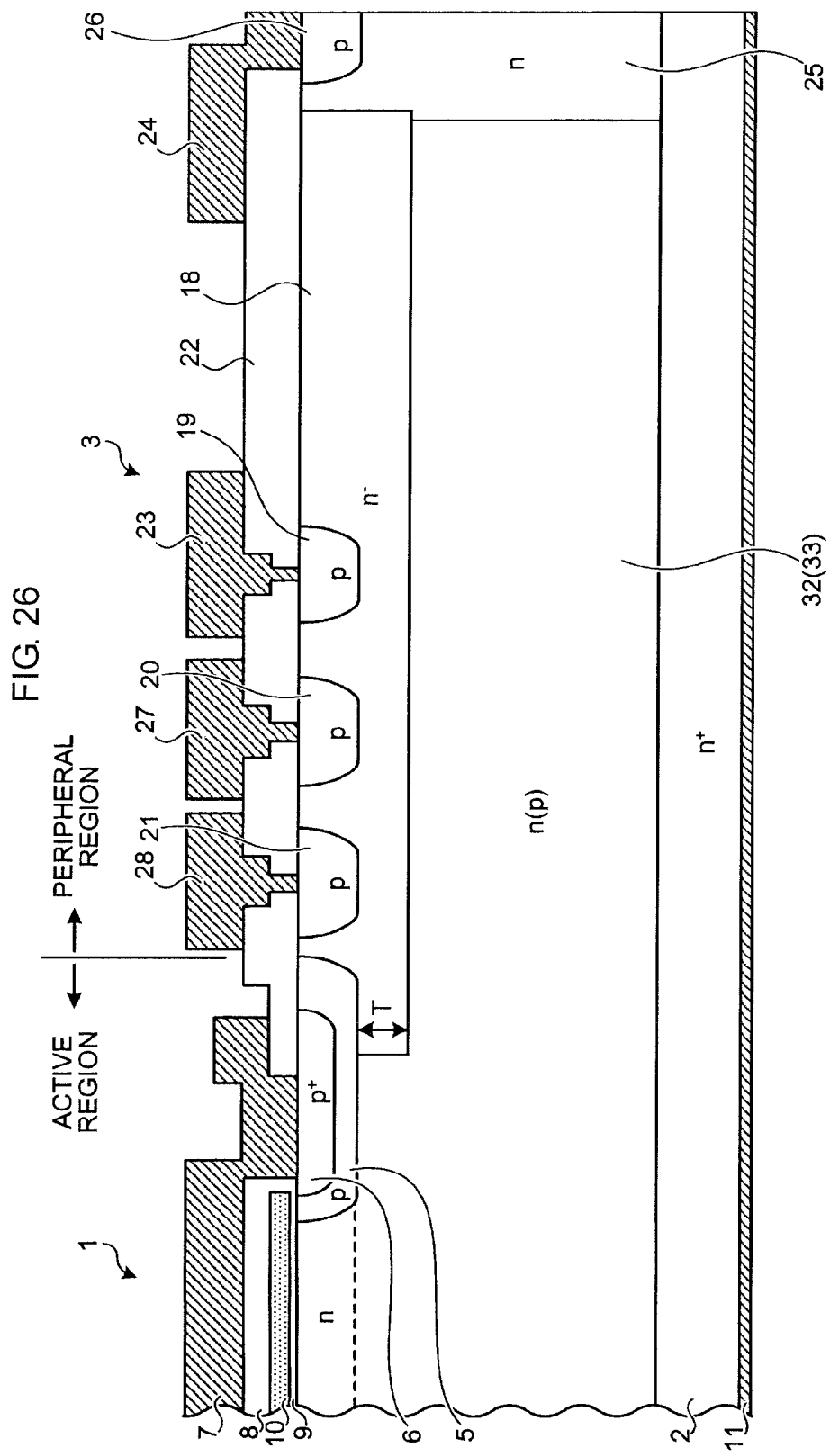
FIG. 26 is a vertical sectional view of the semiconductor apparatus of the sixth embodiment.

FIGS. 25 and 26 are vertical sectional views of a semiconductor apparatus of a sixth embodiment. A top view of the semiconductor apparatus of the sixth embodiment is substantially identical to the top view of FIG. 1. In the top view of the sixth embodiment, a parallel pn-layer 31, n-regions 32, and p-regions 33 are equivalent to the first parallel pn-layer 12, the first n-regions 13, and the first p-regions 14, respectively. FIG. 25 is equivalent to a vertical sectional view along the A-A' line of FIG. 1; and FIG. 26 is equivalent to a vertical sectional view along the B-B' line in FIG. 1. As depicted in FIGS. 25 and 26, the sixth embodiment is different from the fourth embodiment in that all of the p-guard ring regions 19, 20, and 21 are connected electrically to the field plate electrodes 23, 27, and 28. The field plate electrodes 23, 27, and 28 are independent of each other. In other configurative aspects, the sixth embodiment is substantially identical to the fourth embodiment.

The sixth embodiment offers the same effect as the fourth embodiment. Because the p-guard ring regions 19 and 20 are connected electrically to the field plate electrodes 23, 27, and 28, respectively, charges and ions migrating to the peripheral region 3 are collected by the field plate electrodes 23 and 27. As a result, the influence of charges (ions) on breakdown voltage is reduced.

Seventh Embodiment

Figure 27:
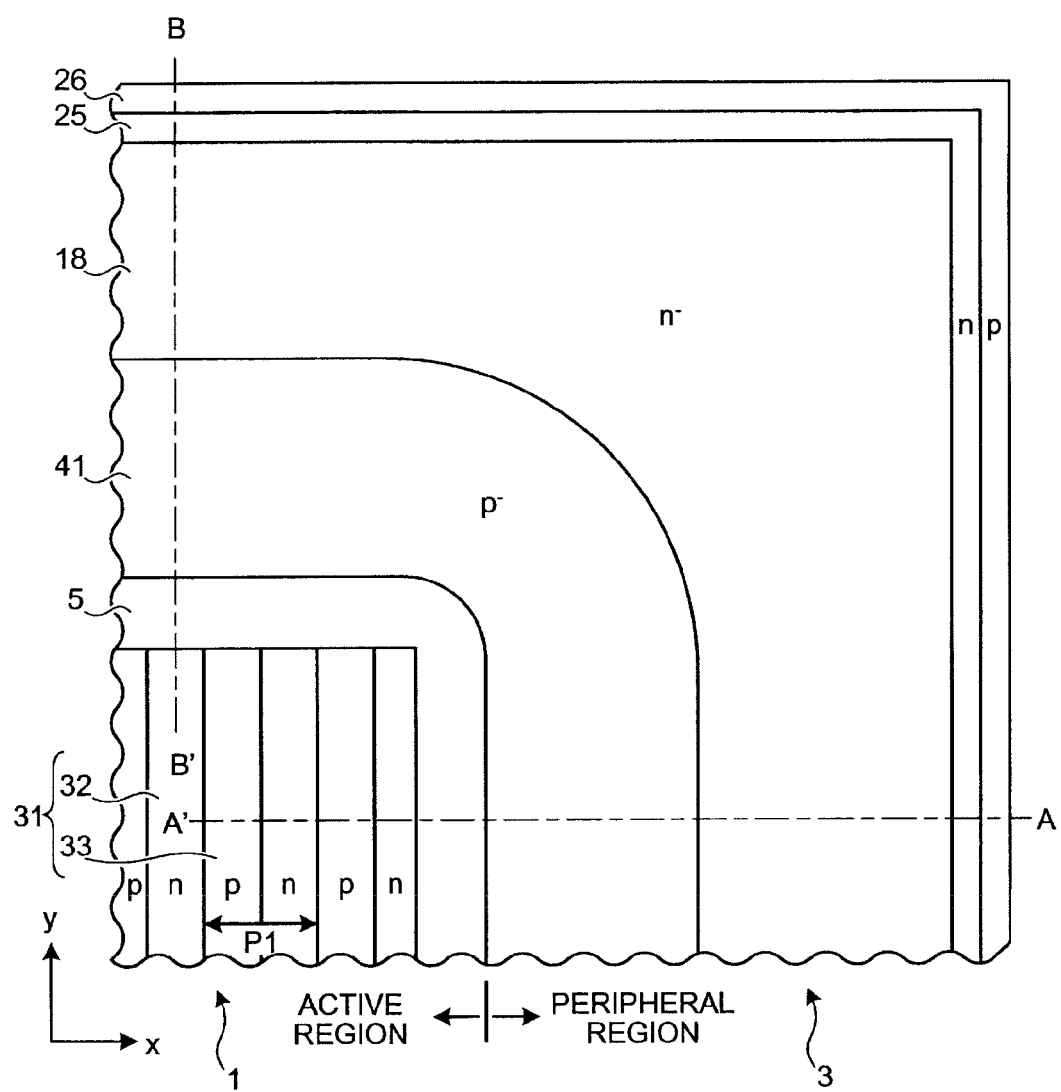
FIG. 27 is a top view of a semiconductor apparatus of a seventh embodiment.
Figure 28:
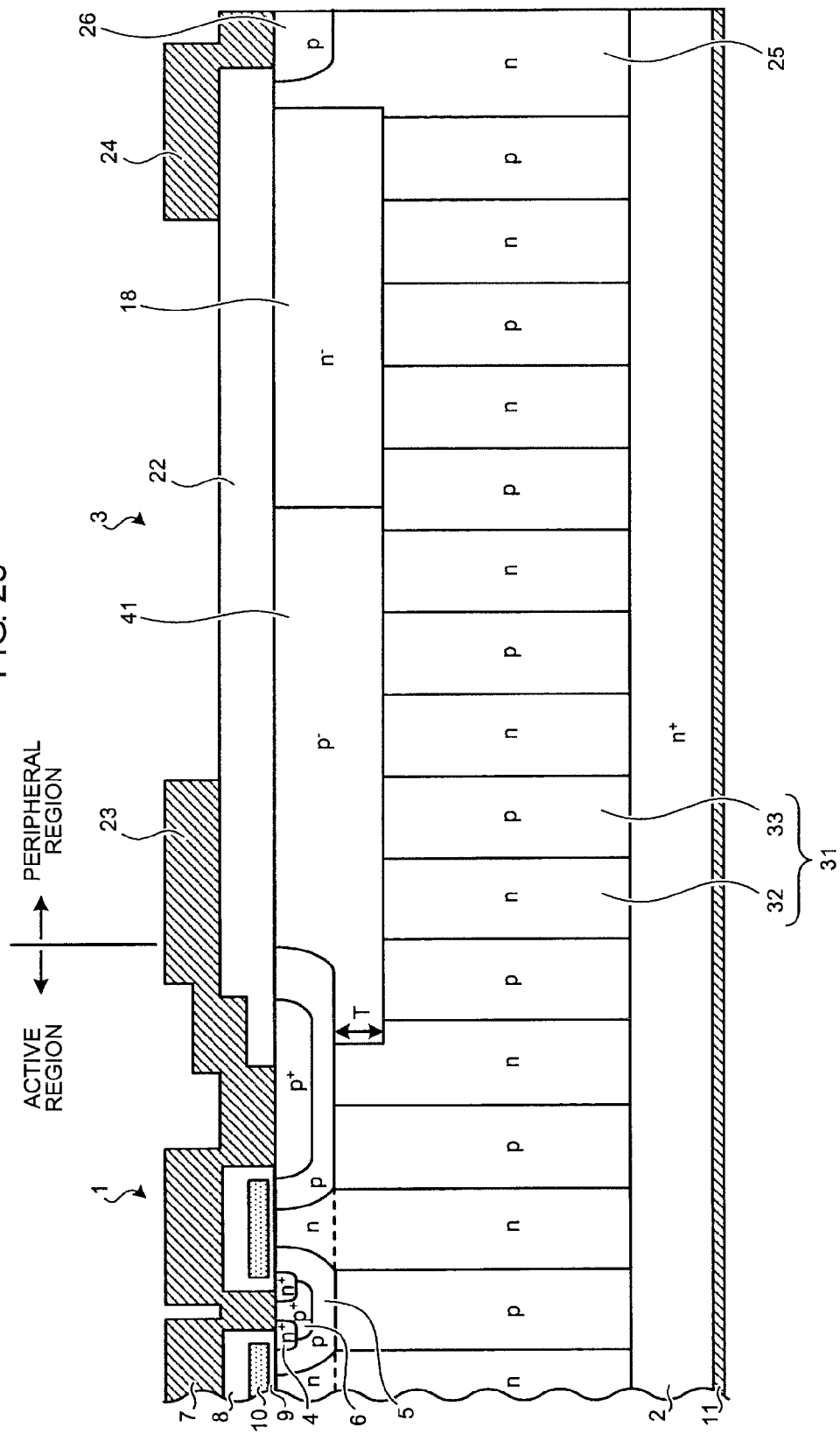
FIG. 28 is a vertical sectional view along an A-A' line in FIG. 27 of the semiconductor apparatus of the seventh embodiment.
Figure 29:
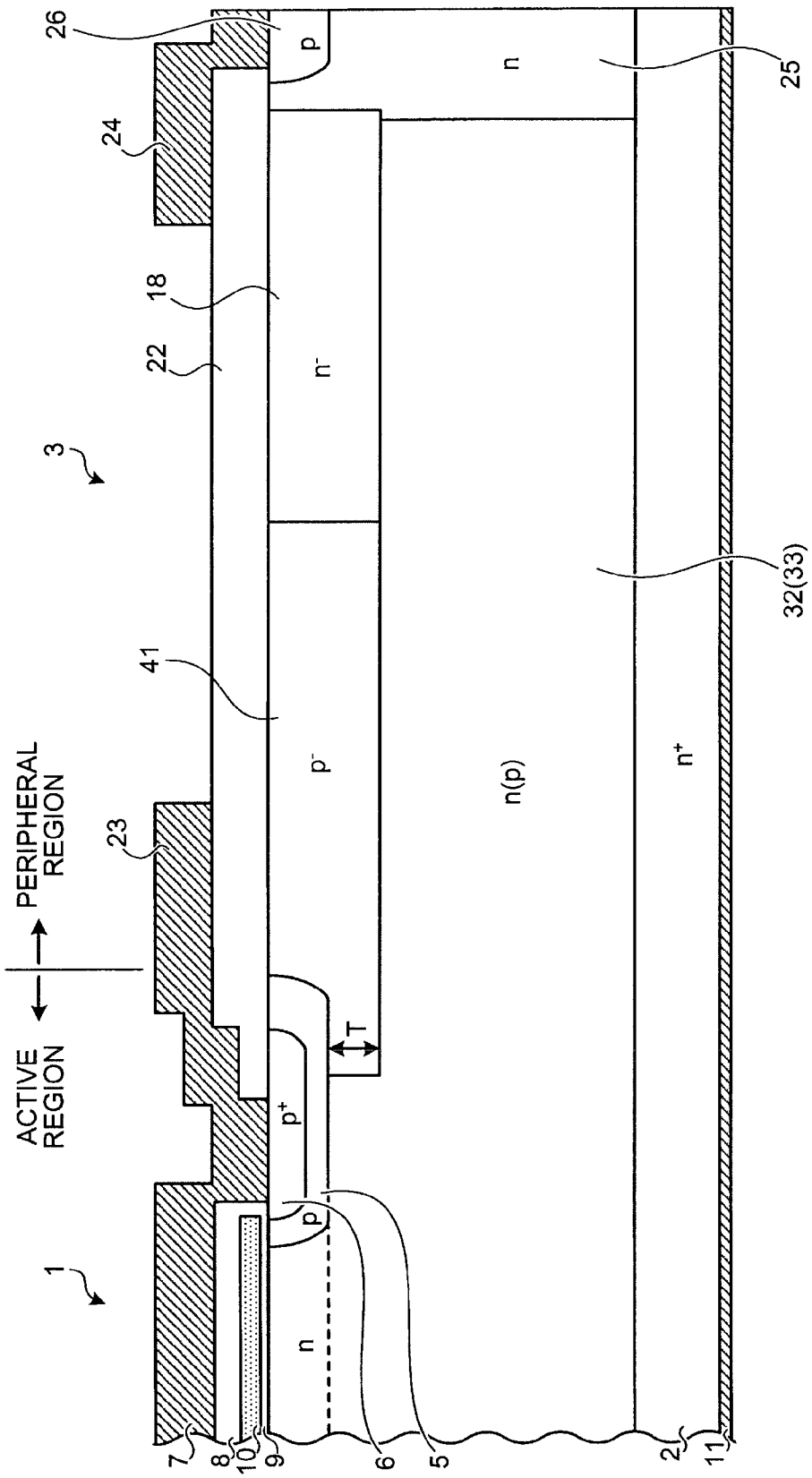
FIG. 29 is a vertical sectional view along a B-B' line in FIG. 27 of the semiconductor apparatus of the seventh embodiment.
Figure 34:
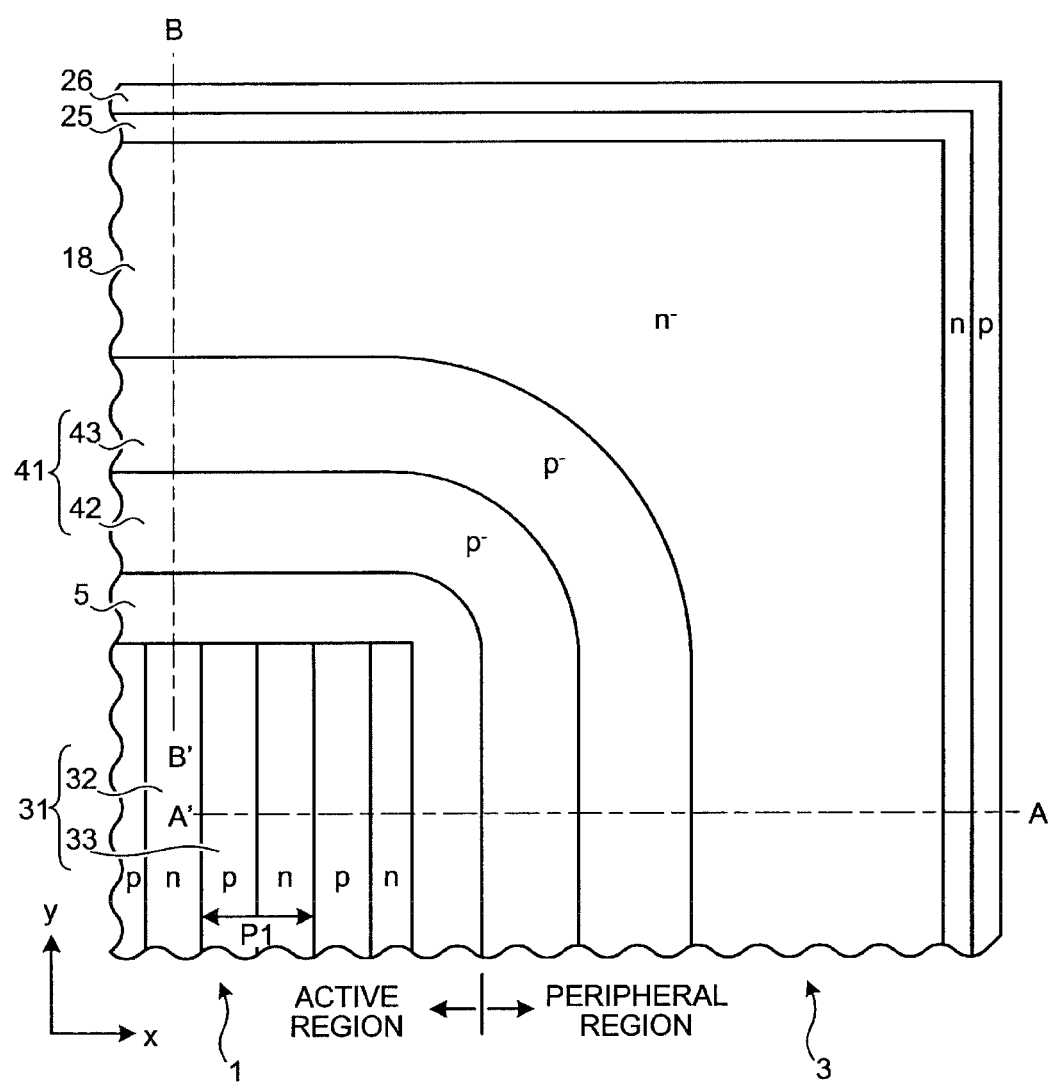
FIG. 34 is a top view of a semiconductor apparatus of an eighth embodiment.

FIG. 27 is a top view of a semiconductor apparatus according to a seventh embodiment. FIG. 28 is a vertical sectional view along an A-A' line in FIG. 27 of the semiconductor apparatus of the seventh embodiment. FIG. 29 is a vertical sectional view along a B-B' line in FIG. 27 of the semiconductor apparatus according to the seventh embodiment. FIG. 27 depicts the shape of the parallel pn-layer, of the n-channel stopper region, of the p-base region at the outermost location of the active region, of the $n^-$-surface region, and of a $p^-$-surface region at the first main surface (FIG. 34 depict the same). As depicted in FIGS. 27 to 29, the seventh embodiment is different from the fourth embodiment in that the $n^-$-surface region 18 and the $p^-$-surface region (fifth region of the second conductivity) 41 are formed between the parallel pn-layer 31 and the first main surface, and that no p-guard ring region is formed in the n⁻-surface region 18.

The p⁻-surface region 41 is joined to the n⁻-surface region 18, and is disposed between the n⁻-surface region 18 and the active region 1. The junction between the n⁻-surface region 18 and the p⁻-surface region 41 is located between the field plate electrode and the channel stopper electrode. The field plate electrode 23 covers a part of p⁻-surface region 41 that is closer to the active region 1 across the insulating film 22. The channel stopper plate 24 covers a part of n⁻-surface region 18 that is closer to the termination across the insulating film 22. The n⁻-surface region 18 has an impurity concentration that is lower than the impurity concentration of the n-regions 32 of the parallel pn-layer 31. The p⁻-surface region 41 has an impurity concentration lower than the impurity concentration of the p-regions 33 of the parallel pn-layer 31.

The thickness of the n⁻-surface region 18 and p⁻-surface region 41, i.e., the thickness T of the junction between the p⁻-surface region 41 and the parallel pn-layer 31 under the active region 1 is one-third or less of the thickness of the parallel pn-layer 31 under the active region 1. The larger the thickness T of the junction between the p⁻-surface region 41 and the parallel pn-layer 31 under the active region 1 is, the smaller the thickness of the parallel pn-layer 31 in the peripheral region 3 is. This leads to a drop in breakdown voltage. If the thickness of the n⁻-surface region 18 is one-third or less of that of the parallel pn-layer 31 under the active region 1, the thickness of the parallel pn-layer 31 in the peripheral region 3 is large, which suppresses a drop in breakdown voltage. It is desirable, therefore, that the thickness T of the n⁻-surface region 18 and p⁻-surface region 41 be one-third or less of that of the parallel pn-layer 31 under the active region 1. In other configurative aspects, the seventh embodiment is substantially identical to the fourth embodiment.

Although not particularly limited hereto, for example, the semiconductor apparatus of the seventh embodiment is a vertical 600V MOSFET, the dimensions and impurity concentration of the constituent elements are as follows. The thickness of the drift region (thickness of the parallel pn-layer 31 in the active region 1) is 44.0 micrometers, the width of the n-region 32 and of the p-region 33 is 7.0 micrometers (with the repetition pitch P1 of 14.0 micrometers), and the impurity concentration of the n-region 32 and of the p-region 33 is $3.0*10^{15}$ cm⁻³. The impurity concentration of the p-surface region 41 is $2.0*10^{15}$ cm⁻³. The impurity concentration of the n⁻-surface region 18 is $2.0*10^{14}$ cm⁻³. The diffusion depth of the p-base region 5 is 3.0 micrometers, and the surface impurity concentration of the same is $3.0*10^{17}$ cm⁻³. The diffusion depth of the n⁺-source region 4 is 1.0 micrometers, and the surface impurity concentration of the same is $3.0*10^{20}$ cm⁻³. The diffusion depth of the surface n-drift region (n-region above a broken line between p-base regions 5 in FIGS. 28 and 29) is 2.5 micrometers, and the surface impurity concentration of the same is $2.0*10^{16}$ cm⁻³. The thickness of the n⁺-drain region 2 is 300 micrometers, and the impurity concentration of the same is $2.0*10^{18}$ cm⁻³. The width of the n-channel stopper region 25 is 30.0 micrometers, and the impurity concentration of the same is $6.0*10^{15}$ cm⁻³. The impurity concentration of the outermost peripheral p-region 26 is $3.0*10^{17}$ cm³.

Figure 30:
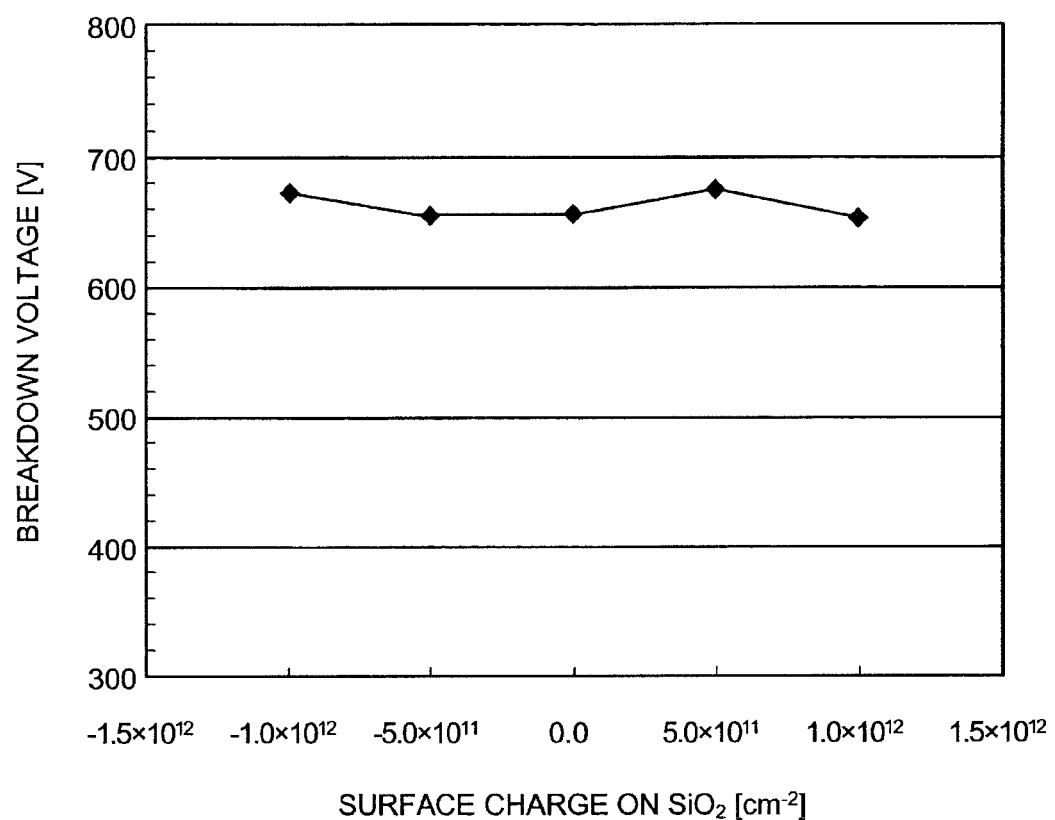
FIG. 30 is a diagram of the simulation results of surface charge dependency on breakdown voltage in the semiconductor apparatus of the seventh embodiment.

FIG. 30 is a diagram of the simulation results of surface charge dependency on breakdown voltage in the semiconductor apparatus of the seventh embodiment. As depicted in FIG. 30, breakdown voltage hardly fluctuates even if positive charges (positive ions) or negative charges (negative ions) are present on the oxide film of the peripheral region. This demonstrates that high breakdown voltage is achieved and the robustness against charges on breakdown voltage is improved in the seventh embodiment.

Figure 31:
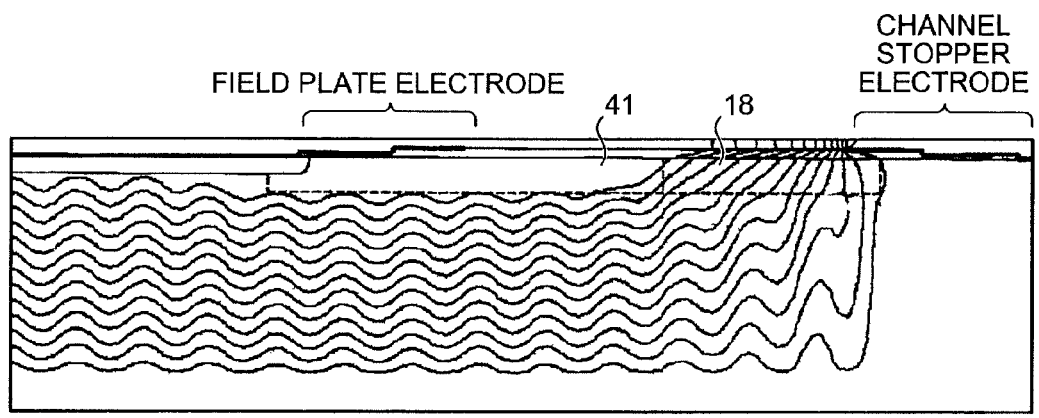
FIG. 31 is a diagram of electric potential distribution in the off-state for the semiconductor apparatus of the seventh embodiment.
Figure 32:
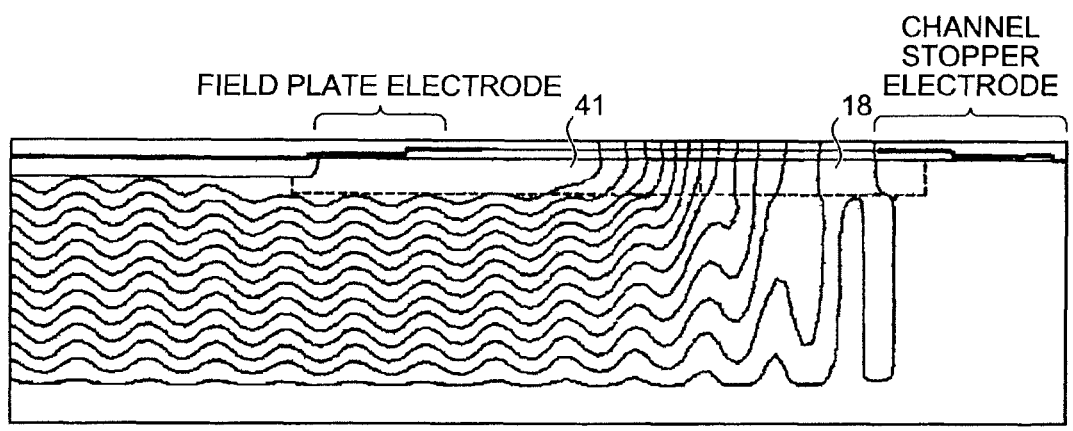
FIG. 32 is a diagram of electric potential distribution in the off-state for the semiconductor apparatus of the seventh embodiment.
Figure 33:
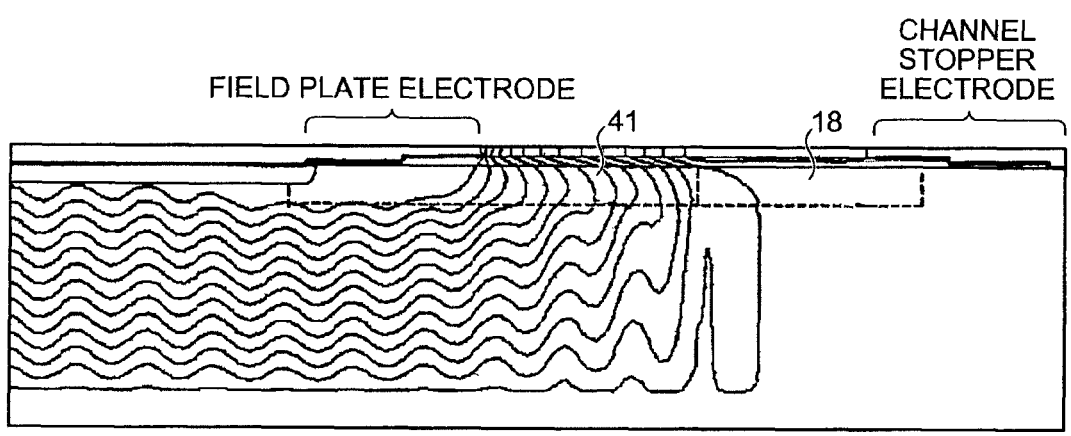
FIG. 33 is a diagram of electric potential distribution in the off-state for the semiconductor apparatus of the seventh embodiment.

FIGS. 31 to 33 depict electrical potential distributions in off-state for the semiconductor apparatus of the seventh embodiment. FIG. 31 depicts an electric potential distribution in the case that a surface charge quantity on the oxide film of the peripheral region is $-1.0*10^{12}$ cm⁻². FIG. 32 depicts an electric potential distribution in the case that the surface charge quantity is 0.0 cm⁻². FIG. 33 depicts an electric potential distribution in the case that the surface charge quantity is $+1.0*10^{12}$ cm⁻². These figures reveal that breakdown voltage is maintained mainly in the p⁻-surface region 41 between the field plate electrode and the channel stopper electrode when surface charges are positive charges (positive ions), and that breakdown voltage is maintained mainly in the n⁻-surface region 18 between the field plate electrode and the channel stopper electrode when surface charges are negative charges (negative ions).

According to the seventh embodiment, when positive charges (positive ions) are present on the oxide film of the peripheral region, the p⁻-surface region 41 is depleted of carriers to relax a surface electric field. As a result, breakdown voltage is maintained. When negative charges (negative ions) are present on the oxide film of the peripheral region, the n⁻-surface region 18 is depleted of carriers. As a result, breakdown voltage is maintained. A drop in breakdown voltage, therefore, can be suppressed even if positive charges (positive ions) or negative charges (negative ions) are present on the oxide film of the peripheral region. Hence, the robustness against charges on breakdown voltage is improved. If the impurity concentration of the n⁻-surface region 18 is lower than that of the n-regions 32 of the parallel pn-layer 31, the n⁻-surface region 18 is easily depleted of carriers. This facilitates securing initial breakdown voltage. If the impurity concentration of the p⁻-surface region 41 is lower than that of the n-regions 33 of the parallel pn-layer 31, the p⁻-surface region 41 is easily depleted of carries. This facilitates securing initial breakdown voltage.

Eighth Embodiment

Figure 35:
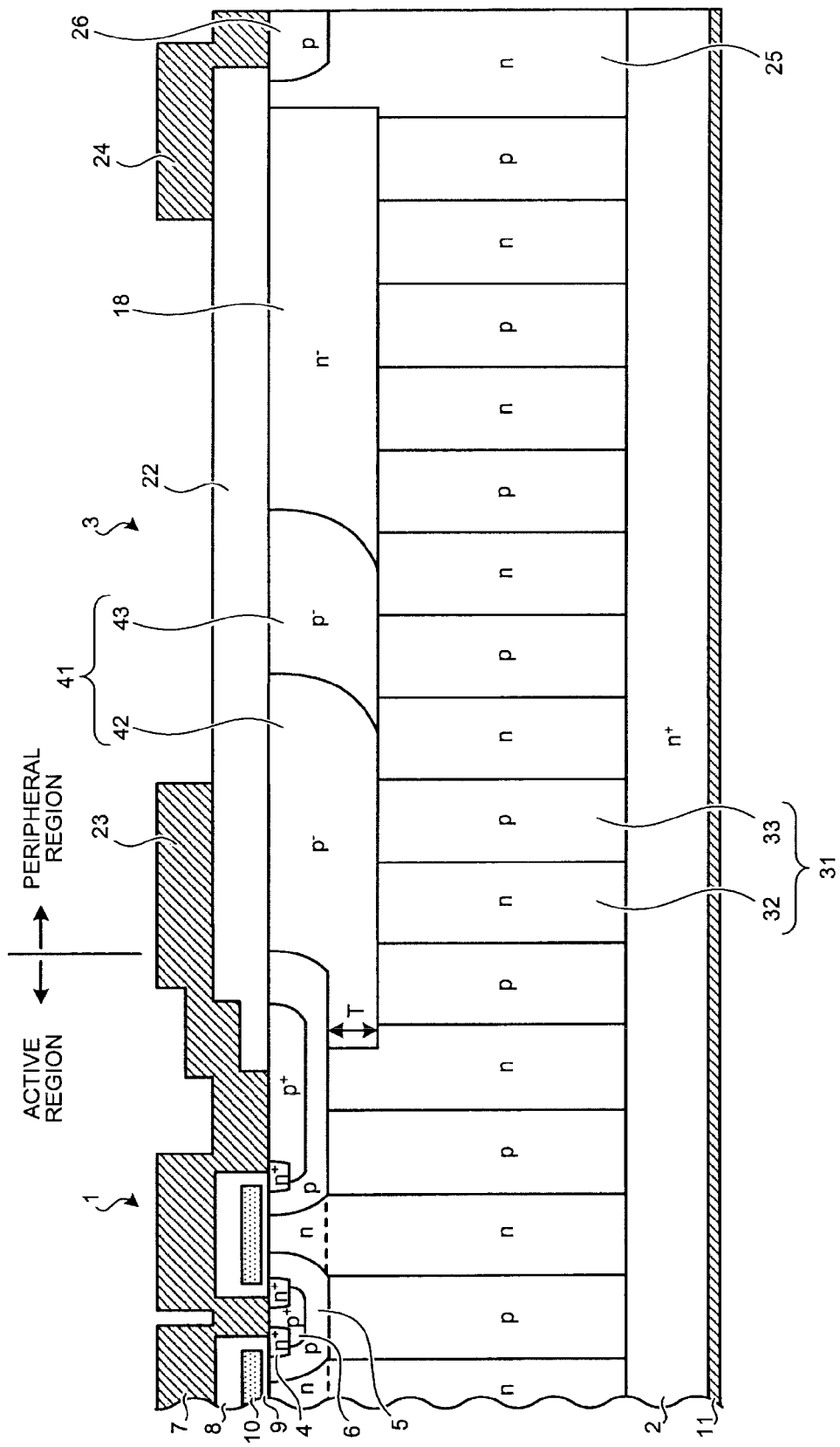
FIG. 35 is a vertical sectional view along an A-A' line in FIG. 34 of the semiconductor apparatus of the eight embodiment.
Figure 36:
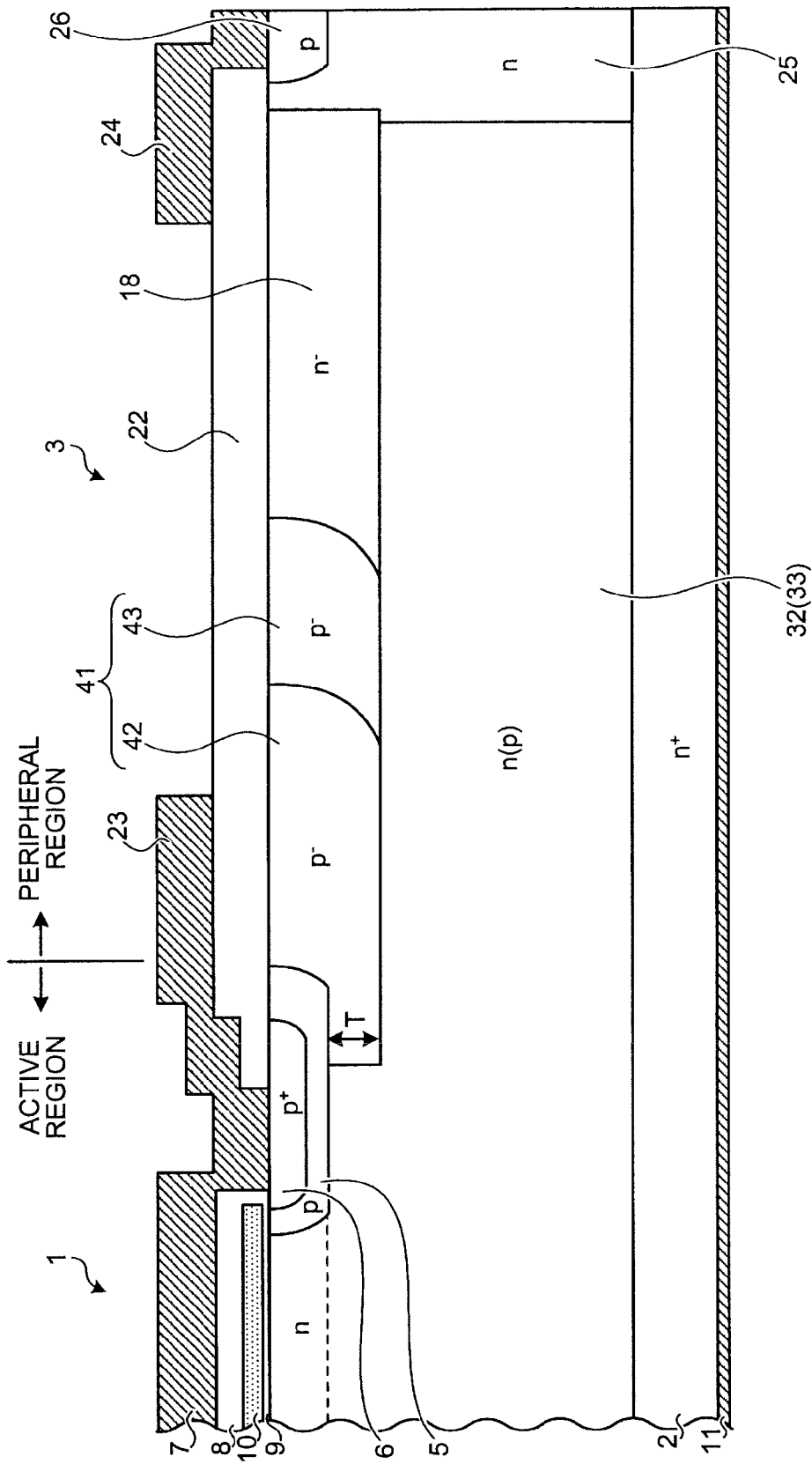
FIG. 36 is a vertical sectional view along a B-B' line in FIG. 34 of the semiconductor apparatus of the eighth embodiment.

FIG. 34 is a top view of a semiconductor apparatus of an eighth embodiment. FIG. 35 is a vertical sectional view along an A-A' line in FIG. 34 of the semiconductor apparatus according to the eight embodiment. FIG. 36 is a vertical sectional view along a B-B' line in FIG. 34 of the semiconductor apparatus according to the eighth embodiment. As depicted in FIGS. 34 to 36, the eighth embodiment is different from the seventh embodiment in that the p⁻-surface region 41 includes plural sub-regions 42 and 43 different from each other in impurity concentration. The impurity concentration of the sub-regions 42 and 43 included in the p⁻-surface region 41 may decrease as the sub-regions approach the termination of the peripheral region 3 from the active region 1. In other words, the p⁻-surface region 41 may have an impurity concentration gradient that decreases as the p⁻-surface region 41 approaches the termination of the peripheral region 3 from the active region 1. For example, among the sub-regions 42 and 43 included in the p⁻-surface region 41, the p⁻-surface sub-region 42 closer to the active region 1 may have an impurity concentration of $2.0*10^{15}$ cm⁻³, and the p⁻-surface sub-region 43 closer to the termination of the peripheral region 3 may have an impurity concentration of $1.0*10^{15}$ cm$^{-3}$. The p$^-$-surface region 41 may have three or more sub-regions different in impurity concentration from each other. The impurity concentration of the p$^-$-surface region 41 may decrease continuously from its end closer to the active region 1 to its end closer to the termination of the peripheral region 3. In other configurative aspects, the eighth embodiment is substantially identical to the fourth embodiment.

The eighth embodiment offers the same effect as the seventh embodiment. Because the impurity concentration of the p$^-$-surface region 41 has the gradient, expansion of the depletion layer toward the outer periphery can be controlled according to the quantity of positive charges (positive ions) when positive charges (positive ions) are present on the oxide film of the peripheral region. In other words, an electric field distribution in the p$^-$-surface region 41 can be controlled. Hence the fluctuation of breakdown voltage caused by positive charges is suppressed.

Ninth Embodiment

Figure 37:
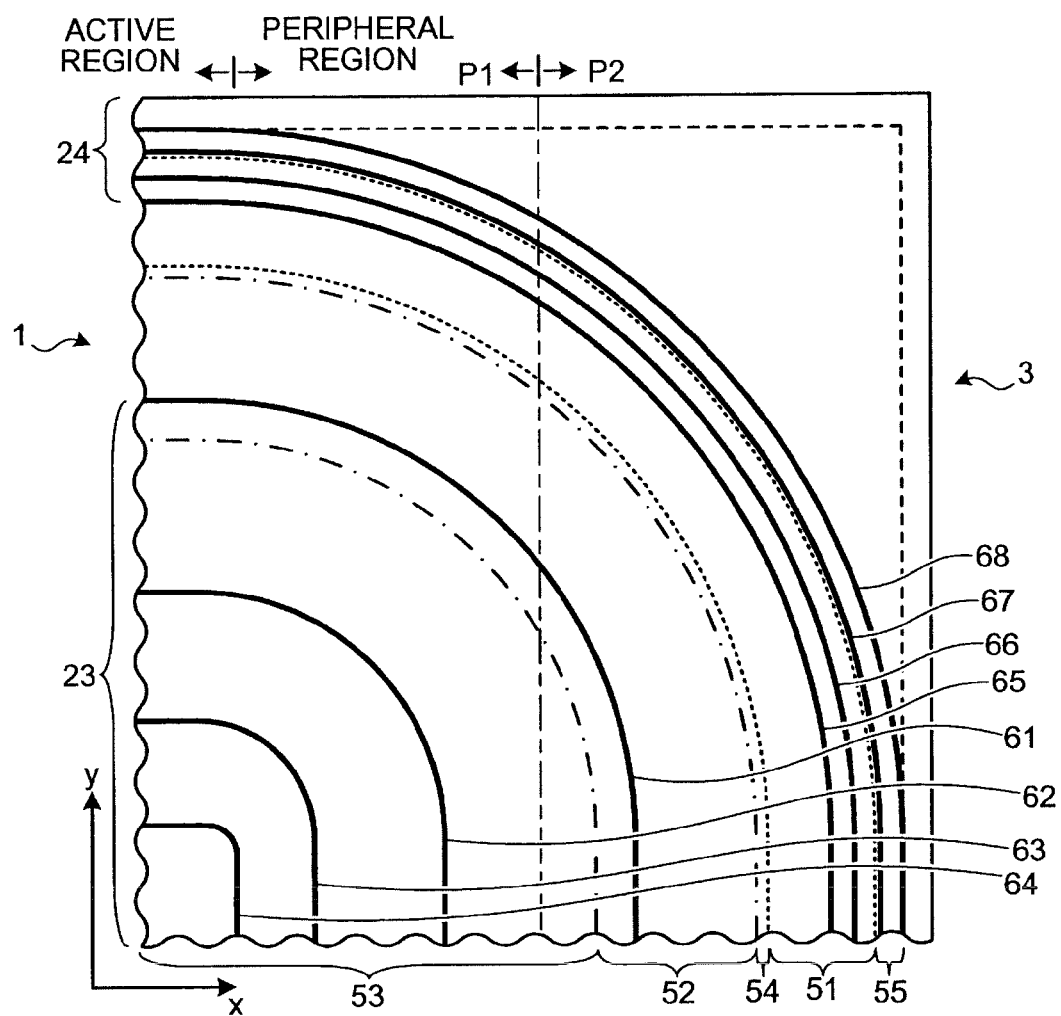
FIG. 37 is a top view of a semiconductor apparatus of a ninth embodiment.
Figure 38:
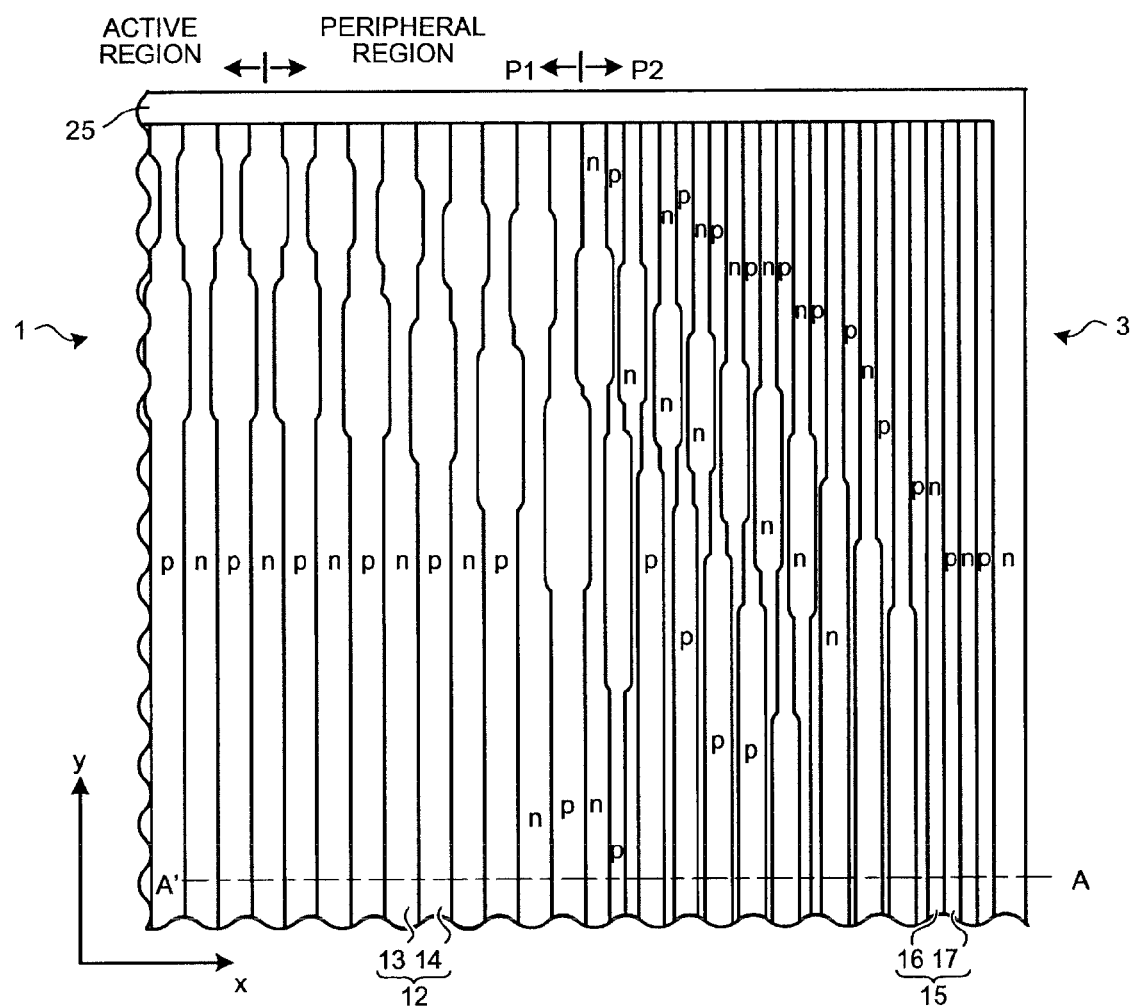
FIG. 38 is horizontal sectional view of the parallel pn-layer of the semiconductor apparatus of the ninth embodiment.
Figure 39:
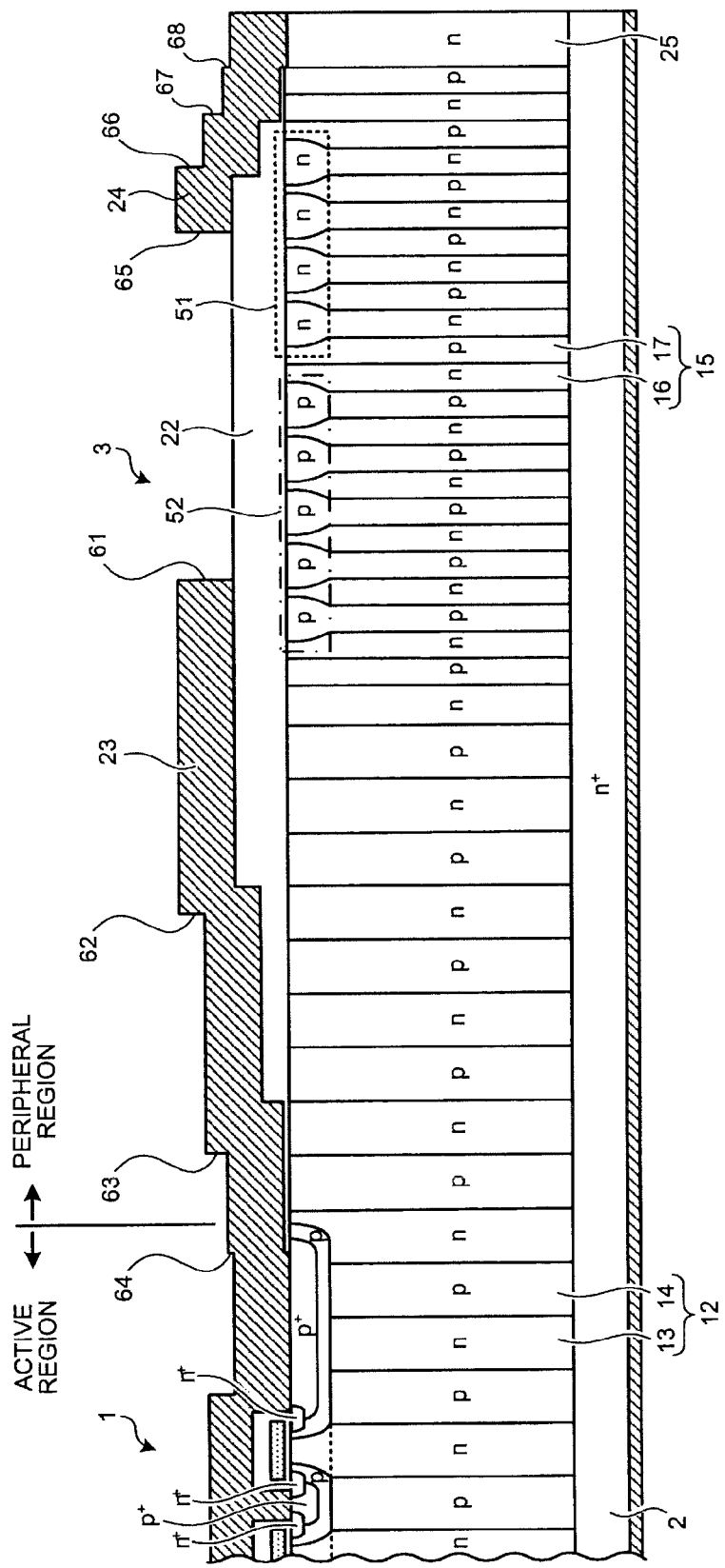
FIG. 39 is a vertical sectional view along an A-A' line of FIG. 38 of the semiconductor apparatus of the ninth embodiment.
Figure 43:
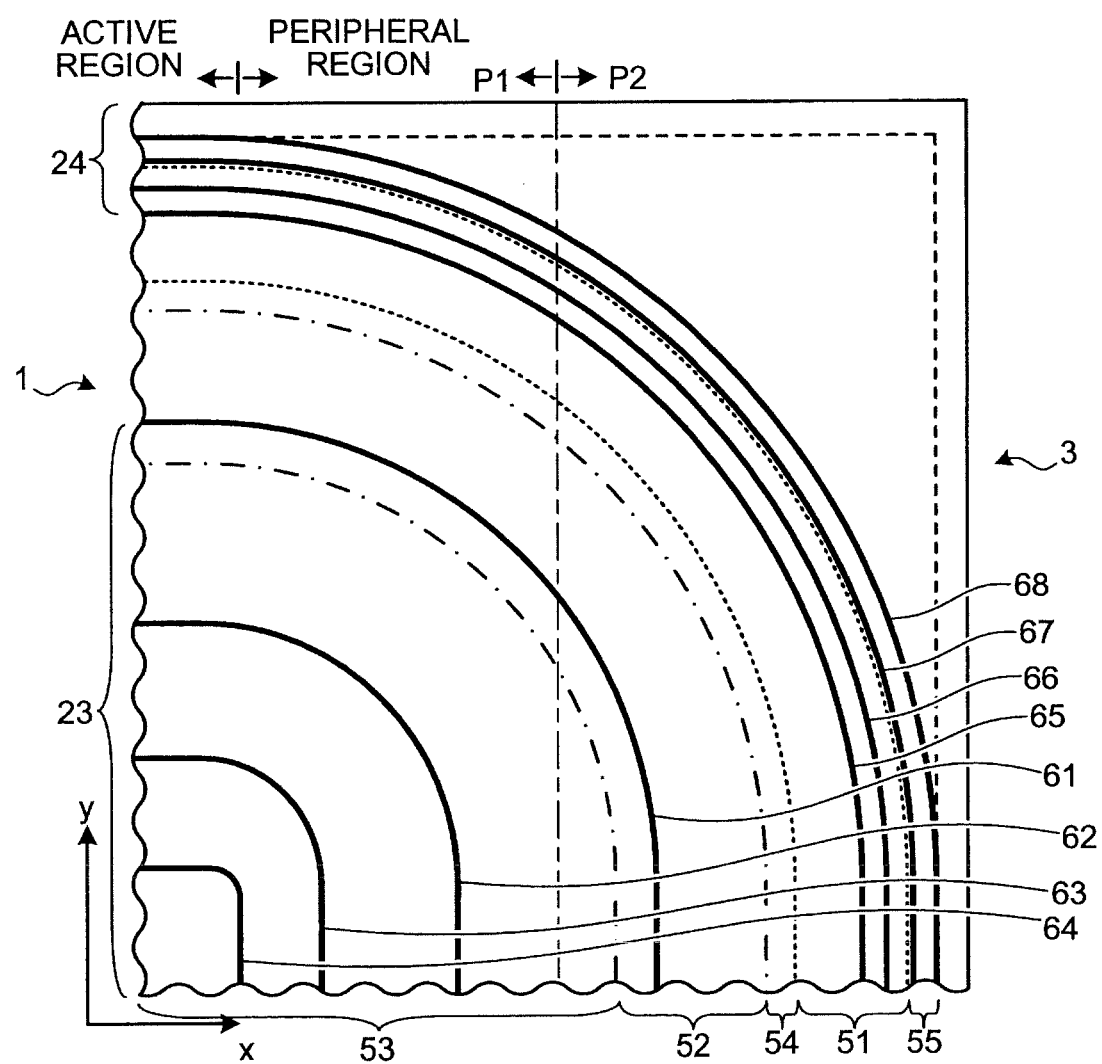
FIG. 43 is a top view of a semiconductor apparatus of an eleventh embodiment.
Figure 44:
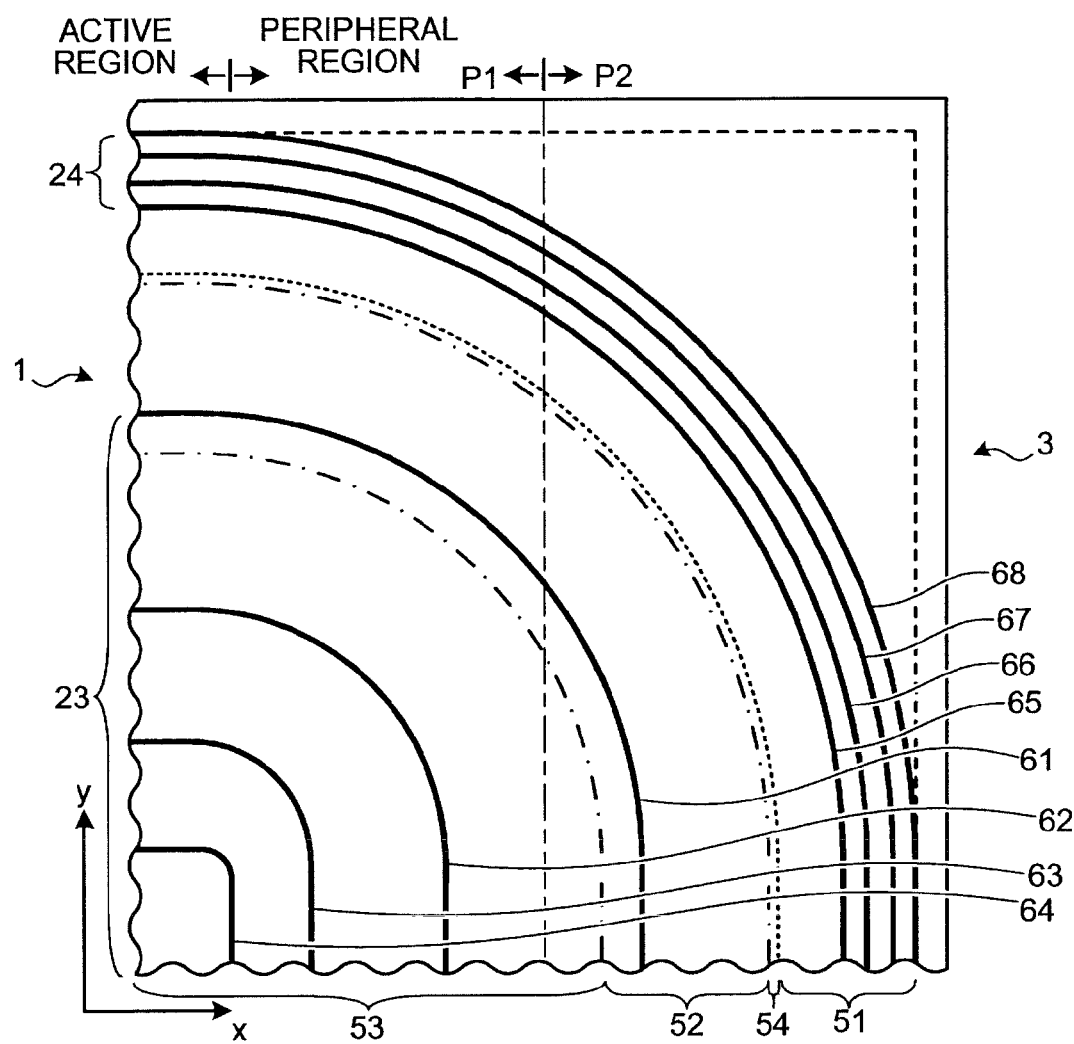
FIG. 44 is a top view of a semiconductor apparatus of a twelfth embodiment.
Figure 45:
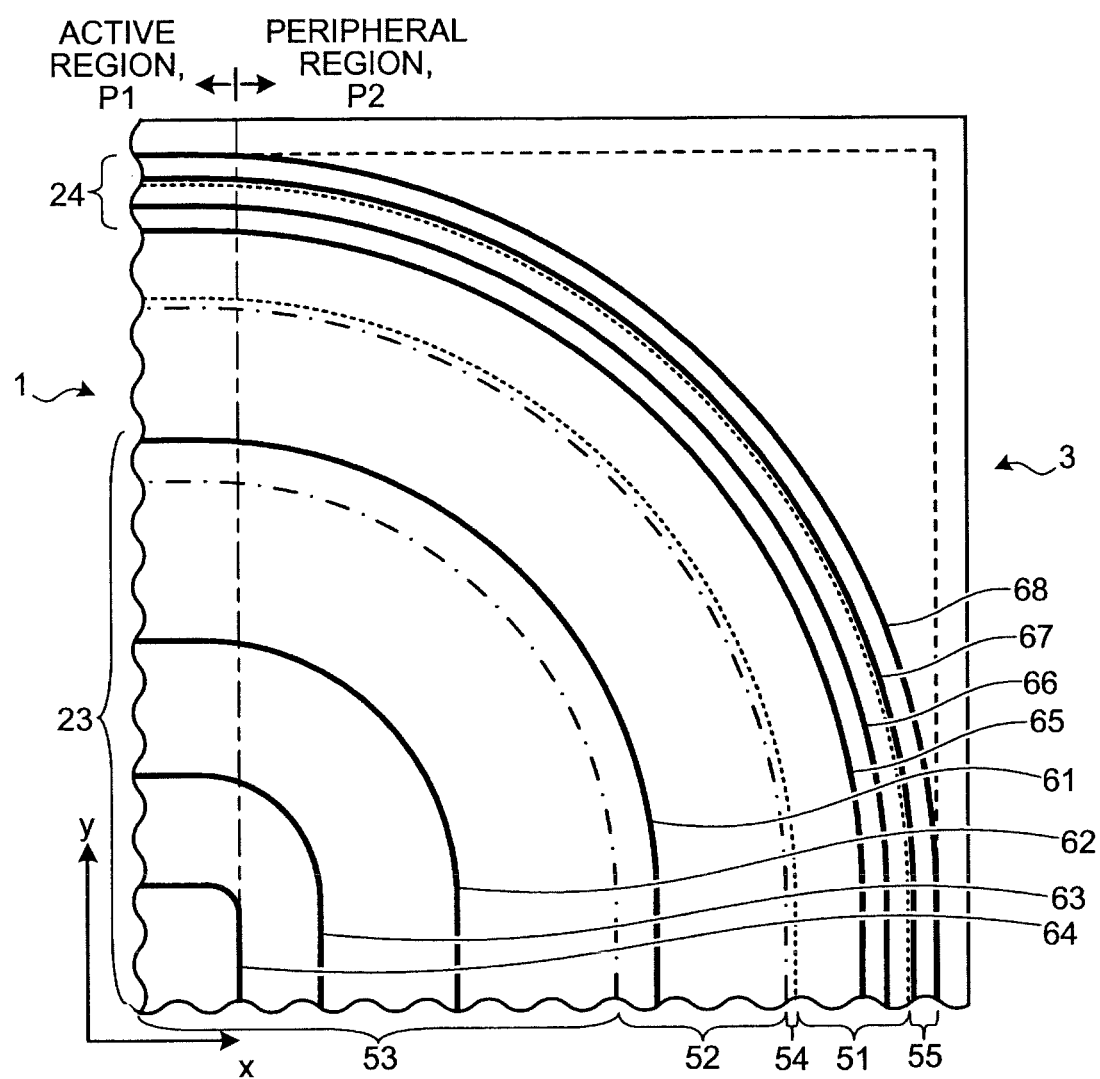
FIG. 45 is a top view of a semiconductor apparatus of a thirteenth embodiment.

FIG. 37 is a top view of a semiconductor apparatus of a ninth embodiment. FIG. 38 is a horizontal cross sectional view of the parallel pn-layer of the semiconductor apparatus of the ninth embodiment. FIG. 39 is a vertical sectional view along an A-A' line of FIG. 38 of the semiconductor apparatus of the ninth embodiment. FIG. 37 depicts the field plate electrode, the channel stopper electrode, an N-rich region (region serving substantially as the n-region) in the peripheral region, and a P-rich region (region serving substantially as the p-region) in the peripheral region (FIGS. 43 to 45 depict the same). FIG. 38 depicts the shape of the parallel pn-layer and of the n-channel stopper region at the first main surface. In the ninth embodiment, as depicted in FIGS. 37 to 39, the n$^-$-surface region and the p$^-$-surface region of the seventh embodiment are replaced with an N-rich region 51 and a P-rich region 52, respectively. The first parallel pn-layer 12 having the repetition pitch P1 is disposed to extend through the active region 1 to further stretch up to the middle of the uppermost step of the field plate electrode 23 (the closest step to the termination of the peripheral region 3). The second parallel pn-layer 15 having the repetition pitch P2 is disposed to extend from the middle of the uppermost step of the field plate electrode 23 up to the termination of the peripheral region 3. The repetition pitch P2 is narrower than the repetition pitch P1.

The region in which the first parallel pn-layer 12 is disposed mostly serves as a charge balance region 53. Adjacent to this charge balance region 53, the P-rich region 52 is disposed. The region between the P-rich region 52 and the N-rich region 51 mostly serves as a charge balance region 54. The region between the N-rich region 51 and the n-channel stopper region 25 mostly serves as a charge balance region 55. In FIGS. 37 to 39, reference numeral 61 denotes the termination of field plate electrode 23 that is closer to the channel stopper electrode 24, and reference numerals 62, 63, and 64 denote the level differences of the field plate electrode 23. Reference numeral 65 denotes the termination of the channel stopper electrode 24 that is closer to the field plate electrode 23, and reference numerals 66, 67, and 68 denote the level differences of the channel stopper electrode 24. The N-rich region 51 extends from a location between the channel stopper electrode 24 and the field plate electrode 23 to a location under the channel stopper electrode 24. The P-rich region 52 extends from a location between the channel stopper electrode 24 and the field plate electrode 23 to, for example, a location under the middle of the uppermost step of the filed plate electrode 23.

In the N-rich region 51, the width of each second n-region 16 is larger than that of each second p-region 17 at the first main surface side of the second parallel pn-layer 15. As a result, the N-rich region 51 serves substantially as an n-region. In the N-rich region 51, the width of the second n-region 16 is kept constant and the same of the second p-region 17 is also kept constant. In the p-rich region 52, the width of each second p-region 17 is larger than that of each second n-region 16 at the first main surface side of the second parallel pn-layer 15. As a result, the P-rich region 52 serves substantially as a p-region. In the P-rich region 52, the width of the second n-region 16 is kept constant and the same of the second p-region 17 is also kept constant. When the repetition pitch of the second parallel pn-layer 15 is constant, increasing the width of the second n-region 16 results in a decrease in the width of the second p-region 17 in the decrement corresponding to the increment, while increasing the width of the second p-region 17 results in a decrease in the width of the second n-region 16 in the decrement corresponding to the increment. When the repetition pitch of the second parallel pn-layer 15 is constant and the width of the second n-region 16 and the same of the second p-region 17 is constant in the N-rich region 51 and in the p-rich region 52, the ratio of the second p-regions 17 to the second n-regions 16 is constant in the N-rich region 51 and in the p-rich region 52.

The N-rich region 51 and the P-rich region 52 are formed in the following manner. For example, a process of epitaxial growth on a substrate, a process of injecting n-impurity ions into the entire epitaxial layer surface, and a process of selectively injecting p-impurity ions into the epitaxial layer are repeated. At the final process of p-impurity injection, ion injection is carried out using a mask that has a pattern with a narrow opening as a portion to be formed into the N-rich region 51 and a wide opening as a portion to be formed into the P-rich region 52. The injected impurity is diffused by thermal budget.

Figure 40:
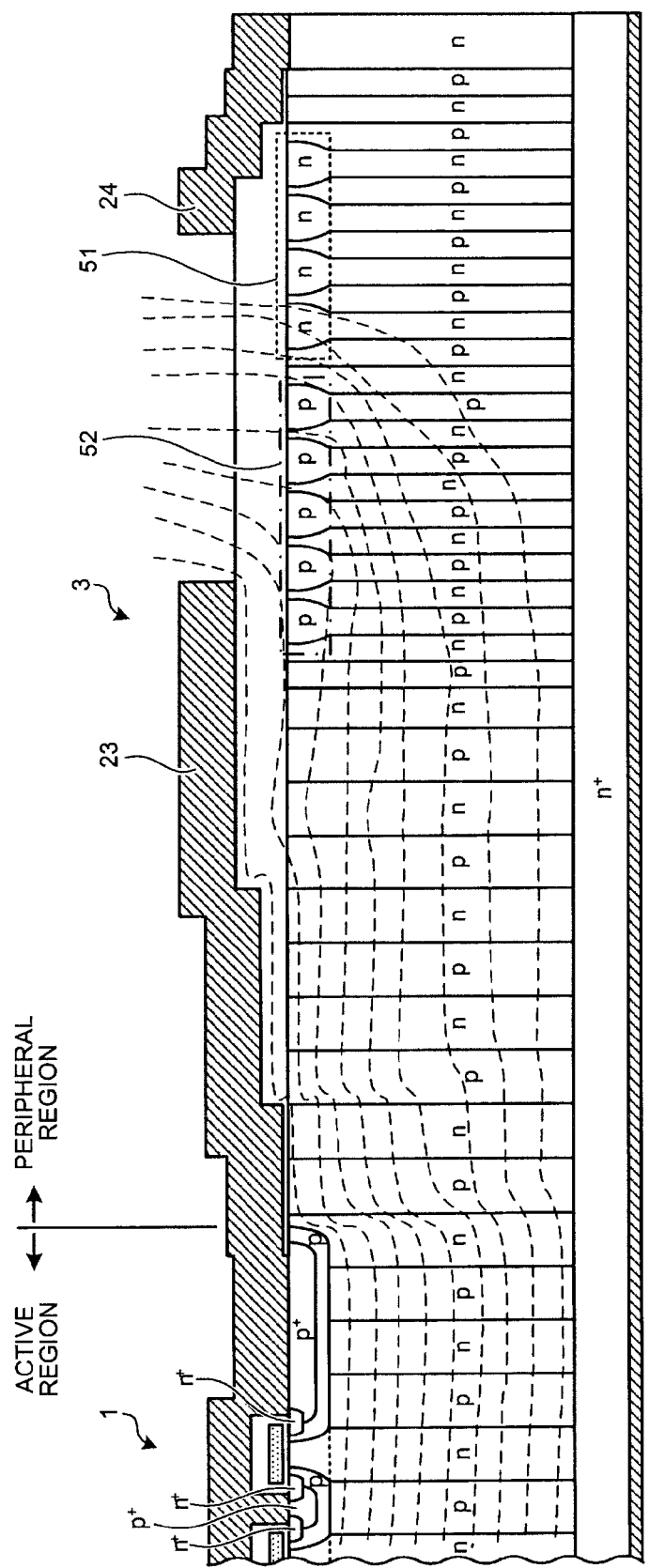
FIG. 40 is a schematic diagram of electric potential distribution in the off-state for the semiconductor apparatus of the ninth embodiment.
Figure 41:
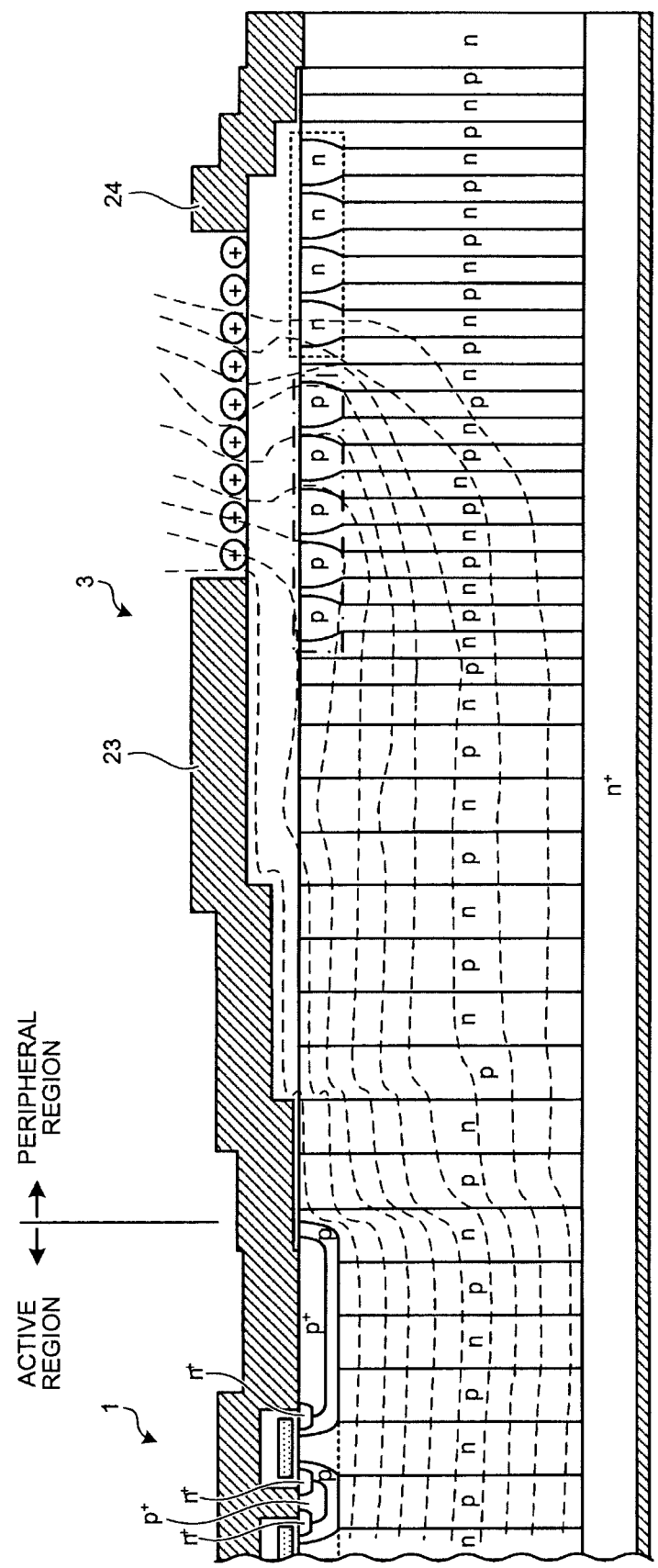
FIG. 41 is a schematic diagram of electric potential distribution in the off-state for the semiconductor apparatus of the ninth embodiment.
Figure 42:
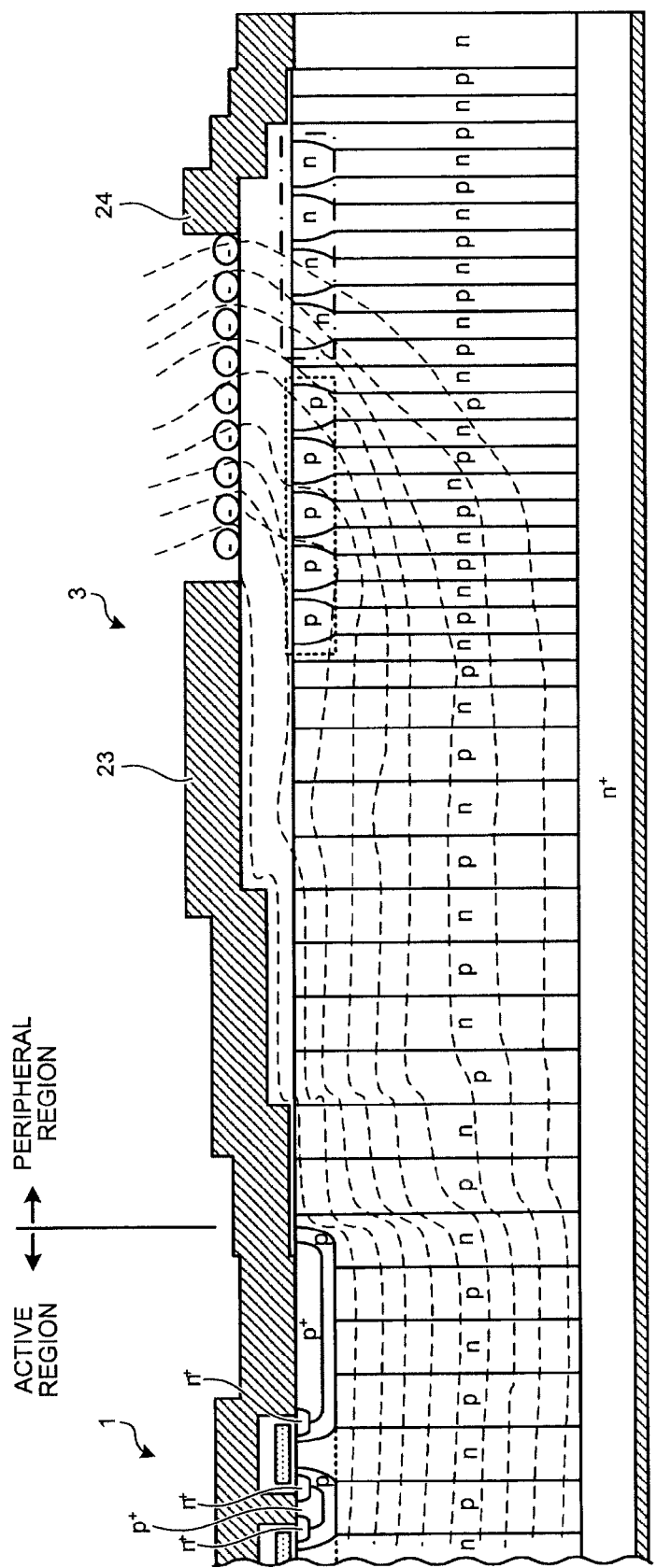
FIG. 42 is a schematic diagram of electric potential distribution in the off-state for the semiconductor apparatus of the ninth embodiment.

FIGS. 40 to 42 are schematic diagrams of electric potential distribution in the off-state for the semiconductor apparatus of the ninth embodiment. FIG. 40 depicts an electric potential distribution in the case that a surface charge quantity on the oxide film of the peripheral region is zero. FIG. 41 depicts an electric potential distribution in the case that the surface charge quantity is positive. FIG. 42 depicts an electric potential distribution in the case that the surface charge quantity is negative.

In these figures, broken lines represent electric potential lines. These figures reveal that breakdown voltage is maintained mainly in the P-rich region 52 between the field plate electrode and the channel stopper electrode when surface charges are positive charges (positive ions), and that breakdown voltage is maintained mainly in the N-rich region 51 between the field plate electrode and the channel stopper electrode when surface charges are negative charges (negative ions).

According to the ninth embodiment, because of the presence of the P-rich region 52, a surface electric field is eased to improve breakdown voltage when positive charges (positive ions) are present on the oxide film of the peripheral region. Because of the presence of the N-rich region 51, breakdown voltage is improved when negative charges (negative ions) are present on the oxide film of the peripheral region. Hence the robustness against charges on breakdown voltage against charges is improved.

Tenth Embodiment

In the ninth embodiment, the width of the second n-region 16 in the N-rich region 51 and the width of the second p-region 17 in the P-rich region 52 may change at each stripe, or may change gradually or step by step in the direction of extension of the second n-region 16 and the second p-region 17 (y direction in FIG. 38). In a tenth embodiment, the width of the second n-region 16 in the N-rich region 51 and the width of the second p-region 17 in the P-rich region 52 of the ninth embodiment are changed at each stripe or changed gradually or step by step in the direction of extension of the second n-region 16 and the second p-region 17 (y direction in FIG. 38). In this case, it is preferable that the width of the second n-region 16 becomes smaller as the second n-region 16 goes away from the channel stopper electrode 24 in the N-rich region 51 to bring the N-rich region 51 closer to a state of charge balance, and that the width of the second p-region 17 becomes smaller as the second p-region 17 goes away from the field plate electrode 23 in the P-rich region 52 to bring the P-rich region 52 closer to a state of charge balance. This allows a depletion layer to expand more easily, which enables maintenance of high breakdown voltage.

In the tenth embodiment (working example 10), breakdown voltage hardly fluctuates even if positive charges (positive ions) or negative charges (negative ions) are present on the oxide film in the peripheral region. In the tenth embodiment (working example 10), initial breakdown voltage is higher. Hence the tenth embodiment offers the same effect as the ninth embodiment.

Eleventh Embodiment

In the ninth embodiment, the N-rich region 51 and the P-rich region 52 may be formed to be closer to each other to reduce the charge balance region 54 between the N-rich region 51 and the P-rich region 52 to a region as small as possible. Between the N-rich region 51 and the P-rich region 52, however, the charge balance region 54 is formed to have a width at least equivalent to half the pitch of the second parallel pn-layer 15. The charge balance region 54 between the N-rich region 51 and the P-rich region 52 may have a width larger than such a width. The larger the width of the charge balance region 54 is, the easier the expansion of a depletion layer is, which improves breakdown voltage. If the width of the charge balance region 54 is one-third or less of the distance between the field plate electrode 23 and the channel stopper electrode 24, the length of the peripheral region 3 is not excessively long, which is preferable. FIG. 43 is a plane figure of a semiconductor apparatus in which the width of the charge balance region 54 between the N-rich region 51 and the P-rich region 52 is made greater. The eleventh embodiment offers the same effect as the ninth embodiment.

Twelfth Embodiment

FIG. 44 is a plane figure of a semiconductor apparatus of a twelfth embodiment. As depicted in FIG. 44, the twelfth embodiment is different from the ninth embodiment in that the charge balance region is not formed at the outside of the N-rich region 51. In the example of FIG. 44, the region serving as the charge balance region 55 in the ninth embodiment is formed into the N-rich region 51. The twelfth embodiment offers the same effect as the ninth embodiment.

Thirteenth Embodiment

FIG. 45 is a plane figure of a semiconductor apparatus of a thirteenth embodiment. As depicted in FIG. 45, the thirteenth embodiment is different from the ninth embodiment in that the boundary between the first parallel pn-layer 12 and the second parallel pn-layer 15 coincides with the boundary between the active region 1 and the peripheral region 3. In this case, the pitch of the parallel pn-layer is caused to change gradually near the boundary between the first parallel pn-layer 12 and the second parallel pn-layer 15. If the pitch of the parallel pn-layer changes suddenly near the boundary between the first parallel pn-layer 12 and the second parallel pn-layer 15, for example, irregular opening widths of a mask used for impurity ion injection in a manufacturing process, irregular ion injection quantities, etc., affect breakdown voltage, causing it to fluctuate easily or to drop to a level below charge balance. Causing the pitch of the parallel pn-layer to change gradually near the boundary between the first parallel pn-layer 12 and the second parallel pn-layer 15 prevents the fluctuation or drop of breakdown voltage. The thirteenth embodiment offers the same effect as the ninth embodiment.

Fourteenth Embodiment

Figure 46:
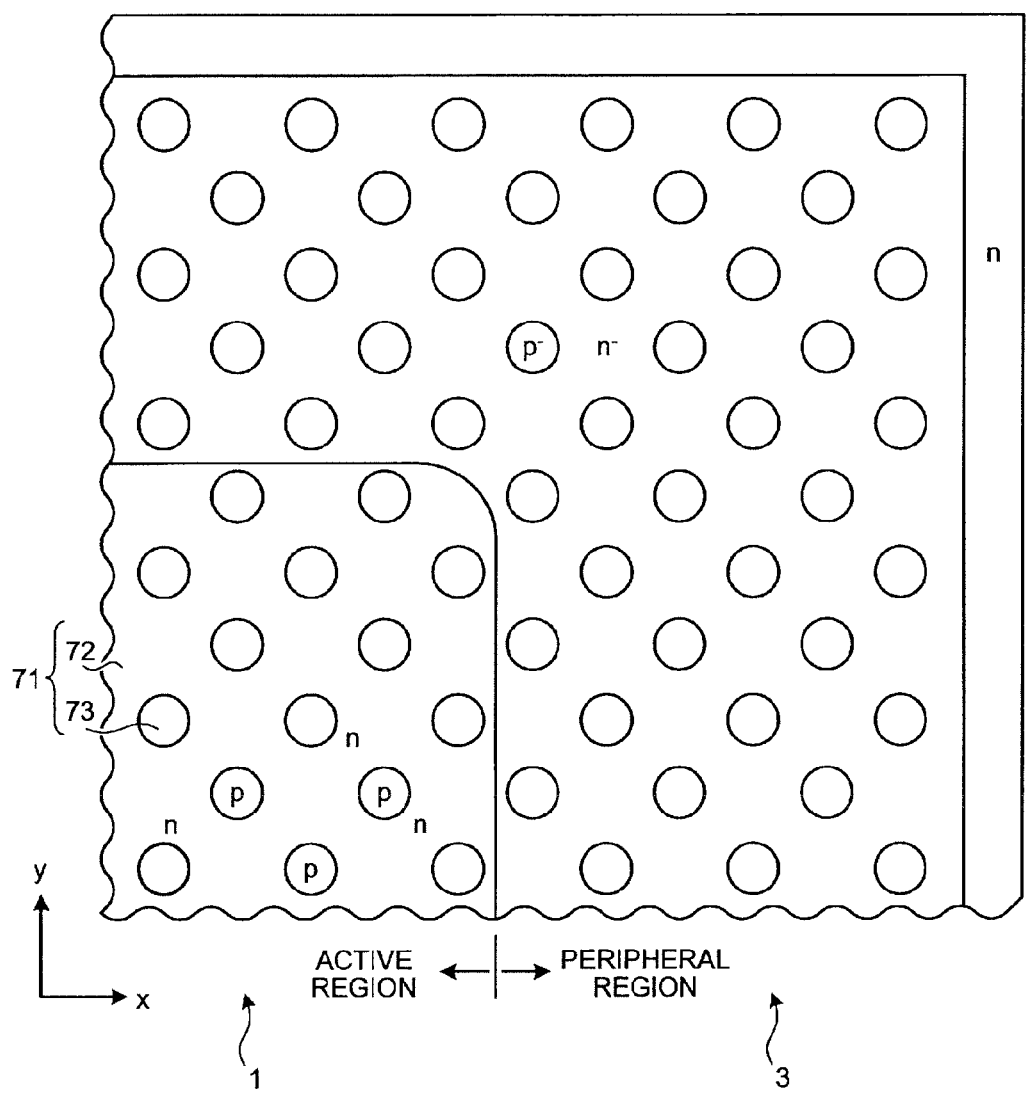
FIG. 46 is a plane figure of a semiconductor apparatus of a fourteenth embodiment.
Figure 47:
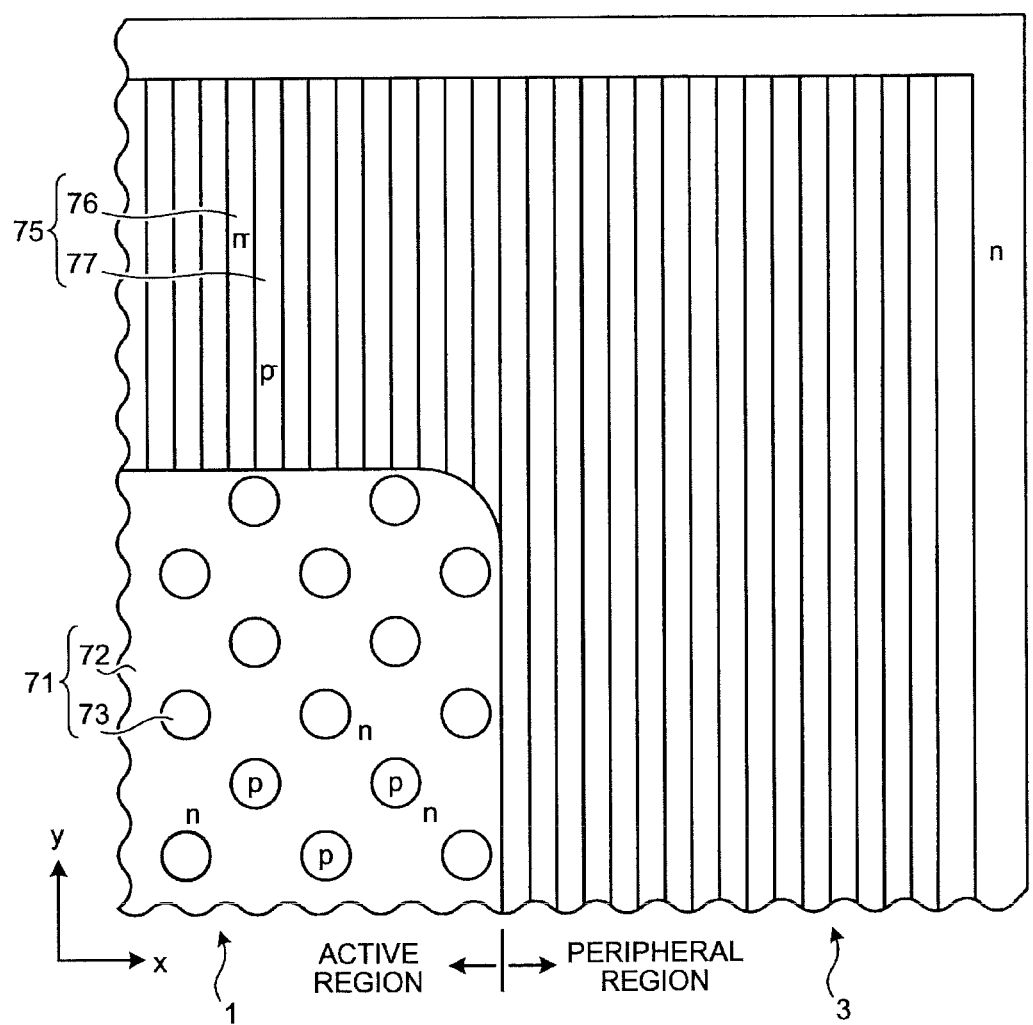
FIG. 47 is a plane figure of the semiconductor apparatus of the fourteenth embodiment.

FIGS. 46 and 47 are plane figures of a semiconductor apparatus of a fourteenth embodiment. As depicted in FIG. 46, in the first to thirteenth embodiments, a parallel pn-layer 71 having an n-region 72 in which p-regions 73 of a circular planar shape are arranged may be provided. The parallel pn-layer 71 configured in such a manner may be disposed in the active region 1 and the peripheral region 3 (pattern depicted in FIG. 46), or disposed in the active region 1 only (pattern depicted in FIG. 47), or disposed in the peripheral region 3 only (not depicted). According to the pattern of FIG. 47, a second parallel pn-layer 75 is disposed in the peripheral region 3, the second parallel pn-layer 75 being formed by repeatedly joining stripes of second n-regions (second regions of the first conductivity) 76 and second p-regions (second regions of the second conductivity) 77 that are alternately arranged at a fine pitch. The pitch of repetition of the second n-regions 76 and the second p-regions 77 may be the same as the repetition pitch of the parallel pn-layer 71 in the active region 1. The parallel pn-layer 71 may have the p-region 73 in which the n-regions 72 of a circular planar shape are arranged. The fourteenth embodiment offers the same effect as the first to thirteenth embodiments.

Fifteenth Embodiment

Figure 48:
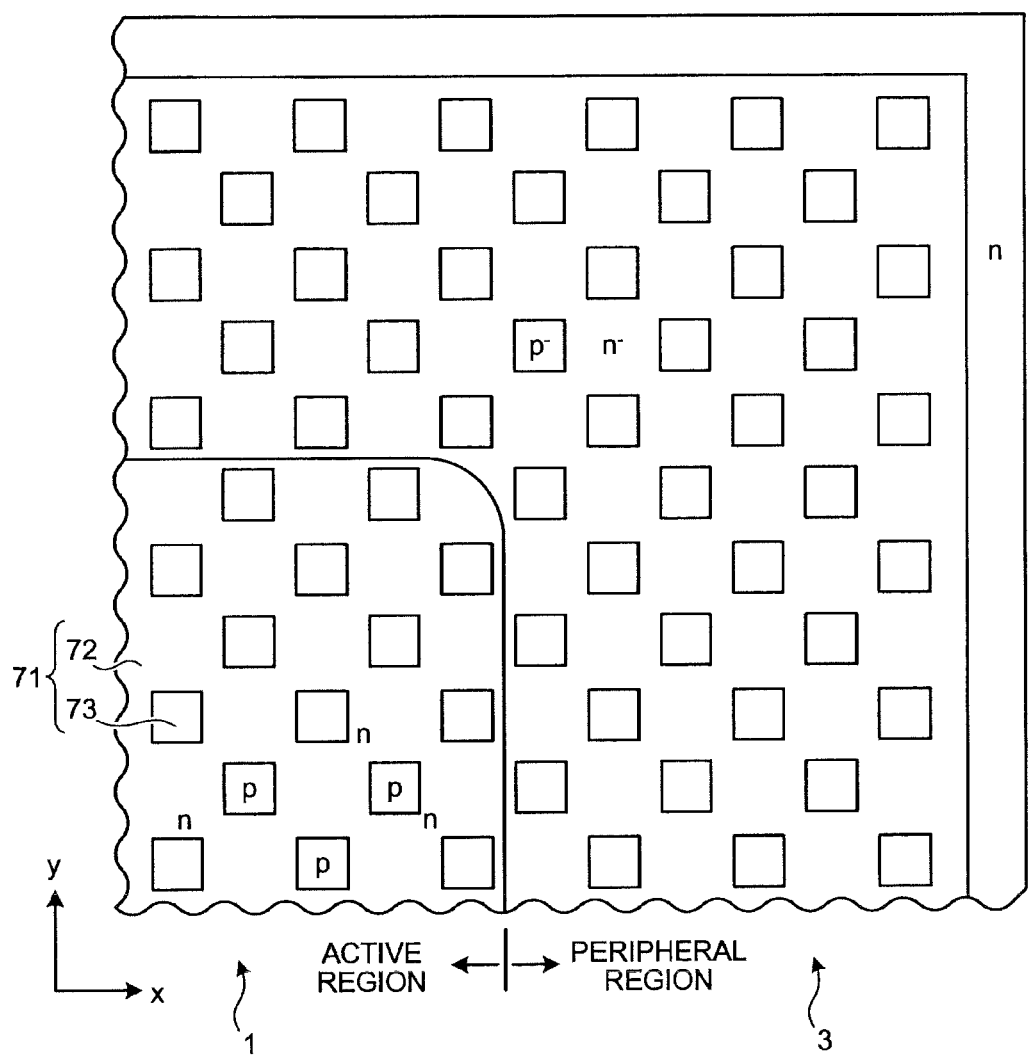
FIG. 48 is a plane figure of a semiconductor apparatus of a fifteenth embodiment.
Figure 49:
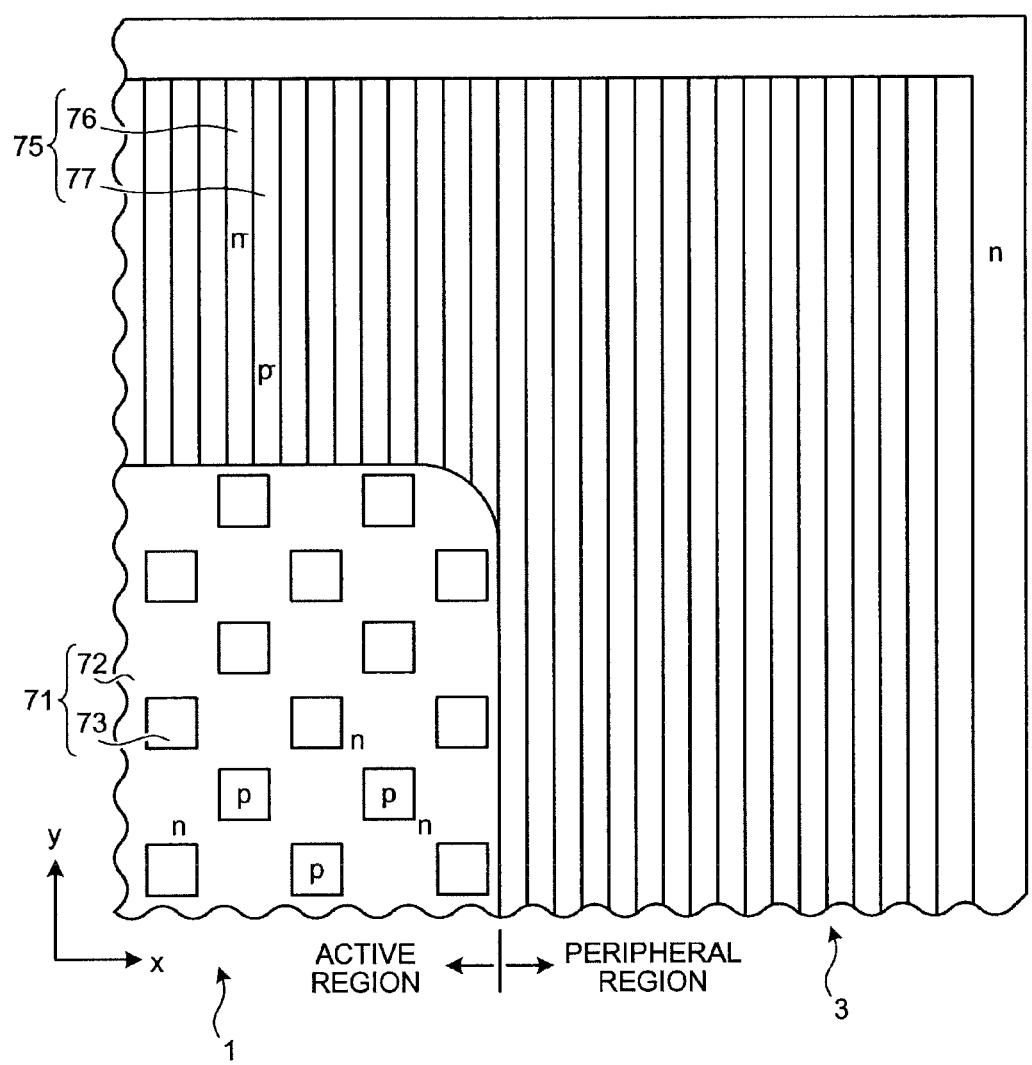
FIG. 49 is a plane figure of the semiconductor apparatus of the fifteenth embodiment.

FIGS. 48 and 49 are plane figures of a semiconductor apparatus of a fifteenth embodiment. As depicted in FIG. 48, in the first to thirteenth embodiments, the parallel pn-layer 71 having the n-region 72 in which the p-regions 73 of a square planar shape are arranged may be provided. The parallel pn-layer 71 configured in such a manner may be disposed in the active region 1 and the peripheral region 3 (pattern depicted in FIG. 48), or disposed in the active region 1 only (pattern depicted in FIG. 49), or disposed in the peripheral region 3 only (not depicted). The parallel pn-layer 71 may have the p-region 73 in which the n-regions 72 of a square planar shape are arranged. The fifteenth embodiment offers the same effect as the first to thirteenth embodiments.

Sixteenth Embodiment

Figure 50:
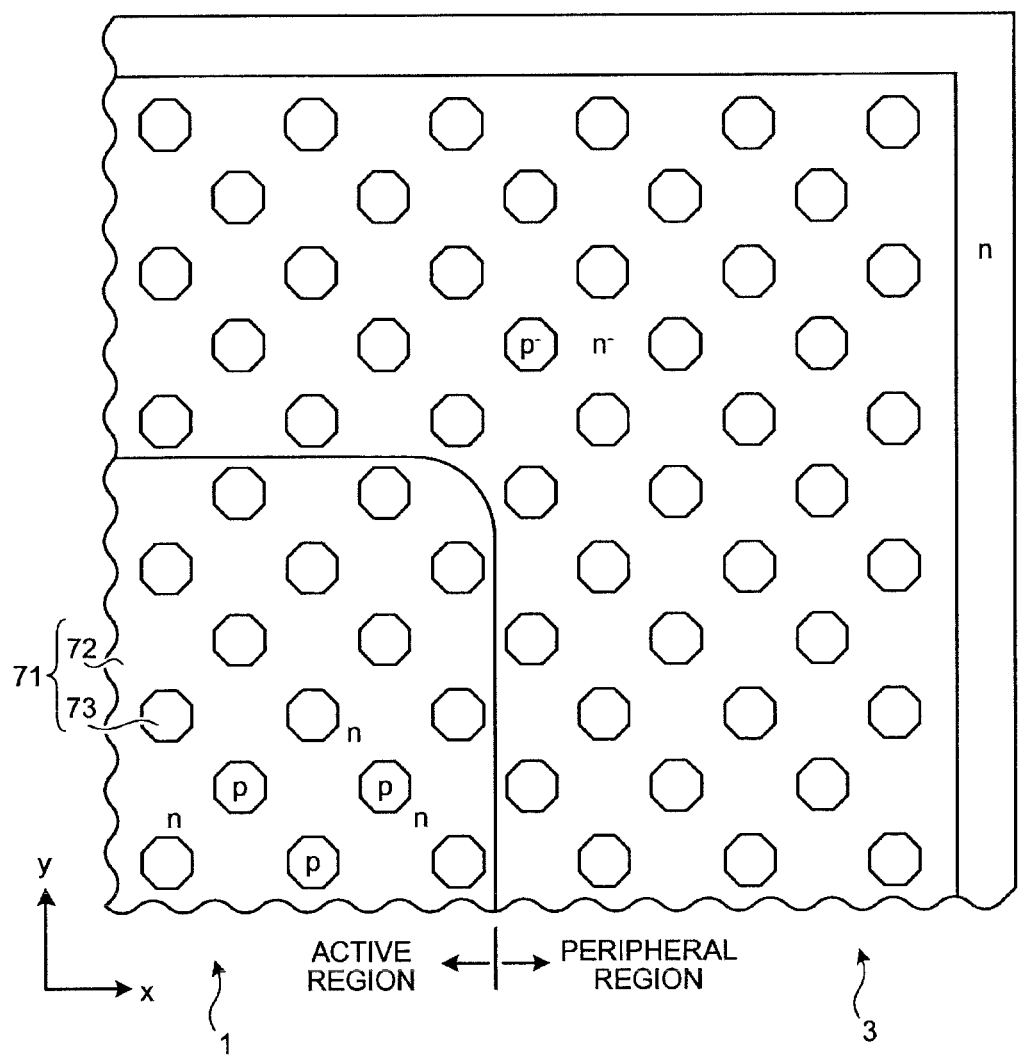
FIG. 50 is a plane figure of a semiconductor apparatus of a sixteenth embodiment.
Figure 51:
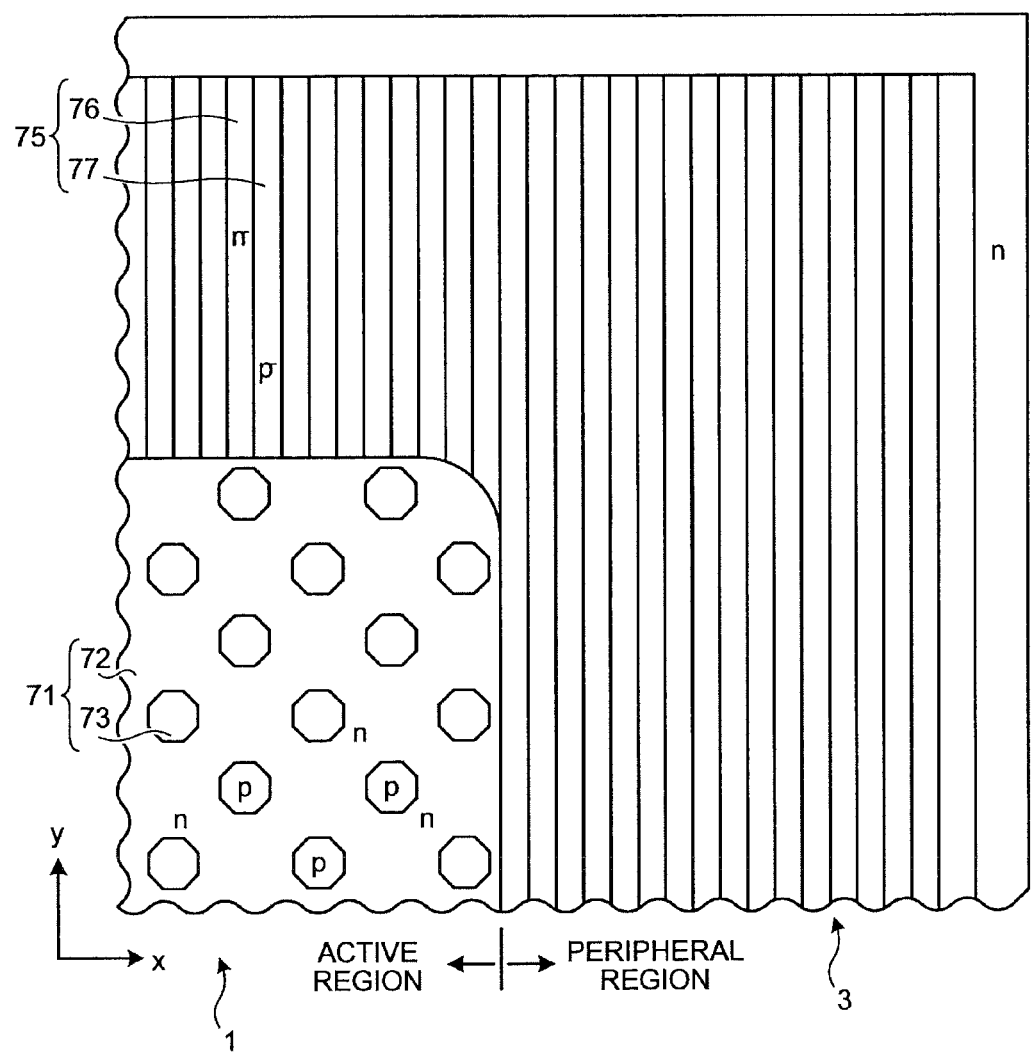

FIGS. 50 and 51 are plane figures of a semiconductor apparatus of a sixteenth embodiment. As depicted in FIG. 50, in the first to thirteenth embodiments, the parallel pn-layer 71 having the n-region 72 in which the p-regions 73 of a polygonal (e.g., octagonal) planar shape are arranged may be provided. The parallel pn-layer 71 configured in such a manner may be disposed in the active region 1 and the peripheral region 3 (pattern depicted in FIG. 50), or disposed in the active region 1 only (pattern depicted in FIG. 51), or disposed in the peripheral region 3 only (not depicted). The parallel pn-layer 71 may have the p-region 73 in which the n-regions 72 of a polygonal (e.g., octagonal) planar shape are arranged. The sixteenth embodiment offers the same effect as the first to thirteenth embodiments.

Seventeen Embodiment

Figure 52:
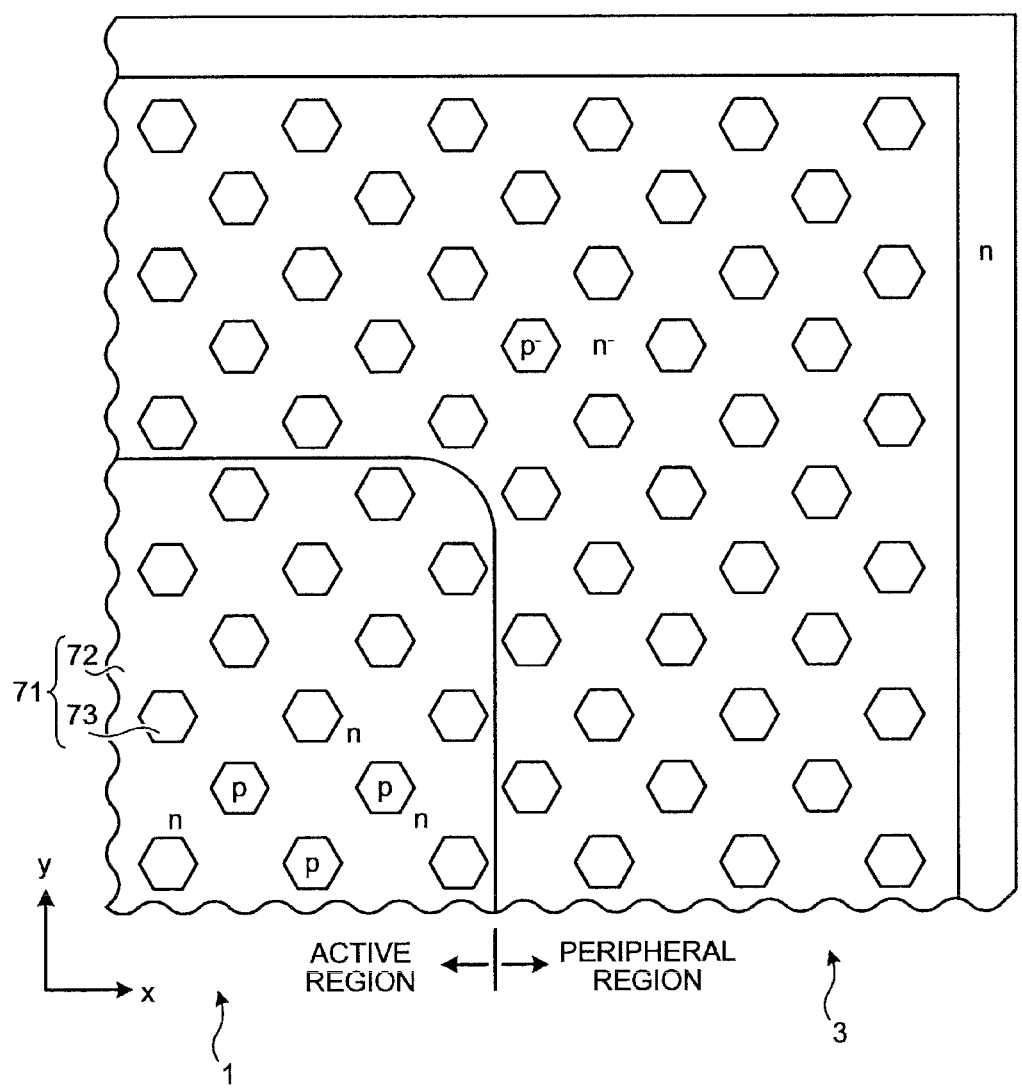
Figure 53:
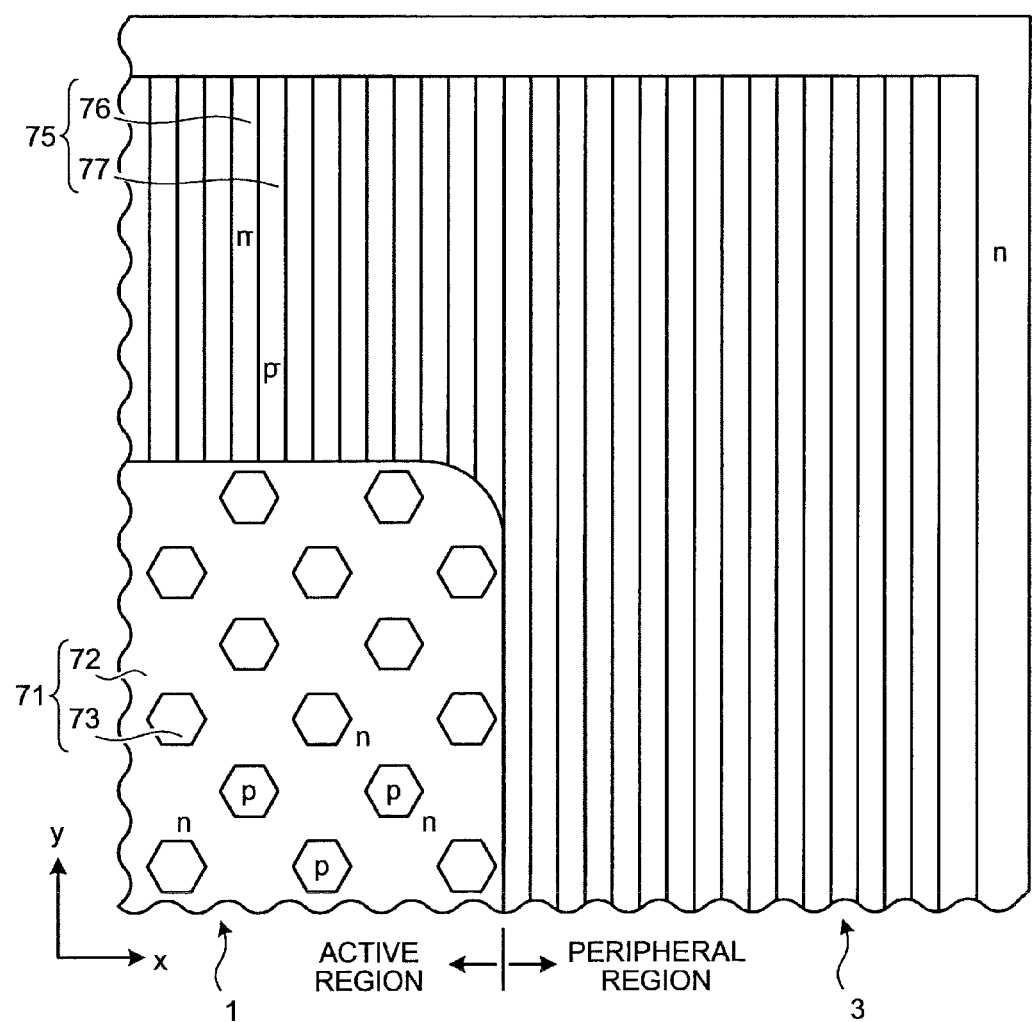
FIG. 53 is a plane figure of the semiconductor apparatus of the seventeenth embodiment.
Figure 54:
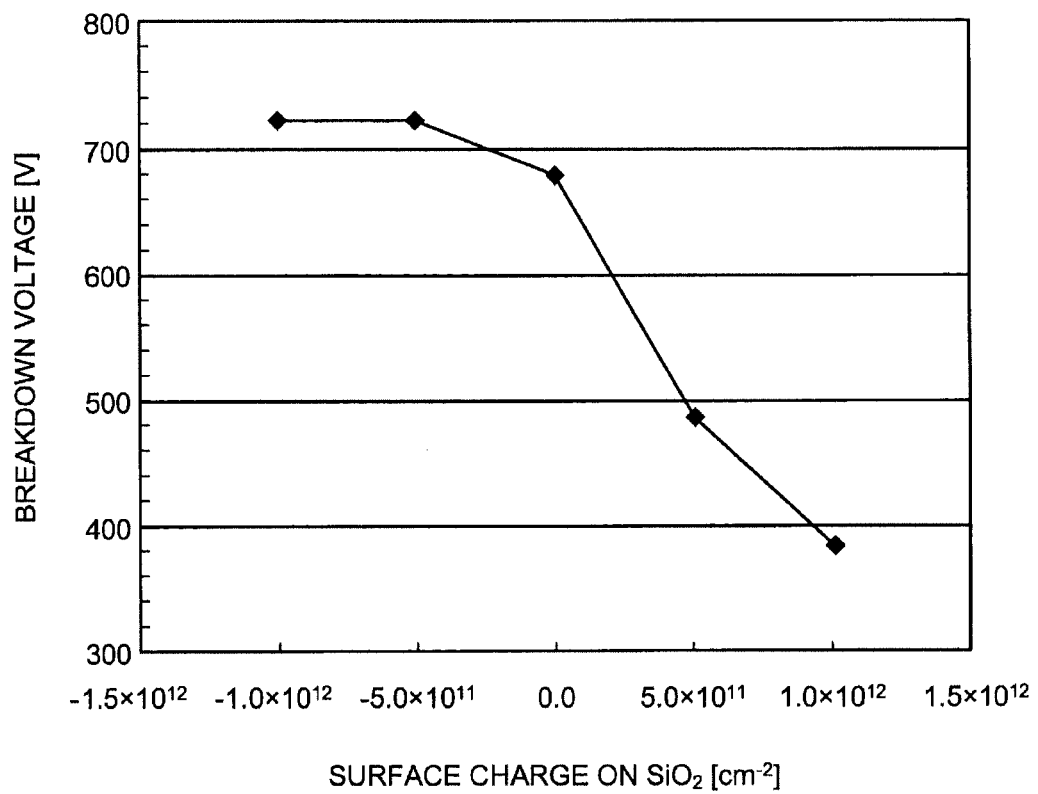
FIG. 54 is a diagram of simulation results of surface charge dependency on breakdown voltage in a conventional semiconductor apparatus.
Figure 55:
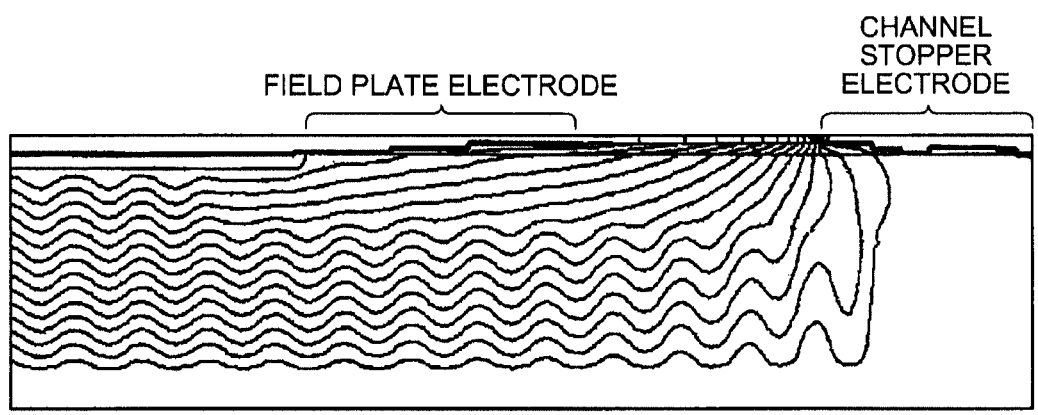
FIG. 55 is a diagram of electric potential distribution in the off-state for the conventional semiconductor apparatus.
Figure 56:
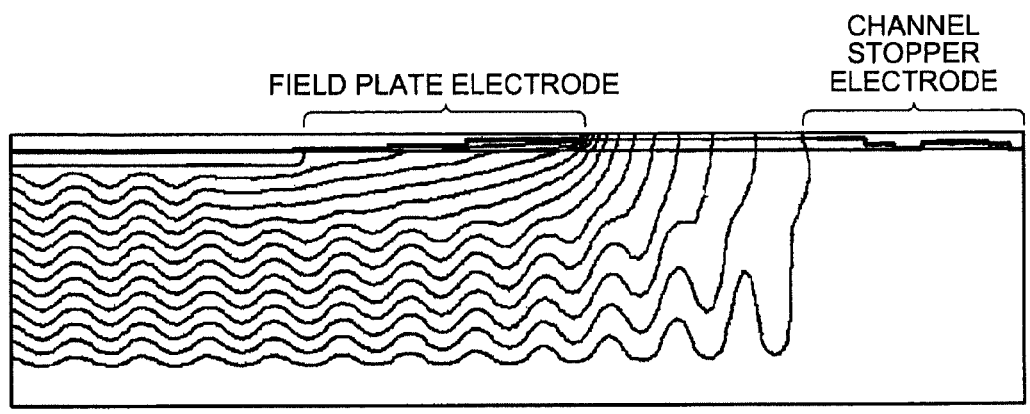
FIG. 56 is a diagram of electric potential distribution in the off-state for the conventional semiconductor apparatus.
Figure 57:
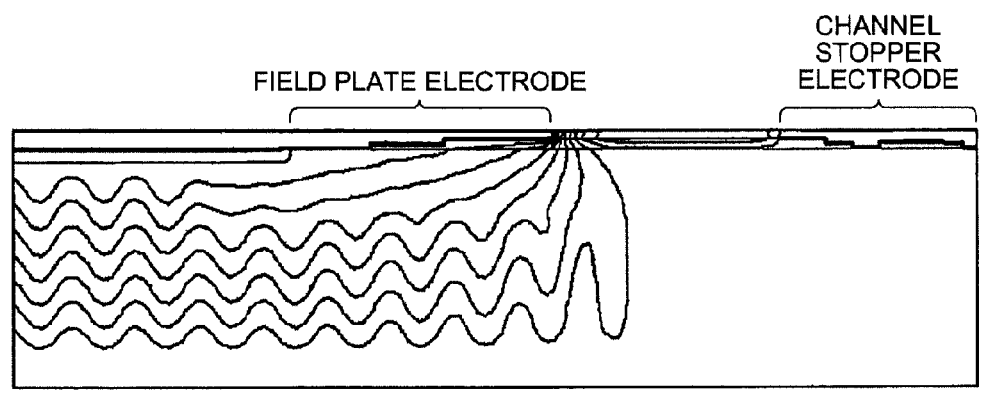
FIG. 57 is a diagram of electric potential distribution in the off-state for the conventional semiconductor apparatus.

FIGS. 52 and 53 are plane figures of a semiconductor apparatus of a seventeenth embodiment. As depicted in FIG. 52, in the first to thirteenth embodiments, the parallel pn-layer 71 having the n-region 72 in which the p-regions 73 of a polygonal (e.g., hexagonal) planar shape are arranged may be provided. The parallel pn-layer 71 configured in such a manner may be disposed in the active region 1 and the peripheral region 3 (pattern depicted in FIG. 52), or disposed in the active region 1 only (pattern depicted in FIG. 53), or disposed in the peripheral region 3 only (not depicted). The parallel pn-layer 71 may have the p-region 73 in which the n-regions 72 of a polygonal (e.g., octagonal) planar shape are arranged. The seventeenth embodiment offers the same effect as the first to thirteenth embodiments.

In the fourteenth to seventeenth embodiments, the p-regions 73 are arranged at equal intervals in the active region 1 and in the peripheral region 3. The interval of arrangement in the active region 1 and the same in the peripheral region 3 may be identical to or different from each other.

The present invention is not limited to the embodiments described above but various modifications of the invention are possible. For example, dimensions and concentrations described in the embodiments are presented as examples, and the values of those dimensions and concentrations do not limit the present invention. While the first-conductive type is defined as the n-type and the second-conductive type is defined as the p-type in the embodiments, the present invention offers the same effect as described in the embodiments even if the first-conductive type is defined as the p-type and the second-conductive type is defined as the n-type. The present invention applies not only to a MOSFET but also to an IGBT, bipolar transistor, FWD (Free Wheel Diode), Schottky diode, etc.

INDUSTRIAL APPLICABILITY

As described above for embodiments of the present invention, the semiconductor apparatus is useful as a semiconductor apparatus for large power consumption, and is particularly applicable as a semiconductor apparatus that achieves both high breakdown voltage and high current capacity in applications to a MOSFET, IGBT, bipolar transistor, FWD, Schottky diode, etc. having a parallel pn-structure in a drift layer.

REFERENCE NUMERALS LIST

The following is a listing of reference numerals as used in the specification and drawings to identify various elements for the semiconductor apparatus:
1 active region
2 low-resistance layer
3 peripheral region
12 first parallel pn-layer
13 first region of a first conductivity
14 first region of a second conductivity
15 second parallel pn-layer
16 second region of the first conductivity
17 second region of the second conductivity
18 third region of the first conductivity
19, 20, 21 third region of the second conductivity
22 insulating film
23, 27, 28 first conductive layer
24 second conductive layer
31 parallel pn-layer
32 fourth region of the first conductivity
33 fourth region of the second conductivity
41, 42, 43 fifth region of the second conductivity Although a few embodiments have been shown and described, it would be appreciated by those skilled in the art that changes may be made in these embodiments without departing from the principles and spirit of the invention, the scope of which is defined in the claims and their equivalents.

What is claimed is:
1. A semiconductor apparatus comprising:
an active region formed on a first main surface side;
a peripheral region encircling the active region and having a termination;
a low-resistance layer formed on a second main surface side;
a parallel pn-layer formed between the first main surface and the low-resistance layer and composed of planar first-conductive regions of a first conductivity alternately arranged with planar second-conductive regions of a second conductivity, the parallel pn-layer surrounding the active region and comprising
  a first sub-region, serving substantially as a region of the first conductivity, being a region of the parallel pn-layer in the peripheral region that extends from the first main surface to a partial depth of the parallel pn-layer, being a region in which the first-conductive regions are wider than adjacent second-conductive regions in a plan-view cross-section, and being a region encircling the active region, and
  a second sub-region, serving substantially as a region of the second conductivity, being a region of the parallel pn-layer in the peripheral region that extends from the first main surface to a partial depth of the parallel pn-layer, being closer to the active region than is the first sub-region, being a region in which the second-conductive regions are wider than adjacent first-conductive regions in the plan-view cross-section, and being a region encircling the active region and being encircled by the first sub-region;
an insulating layer covering the parallel pn-layer in the peripheral region;
a first conductive layer covering part of the parallel pn-layer that is closer to the active region in the peripheral region via the insulating layer; and a second conductive layer connected electrically to the termination of the peripheral region and covering part of the parallel pn-layer that is closer to the termination in the peripheral region via the insulating layer, the second sub-region extending from a position that is closer to the termination than the first conductive layer is, to a position under the first conductive layer, and the first sub-region extending from a position that is closer to the active region than the second conductive layer is, to a position under the second conductive layer.

2. The semiconductor apparatus of claim 1, wherein in the second sub-region, a ratio of the second-conductive regions to the first-conductive regions is constant.

3. The semiconductor apparatus of claim 1, wherein in the first sub-region, a ratio of the second-conductive regions to the first-conductive regions is constant.

4. The semiconductor apparatus of claim 1, wherein in the second sub-region, the ratio of the second-conductive regions to the first-conductive regions decreases approaching 1 as the second sub-region comes closer to the termination in peripheral region.

5. The semiconductor apparatus of claim 1, wherein in the first sub-region, the ratio of the second-conductive regions to the first-conductive regions increases approaching 1 as the first sub-region comes closer to the active region.

6. The semiconductor apparatus of claim 1, wherein a region serving substantially as a charge balance region is present between the second sub-region and first sub-region.

7. The semiconductor apparatus of claim 6, wherein a width of the region serving substantially as the charge balance region is one-third or less the distance between the first conductive layer and the second conductive layer.

8. The semiconductor apparatus of claim 1, wherein the first conductive layer or the second conductive layer is formed into a stepped shape having one level difference.

9. The semiconductor apparatus of claim 1, wherein the first conductive layer or the second conductive layer is formed into a stepped shape having two level differences.

10. The semiconductor apparatus of claim 1, wherein the first conductive layer or the second conductive layer is formed into a stepped shape having three or more level differences.

11. The semiconductor apparatus according to claim 1, wherein
the first-conductive regions and the second-conductive regions respectively have a stripe planar shape or, either the first-conductive regions or the second-conductive regions have a square or polygonal planar shape.

12. The semiconductor apparatus according to claim 1, wherein, in the plan-view cross-section,
a first series of longitudinal sections, of the second-conductive regions, that are within the second sub-region have increased widths, which are greater than widths of adjacent members of the first-conductive regions and greater than that of longitudinal sections of the second-conductive regions outside the second sub-region,
the first series of longitudinal sections having increased widths are in a circular formation that encircles the active region,
a second series of longitudinal sections, of the first-conductive regions, that are within the first sub-region have increased widths, which are greater than widths of adjacent members of the second-conductive regions and greater than that of longitudinal sections of the first-conductive regions outside the first sub-region, and
the second series of longitudinal sections having increased widths are in a circular formation that encircles both the active region and the first sub-region.

* * * * *

UNITED STATES PATENT AND TRADEMARK OFFICE
CERTIFICATE OF CORRECTION

PATENT NO. : 9,577,087 B2
APPLICATION NO. : 13/313583
DATED : February 21, 2017
INVENTOR(S) : Yasuhiko Onishi et al.

It is certified that error appears in the above-identified patent and that said Letters Patent is hereby corrected as shown below:

On the Title Page

Item [Assignee] (73), Column 1, Line 1:
Delete "FUI ELECTRIC CO. LTD.," and insert -- FUJI ELECTRIC CO., LTD., --.

Signed and Sealed this
Ninth Day of May, 2017

Michelle K. Lee
*Director of the United States Patent and Trademark Office*